US012674838B2

(12) United States Patent
Choo et al.

(10) Patent No.: US 12,674,838 B2
(45) Date of Patent: Jul. 7, 2026

(54) METHOD OF DETECTING OPENING OF SEMICONDUCTOR DEVICE INCLUDING DETECTION STRUCTURE AND SEMICONDUCTOR DEVICE

(71) Applicant: SAMSUNG ELECTRONICS CO., LTD., Suwon-si (KR)

(72) Inventors: Gyosoo Choo, Suwon-si (KR); Kiwhan Song, Suwon-si (KR); Sunghun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 219 days.

(21) Appl. No.: 18/415,195

(22) Filed: Jan. 17, 2024

(65) Prior Publication Data

US 2025/0035701 A1     Jan. 30, 2025

(30) Foreign Application Priority Data

Jul. 27, 2023     (KR) ........................ 10-2023-0098160

(51) Int. Cl.
*G01R 31/28*          (2006.01)
(52) U.S. Cl.
CPC ................................ *G01R 31/2884* (2013.01)
(58) Field of Classification Search
CPC .... G01R 31/2884; G01R 31/56; G01R 1/067; G01R 27/2605; G01R 31/31725; G01R 31/31727; H01L 22/14; H01L 22/20; H01L 22/34; H01L 22/32
USPC ........................................ 324/519, 512, 500
See application file for complete search history.

(56) References Cited

U.S. PATENT DOCUMENTS

| | | | |
|---|---|---|---|
| 6,924,651 B2 | 8/2005 | Osaka et al. | |
| 8,947,100 B2 | 2/2015 | Chiu et al. | |
| 11,120,826 B1 | 9/2021 | Johnson et al. | |
| 11,217,130 B2 | 1/2022 | Moon et al. | |
| 2008/0065934 A1* | 3/2008 | Whetsel | G01R 31/31722 |
| | | | 714/701 |
| 2018/0026737 A1* | 1/2018 | Kucheravy | H04L 1/248 |
| | | | 375/227 |
| 2020/0166572 A1* | 5/2020 | Whetsel | G01R 31/318508 |
| 2023/0008917 A1 | 1/2023 | Hong et al. | |
| 2023/0280372 A1* | 9/2023 | Blin | H01L 22/32 |
| | | | 257/48 |
| 2024/0153830 A1* | 5/2024 | Choo | G01R 31/2853 |
| 2024/0395640 A1* | 11/2024 | Chang | H01L 22/14 |

FOREIGN PATENT DOCUMENTS

| | | |
|---|---|---|
| CN | 115963353 A | 4/2023 |
| JP | 2000-221225 A | 8/2000 |
| JP | 2000-241483 A | 9/2000 |
| WO | 2023/282549 A1 | 1/2023 |

* cited by examiner

*Primary Examiner* — Giovanni Astacio-Oquendo
(74) *Attorney, Agent, or Firm* — Sughrue Mion, PLLC

(57)          ABSTRACT

A method of detecting an opening of a semiconductor device includes generating a clock signal based on a probe of a measuring circuit contacting, via a switch, an end of a detection structure, measuring a period of the clock signal, counting a number of periods of the clock signal during a reference time interval, and determining, based on the number of periods of the clock signal, a location of the opening of the semiconductor device. The detection structure being formed in a semiconductor die of the semiconductor device in an annular shape.

20 Claims, 33 Drawing Sheets

<u>1000a</u>

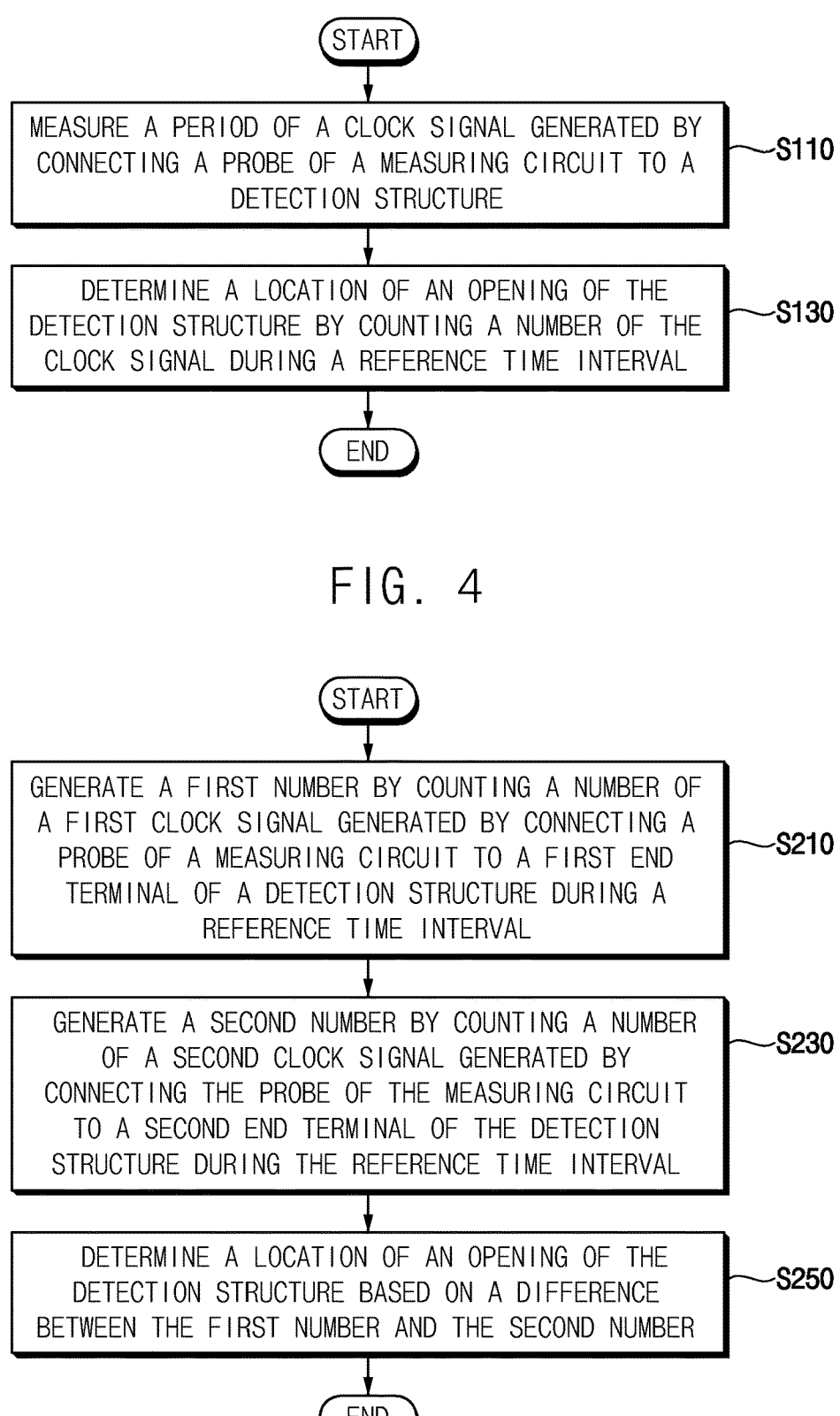

FIG. 3

START

MEASURE A PERIOD OF A CLOCK SIGNAL GENERATED BY CONNECTING A PROBE OF A MEASURING CIRCUIT TO A DETECTION STRUCTURE — S110

DETERMINE A LOCATION OF AN OPENING OF THE DETECTION STRUCTURE BY COUNTING A NUMBER OF THE CLOCK SIGNAL DURING A REFERENCE TIME INTERVAL — S130

END

FIG. 4

START

GENERATE A FIRST NUMBER BY COUNTING A NUMBER OF A FIRST CLOCK SIGNAL GENERATED BY CONNECTING A PROBE OF A MEASURING CIRCUIT TO A FIRST END TERMINAL OF A DETECTION STRUCTURE DURING A REFERENCE TIME INTERVAL — S210

GENERATE A SECOND NUMBER BY COUNTING A NUMBER OF A SECOND CLOCK SIGNAL GENERATED BY CONNECTING THE PROBE OF THE MEASURING CIRCUIT TO A SECOND END TERMINAL OF THE DETECTION STRUCTURE DURING THE REFERENCE TIME INTERVAL — S230

DETERMINE A LOCATION OF AN OPENING OF THE DETECTION STRUCTURE BASED ON A DIFFERENCE BETWEEN THE FIRST NUMBER AND THE SECOND NUMBER — S250

END

| LOCATION | Cmet | Cosc | Rosc | # of CLK |
|----------|------|------|------|----------|
| OP4 | C14 |     |     | CV4 |
| OP3 | C13 | C21 | Rv | CV3 |
| OP2 | C12 |     |     | CV2 |
| OP1 | C11 |     |     | CV1 |

| LOCATION | # of CLK1 | # of CLK2 | DIFFERENCE | Ta of CLK1 | Tb of CLK2 |
|----------|-----------|-----------|------------|------------|------------|
| OP4 | CV41 | CV42 | CV41-CV42 | T41 | T42 |
| OP3 | CV31 | CV32 | CV31-CV32 | T31 | T32 |
| OP2 | CV21 | CV22 | CV21-CV22 | T21 | T22 |
| OP1 | CV11 | CV12 | CV11-CV12 | T11 | T12 |

FIG. 11
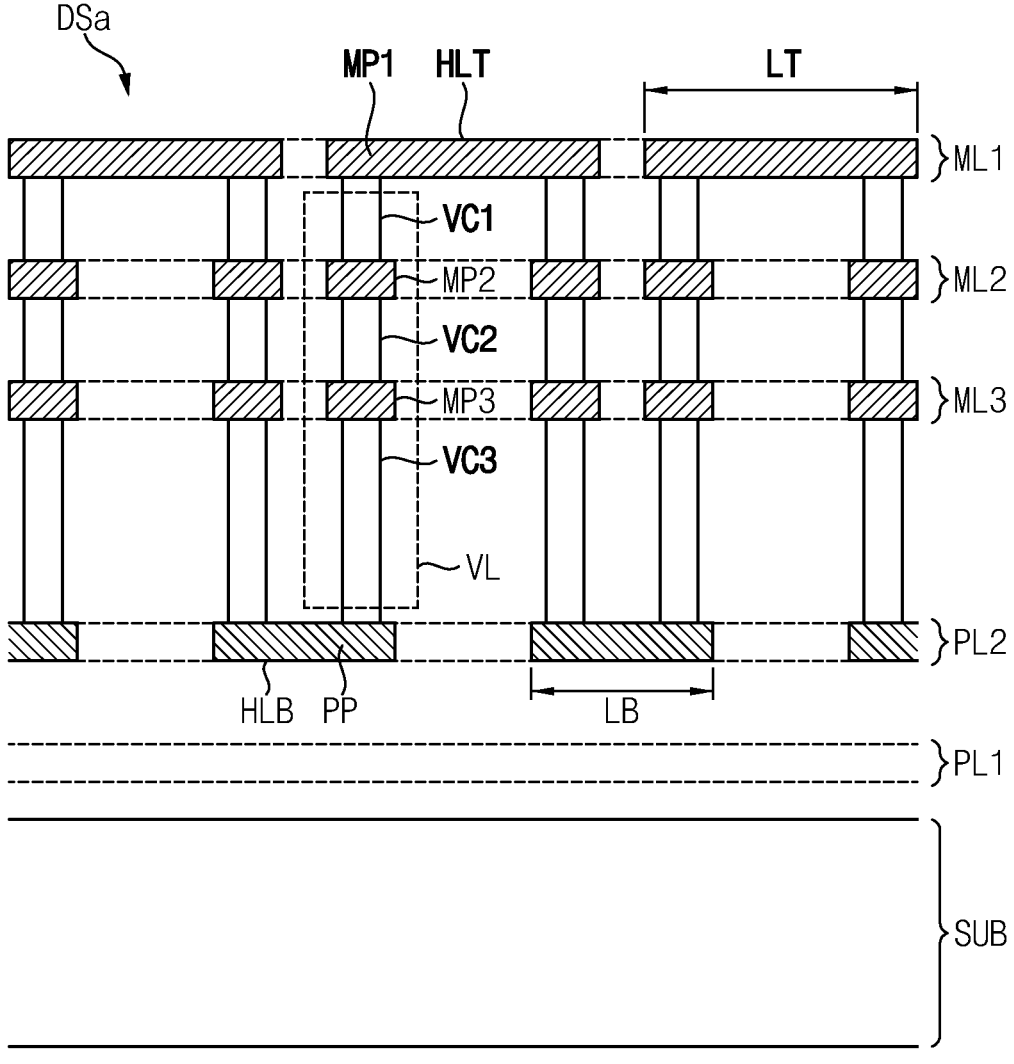
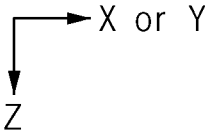

FIG. 12
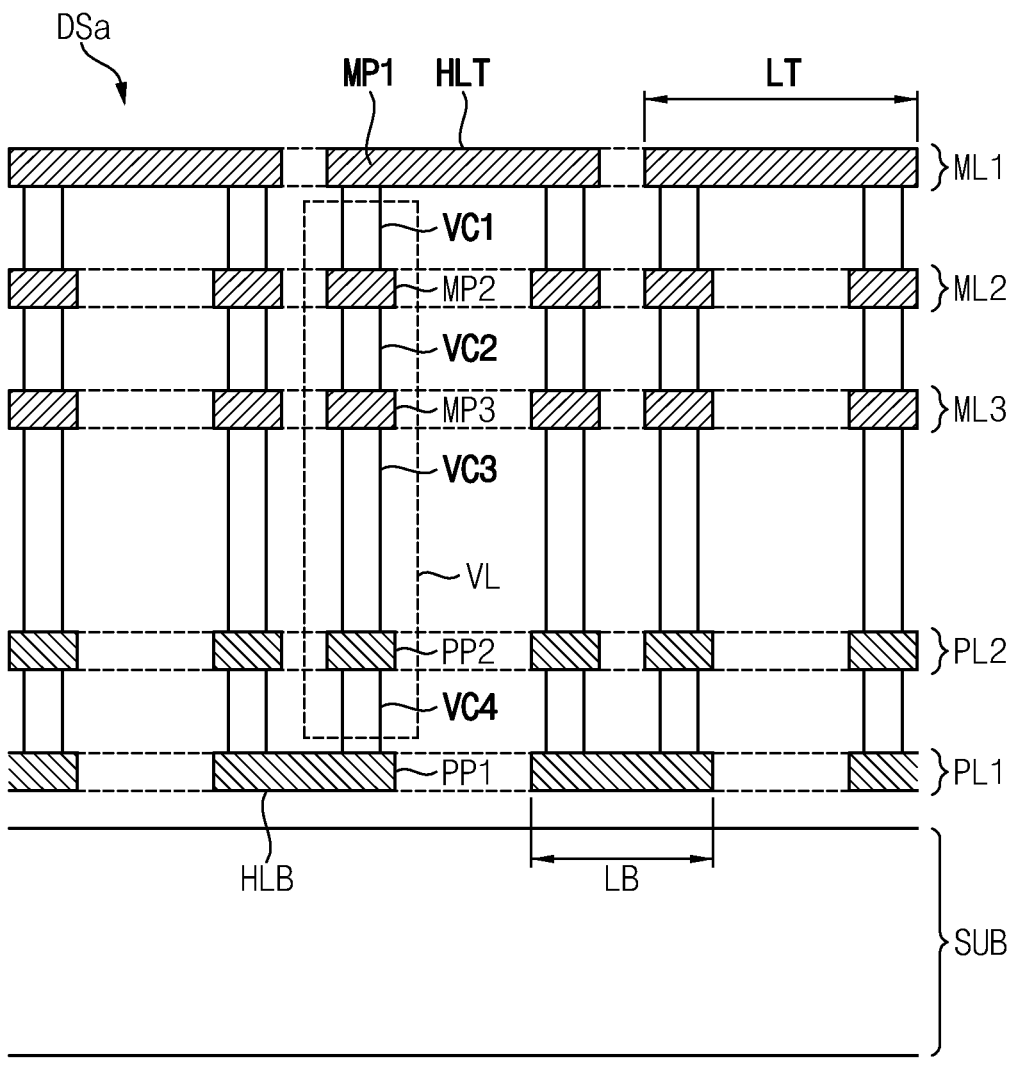
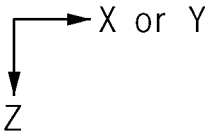

DSd

MP1    HLT

ML1

SD1

TSV

VL

MP1 } ML2

VC2

DLY2

PP2 } PL2

SD2

SUB2

X or Y

Z

FIG. 33
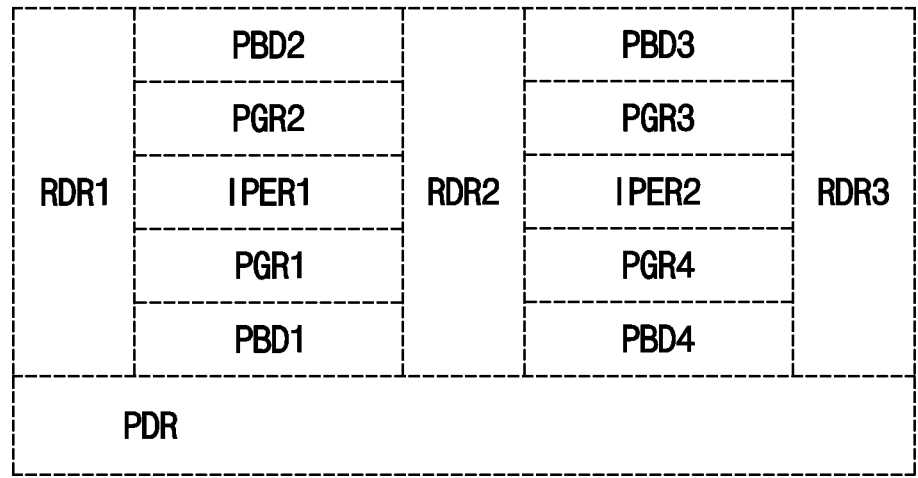
PERI
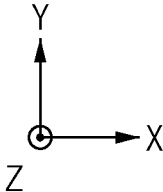

FIG. 34
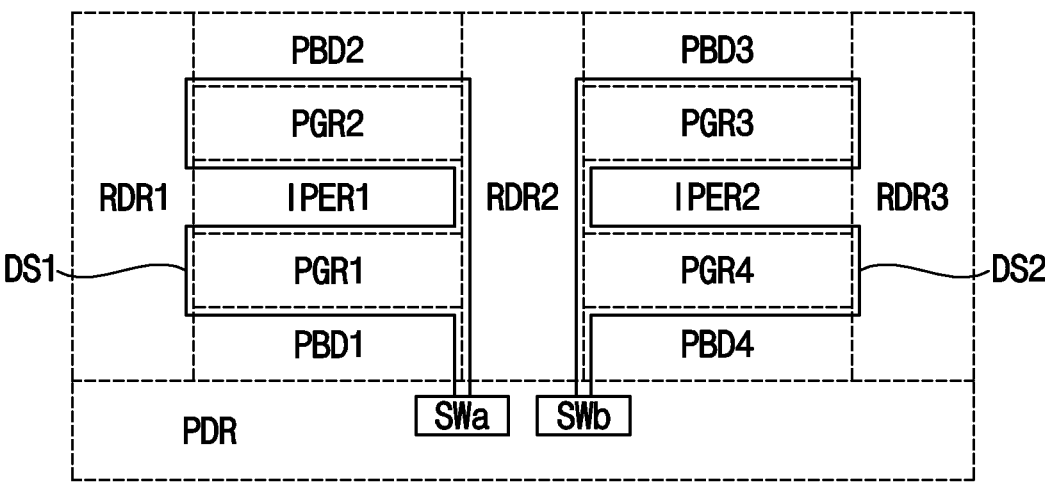
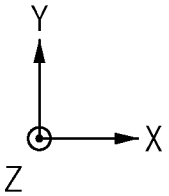
FIG. 35
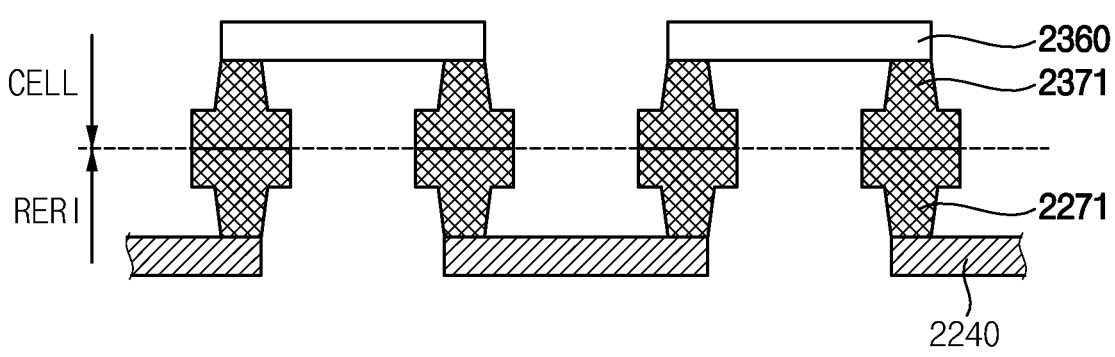

METHOD OF DETECTING OPENING OF SEMICONDUCTOR DEVICE INCLUDING DETECTION STRUCTURE AND SEMICONDUCTOR DEVICE

CROSS-REFERENCE TO RELATED APPLICATIONS

This application claims benefit of priority under 35 U.S.C. § 119 to Korean Patent Application No. 10-2023-0098160, filed on Jul. 27, 2023, in the Korean Intellectual Property Office, the disclosure of which is incorporated by reference herein in its entirety.

BACKGROUND

1. Field

The present disclosure relates generally to semiconductor integrated circuits, and more particularly, to a method of detecting an opening of a semiconductor device including a detection structure and a semiconductor device that performs the method.

2. Description of Related Art

Related integrated circuits may be manufactured by forming repeated patterns in a wafer of semiconductor material. The wafer may be cut and/or diced into a plurality of semiconductor dies, and the respective semiconductor die may be packaged into a semiconductor chip. However, manufacturing defects, such as openings, may occur in the semiconductor die during the cutting and/or packaging processes. In order to increase a manufacturing yield of the semiconductor dies (e.g., decrease yield of defective products), the semiconductors may be inspected to detect and/or locate the openings precisely.

SUMMARY

One or more example embodiments of the present disclosure may provide a method of detecting an opening of a semiconductor device including a detecting structure, capable of determining a location of the opening accurately.

Further, one or more example embodiments of the present disclosure may provide a semiconductor device capable of performing a method of detecting an opening.

According to an aspect of the present disclosure, a method of detecting an opening of a semiconductor device includes generating a clock signal based on a probe of a measuring circuit contacting, via a switch, an end of a detection structure, measuring a period of the clock signal, counting a number of periods of the clock signal during a reference time interval, and determining, based on the number of periods of the clock signal, a location of the opening of the semiconductor device. The detection structure being formed in a semiconductor die of the semiconductor device in an annular shape.

According to an aspect of the present disclosure, a method of detecting an opening of a semiconductor device includes generating a first number by counting, during a reference time interval, first periods of a first clock signal generated by contacting, via a first switch, a probe of a measuring circuit to a first end of a detection structure, generating a second number by counting, during the reference time interval, second periods of a second clock signal generated by contacting, via a second switch, the probe of the measuring circuit to a second end of the detection structure, and determining a location of the opening in the detection structure based on a first difference between the first number and the second number, and a second difference between a first period of the first clock signal and a second period of the second clock signal. The detection structure being formed in a semiconductor die of the semiconductor device in an annular shape.

According to an aspect of the present disclosure, a semiconductor device includes a first semiconductor die including a first central region and a first external region at least partially surrounding the first central region, a second semiconductor die including a second central region and a second external region at least partially surrounding the second central region, a memory cell structure formed in the first central region of the first semiconductor die, a peripheral circuit formed in the second central region of the second semiconductor die along a first direction and a second direction, a first detection structure formed in the second central region of the second semiconductor die to at least partially surround a first sub circuit region and a second sub circuit region which are spaced apart from each other in the second direction in the peripheral circuit, and a measuring circuit configured to measure a first period of a first clock signal generated by contacting a probe to a first end of the first detection structure through a first switch, and determine a first location of a first opening in the first detection structure by counting a first number of first periods of the first clock signal during a reference time interval. The first semiconductor die being at least partially stacked in a vertical direction on the second semiconductor die.

In some embodiments, the measuring circuit may determine whether an opening exists in the detection structure based on a period of a clock signal that is generated by contacting a probe to an end of the detection structure. When the opening exists, the measuring circuit may determine a location of the opening in the detection structure by counting a number of periods of the clock signal during a reference time interval. Accordingly, the measuring circuit may detect an opening that may be difficult to be detectable based on related schemes.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which:

FIG. 3 is a flow chart illustrating a method of detecting an opening of a semiconductor device including a detection structure, according to example embodiments;

FIG. 4 is a flow chart illustrating a method of detecting an opening of a semiconductor device including a detection structure, according to example embodiments;

FIG. 8 illustrates an example of the number of periods of the clock signal depending on the location of the opening in the detection structure of FIG. 6, according to example embodiments;

FIG. 9 illustrates an example of the number of periods of the clock signal and the period of the clock signal depending on the location of the opening in the detection structure of FIG. 6, according to example embodiments;

FIGS. 11, 12, and 13 are cross-sectional diagrams illustrating a vertical structure of a 3D detection structure, according to example embodiments;

FIG. 33 is a plan view illustrating a peripheral circuit region in the semiconductor device of FIG. 32, according to example embodiments;

FIG. 34 illustrates detection structures that are disposed in the peripheral circuit region of FIG. 33, according to example embodiments;

FIG. 35 illustrates a portion of the first detection structure in FIG. 34, according to example embodiments.

DETAILED DESCRIPTION

Figure 1A:
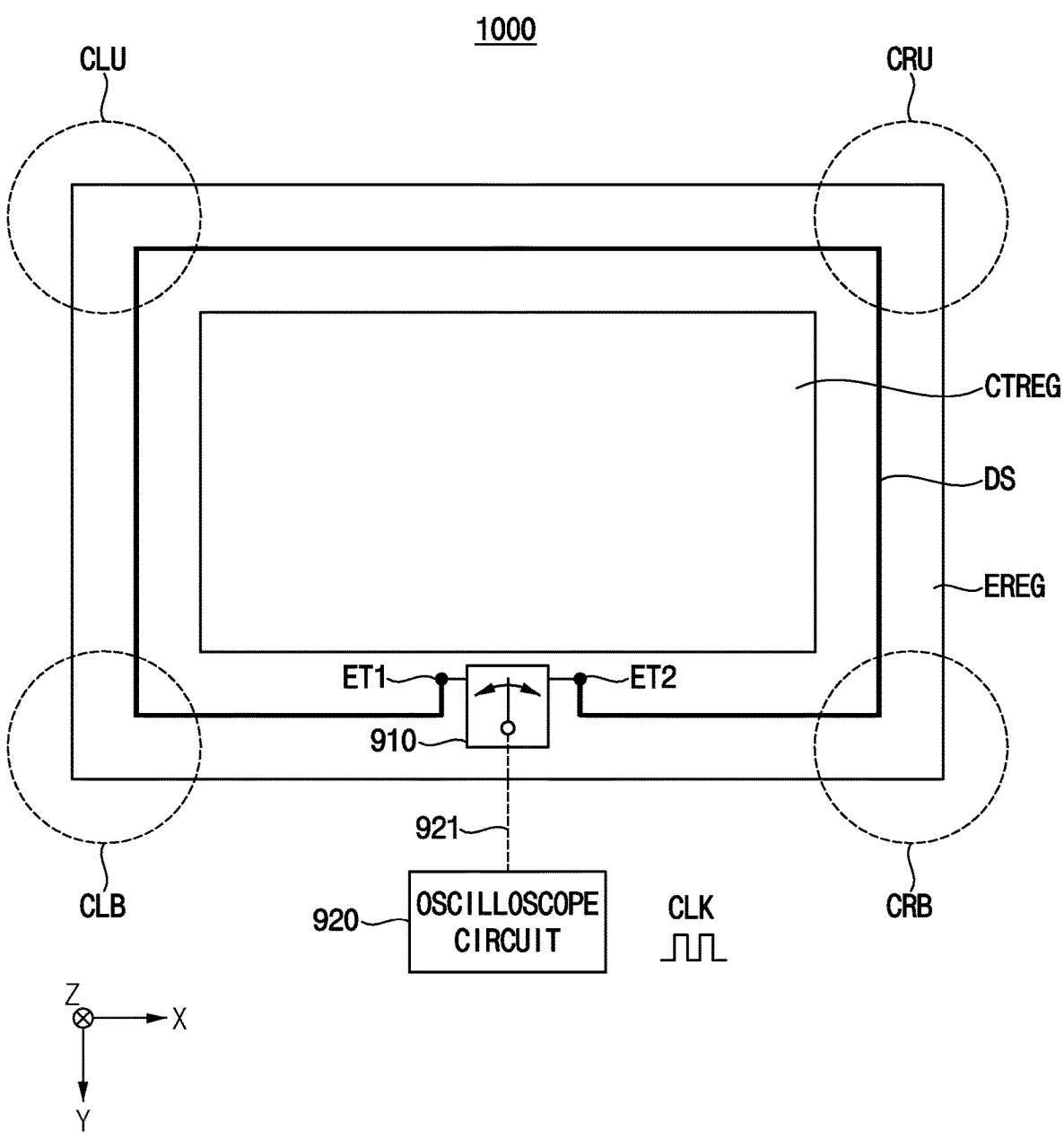
FIG. 1A is a top view illustrating a layout of a semiconductor device, according to example embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, controller, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like.

As used herein, each of the terms "SiO", "SiON", and "SiN", and the like may refer to a material made of elements included in each of the terms and is not a chemical formula representing a stoichiometric relationship.

Hereinafter, various embodiments of the present disclosure are described with reference to the accompanying drawings.

FIG. 1A is a top view illustrating a layout of a semiconductor device, according to example embodiments.

Referring to FIG. 1A, a semiconductor device 1000 may include at least one semiconductor die. The semiconductor die may include a central region CTREG and an external region EREG at least partially surrounding the central region CTREG.

Various semiconductor integrated circuits may be formed in the central region CTREG depending on a kind and/or type of the semiconductor device 1000. For example, the semiconductor device 1000 may be and/or may include a non-volatile memory device and a memory integrated circuit may be formed in the central region CTREG of the semiconductor die. However, the present disclosure is not limited in this regard, and the semiconductor device 1000 may be and/or may include other kinds and/or types of devices and/or integrated circuits without departing from the scope of the present disclosure.

A detection structure DS, which may have an annular shape, according to example embodiments, may be configured to detect an opening and/or may be formed in the external region EREG.

The detection structure DS may include a first conduction segment passing through a left-bottom corner region CLB of the external region EREG, a second conduction segment passing through a left-upper corner region CLU of the external region EREG, a third conduction segment passing through a right-upper corner region CRU of the external region EREG and a fourth conduction segment passing through a right-bottom corner region CRB of the external region EREG. However, the present disclosure is not limited in this regard, and the detection structure DS may include less conduction segments (e.g., less than four (4)) and/or more conduction segments (e.g., more than four (4)). Alternatively or additionally, the conduction segments of the detection structure DS may be configured in a different configuration and/or arrangement. For example, the first to fourth conduction segments may pass through same and/or different regions of the external region EREG.

A probe 921 of a measuring circuit 920 (e.g., an oscilloscope circuit) may be contacted (e.g., connected, coupled) to an end of the detection structure DS through a switch 910. The measuring circuit 920 may measure a period of a clock signal CLK that may be generated by contacting the probe of the measuring circuit 920 to the end of the detection structure DS and may determine a location of the opening in the detection structure DS by counting a number of periods of the clock signal CLK during a reference time interval.

The detection structure DS may include a first end ET1 and a second end ET2, the first conduction segment may include the first end ET1 and the fourth conduction segment may include the second end ET2.

When an opening occurs in the detection structure DS, the period of the clock signal CLK may vary depending on a location at which the opening occurs (e.g., a location of the opening) and the number of periods of the clock signal CLK may vary depending on the location of the opening because the period of the clock signal CLK varies. When the opening occurs in the detection structure DS, a period of the clock signal CLK may be greater than a reference period determined by an intrinsic capacitance of the measuring circuit 920 and an intrinsic resistance of the measuring circuit 920.

Hereinafter, example embodiments may be described using an orthogonal set of an X direction, a Y direction and a Z direction for convenience of illustration and description. The X direction, the Y direction and the Z direction may be used to indicate three perpendicular directions along the three directions, and may not limited to particular directions. The X direction may correspond to a first horizontal direction and/or a row direction, the Y direction may correspond to a second horizontal direction and/or a column direction, and the Z direction may correspond to a vertical direction. If exceptional descriptions are not mentioned, the Z direction may indicate a vertical direction perpendicular to the conduction layers.

As used herein, "upper", "bottom", "left" and "right" may not be used to represent particular fixed positions but to represent relative positions. Accordingly, example embodiments may include structures of bilateral symmetry, structures of top and bottom symmetry, rotated structures and the like with respect to the detection structure disclosed herein.

Figure 1B:
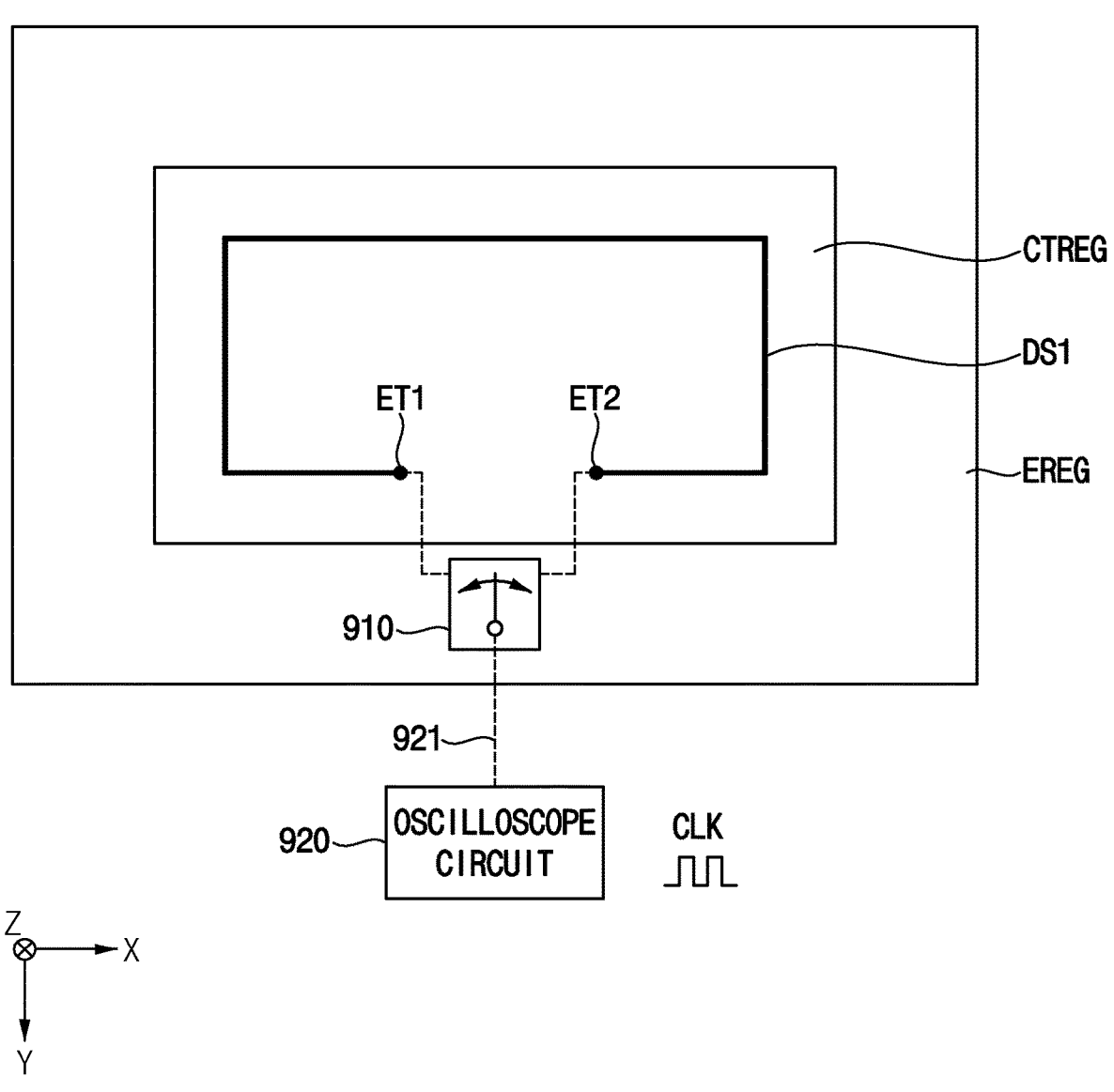
FIG. 1B is a top view illustrating a layout of a semiconductor device, according to example embodiments.

FIG. 1B is a top view illustrating a layout of a semiconductor device, according to example embodiments.

Referring to FIG. 1B, a semiconductor device 1000a may include at least one semiconductor die. The semiconductor die may include a central region CTREG and an external region EREG at least partially surrounding the central region CTREG.

A detection structure DS1, which may have an annular shape, according to example embodiments, may be configured to detect an opening and/or may be formed in an edge portion of the central region CTREG.

The detection structure DS1 may have a configuration similar to a configuration of the detection structure DS in FIG. 1A.

The detection structure DS1 may include a first conduction segment passing through a left-bottom corner region of the central region CTREG, a second conduction segment passing through a left-upper corner region of the central region CTREG, a third conduction segment passing through a right-upper corner region CRU of the central region CTREG and a fourth conduction segment passing through a right-bottom corner region of the central region CTREG.

The probe 921 of the measuring circuit 920 may be contacted (e.g., connected, coupled) to an end of the detection structure DS1 through a switch 910. The measuring circuit 920 may measure a period of a clock signal CLK that may be generated by contacting the probe of the measuring circuit 920 to the end of the detection structure DS and may determine a location of the opening in the detection structure DS by counting a number of periods of the clock signal CLK during a reference time interval.

The detection structure DS1 may include a first end ET1 and a second end ET2, the first conduction segment may include the first end ET1 and the fourth conduction segment may include the second end ET2.

When an opening occurs in the detection structure DS1, the period of the clock signal CLK may vary depending on a location at which the opening occurs (e.g., a location of the opening) and the number of periods of the clock signal CLK may vary depending on the location of the opening because the period of the clock signal CLK varies. When the opening occurs in the detection structure DS1, a period of the clock signal CLK may be greater than a reference period determined by an intrinsic capacitance of the measuring circuit 920 and an intrinsic resistance of the measuring circuit 920.

Therefore, the detection structure DS of FIG. 1A and/or the detection structure DS1 of FIG. 1B, according to example embodiments, may have an annular shape and/or may be formed adjacent to an edge portion of the central region CTREG in the semiconductor die.

Figure 2:
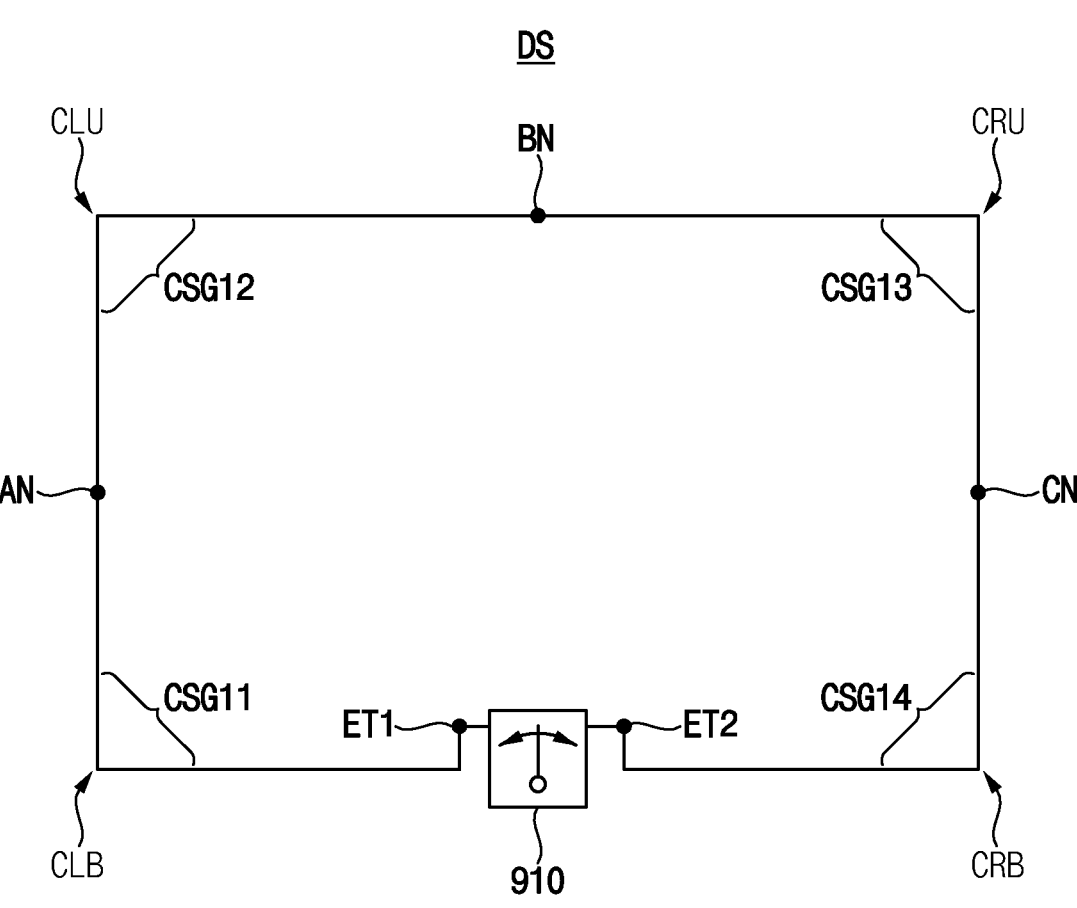
FIG. 2 is a top view illustrating the detection structure in FIG. 1A, according to example embodiments.

FIG. 2 is a top view illustrating the detection structure in FIG. 1A, according to example embodiments.

In FIG. 2, the switch 910 is illustrated for convenience of description.

Referring to FIG. 2, the detection structure DS may include a first conduction segment CSG11, a second conduction segment CSG12, a third conduction segment CSG13 and a fourth conduction segment CSG14.

The first conduction segment CSG11 may include the first end ET1 that may be connected to the switch 910 and may pass through the left-bottom corner region CLB of the external region EREG. The second conduction segment VSG12 may be connected to the first conduction segment CSG11 at a first node AN and may pass through the left-upper corner region CLU of the external region EREG. The third conduction segment CSG13 may be connected to the second conduction segment CSG12 at a second node BN and may pass through the right-upper corner region CRU of the external region EREG. The fourth conduction segment CSG14 may be connected to the third conduction segment CSG13 at a third node CN, and may pass through the right-bottom corner region CRB of the external region EREG, and may include the second end ET2 that may be connected to the switch 910.

FIG. 3 is a flow chart illustrating a method of detecting an opening of a semiconductor device including a detection structure, according to example embodiments.

Referring to FIGS. 1A through 3, a period of the clock signal CLK that is generated by contacting the probe 921 of the measuring circuit 920 to an end of the detection structure DS through the switch 911 is measured (operation S110). A location of the opening in the detection structure DS is determined by counting a number of periods of the clock signal CLK during a reference time interval (operation S130).

FIG. 4 is a flow chart illustrating a method of detecting an opening of a semiconductor device including a detection structure, according to example embodiments.

Referring to FIGS. 1A through 2 and 4, a first number is generated by counting first periods of a first clock signal that may be generated by contacting a probe 921 of a measuring circuit 920 to a first end ET1 of the detection structure DS or DS1 through a switch 910, during a reference time interval (operation S210). A second number may be generated by counting second periods of a second clock signal that may be generated by contacting the probe 921 of the measuring circuit 920 to a second end ET2 of the detection structure DS or DS1 through the switch 910, during a reference time interval (operation S230).

A location of the opening in the detection structure DS or DS1 is determined based on a difference between the first number and the second number, a first period of the first clock signal and a second period of the second clock signal (operation S250).

Figures 5, 6:
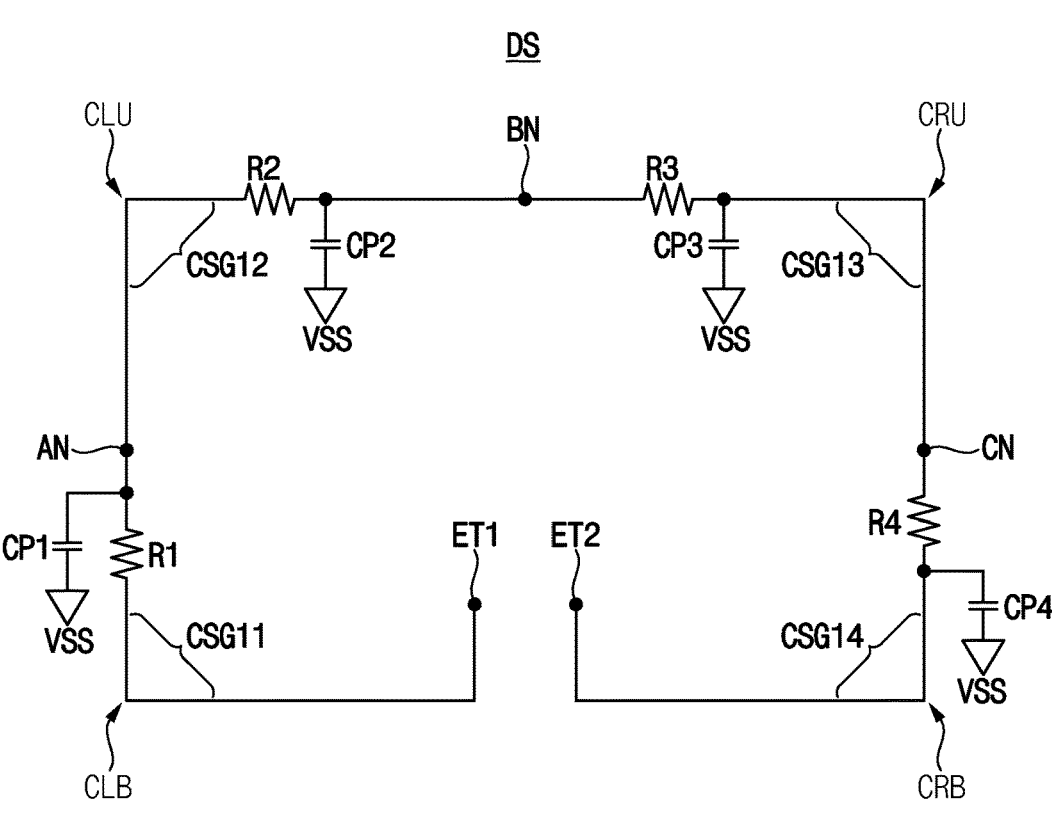
FIG. 5 illustrates an example of resistance and parasitic capacitance in the detection structure in FIG. 2, according to example embodiments.
FIG. 6 illustrates an example of parasitic capacitance in the detection structure in FIG. 2, according to example embodiments.

FIG. 5 illustrates an example of resistance and parasitic capacitance in the detection structure in FIG. 2, according to example embodiments.

Referring to FIG. 5, it may be assumed that an opening does not occur in the detection structure DS.

As shown in FIG. 5, the detection structure DS may be modeled as having a resistance R1 in the first conduction segment CSG11 and a parasitic capacitance CP1 between the first conduction segment CSG11 and a ground voltage VSS. The detection structure DS may be further modeled as having a resistance R2 in the second conduction segment CSG12 and a parasitic capacitance CP2 between the second conduction segment CSG12 and the ground voltage VSS.

The detection structure DS may be further modeled as having a resistance R3 in the third conduction segment CSG13 and a parasitic capacitance CP3 between the third conduction segment CSG13 and the ground voltage VSS. The detection structure DS may be further modeled as having a resistance R4 in the fourth conduction segment CSG14 and a parasitic capacitance CP4 between the fourth conduction segment CSG14 and the ground voltage VSS.

FIG. 6 illustrates an example of parasitic capacitance in the detection structure in FIG. 2, according to example embodiments.

Referring to FIG. 6, it may be assumed that an opening (e.g., first opening OP1, second opening OP2, third opening OP3, fourth opening OP4) occurs in the detection structure DS.

As shown in FIG. 6, when the first opening OP1 occurs in the first conduction segment CSG11, the detection structure DS may be modeled as having a parasitic capacitance CP1 in the first conduction segment CSG11, and the parasitic capacitance CP1 may be coupled between the first conduction segment CSG11 and the ground voltage VSS. The first opening OP1 may represent one of a plurality of openings that may occur at various locations of the first conduction segment CSG11.

When the second opening OP2 occurs in the second conduction segment CSG12, the detection structure DS may be modeled as having a parasitic capacitance CP2 in the second conduction segment CSG12, and the parasitic capacitance CP2 may be coupled between the second conduction segment CSG12 and the ground voltage VSS. The second opening OP2 may represent one of a plurality of openings that may occur at various locations of the second conduction segment CSG12.

When the third opening OP3 occurs in the third conduction segment CSG13, the detection structure DS may be modeled as having a parasitic capacitance CP3 in the third conduction segment CSG13, and the parasitic capacitance CP3 may be coupled between the third conduction segment CSG13 and the ground voltage VSS. The third opening OP3 may represent one of a plurality of openings that may occur at various locations of the third conduction segment CSG13.

When the fourth opening OP4 occurs in the fourth conduction segment CSG14, the detection structure DS may be modeled as having a parasitic capacitance CP4 in the fourth conduction segment CSG14, and the parasitic capacitance CP4 may be coupled between the fourth conduction segment CSG14 and the ground voltage VSS. The fourth opening OP4 may represent one of a plurality of openings that may occur at various locations of the fourth conduction segment CSG14.

When the probe 921 of the measuring circuit 920 is connected to the first end ET1, the clock signal CLK may be generated in a forward direction FWD of the detection structure DS. When the probe 921 of the measuring circuit 920 is connected to the second end ET2, the clock signal CLK may be generated in a backward direction BWD of the detection structure DS.

In some embodiments, all of the first opening OP1, the second opening OP2, the third opening OP3, and the fourth opening OP4 may exist in the detection structure DS. In some optional or additional embodiments, at least one of the first opening OP1, the second opening OP2, the third opening OP3, and the fourth opening OP4 may exist in the detection structure DS. That is, one or more of the first opening OP1, the second opening OP2, the third opening OP3, and the fourth opening OP4 may not exist in the detection structure DS.

When at least one of the first opening OP1, the second opening OP2, the third opening OP3 and the fourth opening OP4 occurs in the detection structure DS, a period of the clock signal CLK output from the detection structure DS may be represented as an equation similar to Equation 1.

$$T = \text{Rosc} \times (Cosc + Cmet) \qquad \text{(Eq. 1)}$$

Referring to Eq. 1, T may represent a period of the clock signal CLK, Rosc may represent an intrinsic resistance of the measuring circuit 920, Cosc may represent an intrinsic capacitance of the measuring circuit 920, and Cmet may represent a capacitance of the detection structure DS, which may vary based on the location of the opening in the detection structure DS.

When the opening occurs in the detection structure DS, the period T of the clock signal CLK may vary based on the location of the opening in the detection structure DS. As a result, the location of the opening may be determined by measuring the period T of the clock signal CLK and by counting a number of periods of the clock signal CLK during a reference number of time.

Figure 7A:
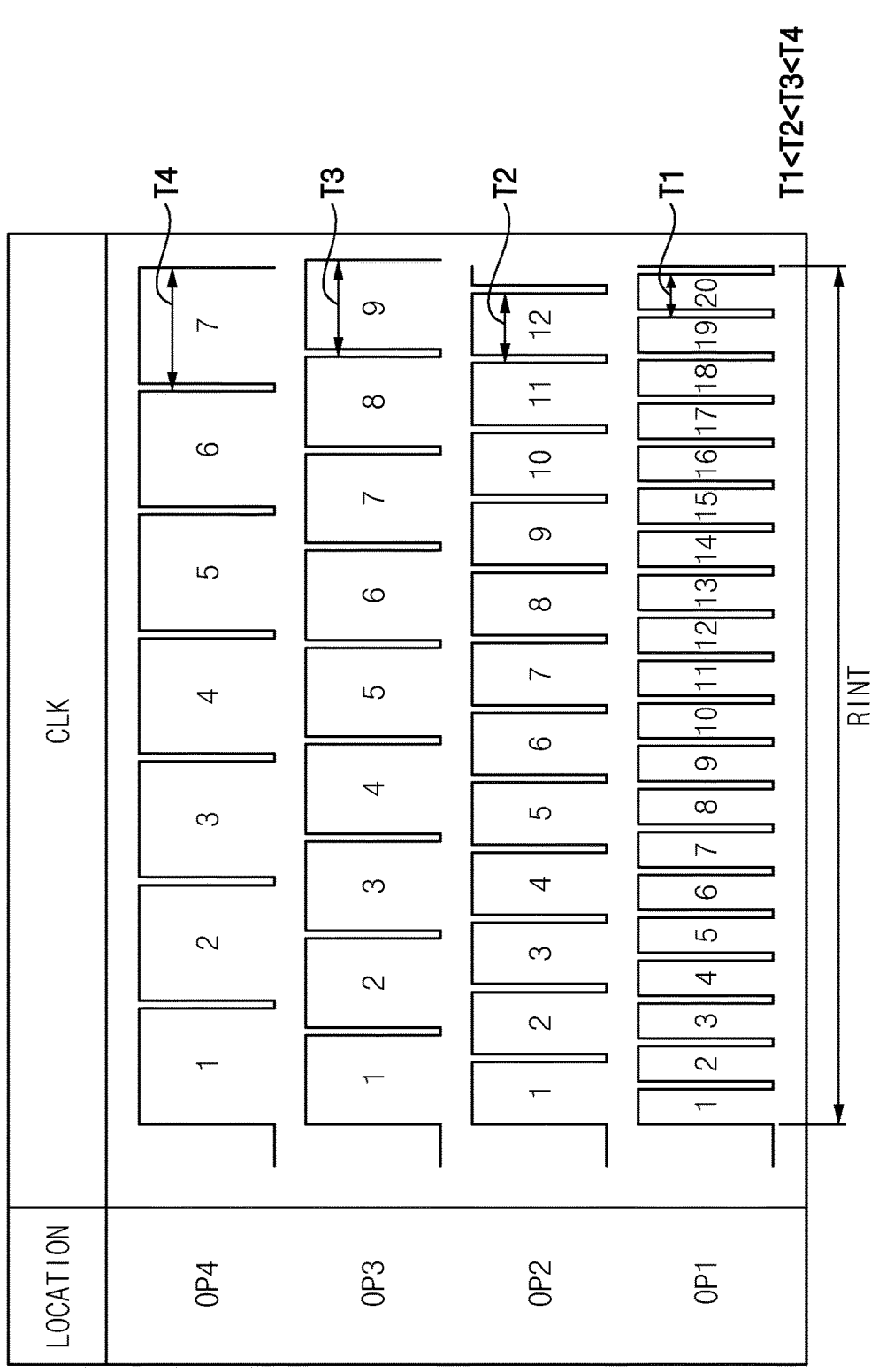
FIGS. 7A and 7B illustrate the clock signal measured in the detection structure of FIG. 6, respectively, according to example embodiments.
Figure 7B:
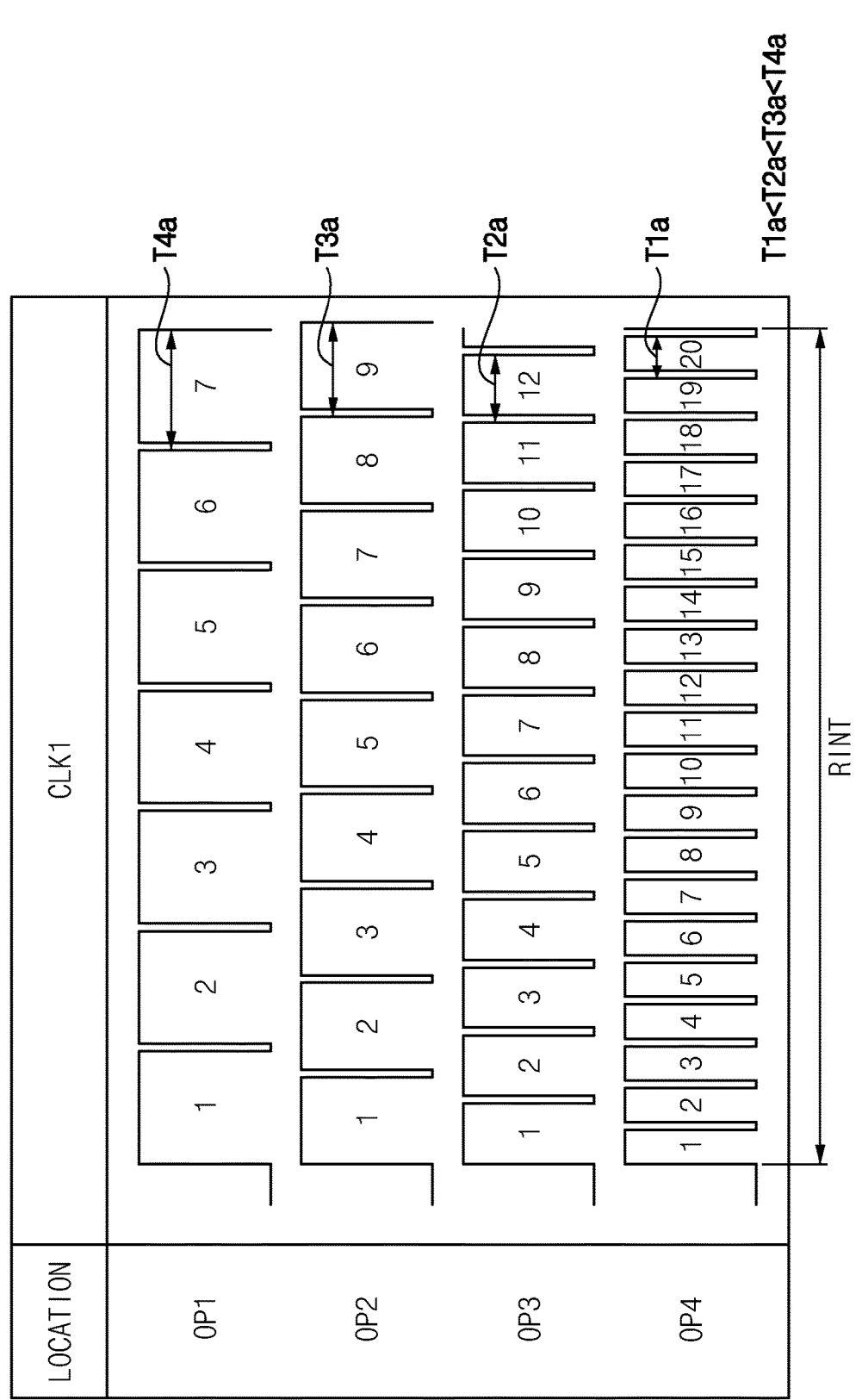

FIGS. 7A and 7B illustrate the clock signal measured in the detection structure of FIG. 6, respectively, according to example embodiments. FIG. 8 illustrates an example of the number of periods of the clock signal depending on the location of the opening in the detection structure of FIG. 6, according to example embodiments.

FIG. 7A illustrates an example of the clock signal when the probe 921 of the measuring circuit 920 is contacted with the first end ET1 of the detection structure DS. FIG. 7B illustrates an example of the clock signal when the probe 921 of the measuring circuit 920 is contacted with the second end ET2 of the detection structure DS. FIG. 8 illustrates an example of the number of periods of the clock signal depending on the location of the opening in the detection structure of FIG. 6 in case of FIG. 7A.

Referring to FIG. 8, it may assumed that an intrinsic resistance Rosc of the measuring circuit 920 may have a resistance value Rv.

Referring to FIGS. 6, 7A, and 8, when the first opening OP1 occurs in the first conduction segment CSG11 of the detection structure DS, the capacitance Cmet of the detection structure DS may correspond to a first capacitance C11 and may vary according to a distance from the first end ET1 to the first opening OP1. Consequently, the clock signal CLK may have a first period T1 and a number of periods of the clock signal CLK during a reference time interval RINT may be a first number corresponding to a first counted value CV1.

When the second opening OP2 occurs in the second conduction segment CSG12 of the detection structure DS, the capacitance Cmet of the detection structure DS may correspond to a second capacitance C12 and may vary according to a distance from the first end ET1 to the second opening OP2. Therefore, the clock signal CLK may have a second period T2 and a number of periods of the clock signal CLK during the reference time interval RINT may be a second number corresponding to a second counted value CV2.

When the third opening OP3 occurs in the third conduction segment CSG13 of the detection structure DS, the capacitance Cmet of the detection structure DS may correspond to a third capacitance C13 and may vary according to a distance from the first end ET1 to the third opening OP3. As a result, the clock signal CLK may have a third period T3 and a number of periods of the clock signal CLK during the reference time interval RINT may be a third number corresponding to a third counted value CV3.

When the fourth opening OP4 occurs in the fourth conduction segment CSG14 of the detection structure DS, the capacitance Cmet of the detection structure DS may correspond to a fourth capacitance C14 and may vary according to a distance from the first end ET1 to the fourth opening OP4. Therefore, the clock signal CLK may have a fourth period T4 and a number of periods of the clock signal CLK during the reference time interval RINT may be a fourth number corresponding to a fourth counted value CV4.

As a distance from the first end ET1 to a position at which the opening occurs increases, the capacitance Cmet of the detection structure DS may increase based on Eq. 1 and the period T of the clock signal CLK may also increase. In addition, as the period T of the clock signal CLK increases, a number of periods of the clock signal CLK counted during the reference time interval RINT may decrease.

Accordingly, the second period T2 may be greater than the first period T1, the third period T3 may be greater than the second period T2, and the fourth period T4 may be greater than the third period T3. The second counted value CV2 may be smaller than the first counted value CV1, the third counted value CV3 may be smaller than the second counted value CV2, and the fourth counted value CV4 may be smaller than the third counted value CV3.

Referring to FIGS. 6 and 7B, when the first opening OP1 occurs in the first conduction segment CSG11 of the detection structure DS, a clock signal CLK1 may have a fourth period T4a due to the capacitance Cmet of the detection structure DS, according to a distance from the second end ET2 to the first opening OP1, and a number of periods of the clock signal CLK1 during the reference time interval RINT may be a fourth number.

When the second opening OP2 occurs in the second conduction segment CSG12 of the detection structure DS, the clock signal CLK1 may have a third period T3a due to the capacitance Cmet of the detection structure DS, according to a distance from the second end ET2 to the second opening OP2, and a number of periods of the clock signal CLK1 during the reference time interval RINT may be a third number.

When the third opening OP3 occurs in the third conduction segment CSG13 of the detection structure DS, the clock signal CLK1 may have a second period T2a due to the capacitance Cmet of the detection structure DS, according to a distance from the second end ET2 to the third opening OP3, and a number of periods of the clock signal CLK1 during the reference time interval RINT may be a second number.

When the fourth opening OP4 occurs in the fourth conduction segment CSG14 of the detection structure DS, the clock signal CLK1 may have a first period T1a due to the capacitance Cmet of the detection structure DS, according to a distance from the second end ET2 to the fourth opening OP4, and a number of periods of the clock signal CLK1 during the reference time interval RINT may be a first number.

The fourth period T4a may be greater than the third period T3a, the third period T3a may be greater than the second period T2a and the second period T2a may be greater than the first period T1a.

FIG. 9 illustrates an example of the number of periods of the clock signal and the period of the clock signal depending on the location of the opening in the detection structure of FIG. 6, according to example embodiments.

FIG. 9 illustrates a first number # of CLK1 and a first period Ta of a first clock signal CLK1 which is generated by contacting the probe 921 of the measuring circuit 920 to the first end ET1 of the detection structure DS through the switch 910, a second number # of CLK2 and a second period Tb of a second clock signal CLK2 which is generated by contacting the probe 921 of the measuring circuit 920 to the second end ET2 of the detection structure DS through the switch 910 and a difference between the first number # of CLK1 and the second number # of CLK2.

When the first opening OP1 occurs in the first conduction segment CSG11 of the detection structure DS, the first number # of CLK1 of the first clock signal CLK1 has a first counted value CV11, the second number # of CLK2 of the second clock signal CLK2 has a second counted value CV12, the first period Ta has a first value T11 and the second period Tb has a second value T12. As described with reference to FIG. 8, the first value T11 may be smaller than the second value T12, a sign of a difference between the first counted value CV11 and the second counted value CV12 may be positive and an absolute value of the sign may be greater than a reference value. Therefore, the measuring circuit 920 may determine that the opening occurs in the first conduction segment CSG11.

When the second opening OP2 occurs in the second conduction segment CSG12 of the detection structure DS, the first number # of CLK1 of the first clock signal CLK1 has a first counted value CV21, the second number # of CLK2 of the second clock signal CLK2 has a second counted value CV22, the first period Ta has a first value T21 and the second period Tb has a second value T22. As described with reference to FIG. 8, the first value T21 may be smaller than the second value T22, a sign of a difference between the first counted value CV21 and the second counted value CV22 may be positive and an absolute value of the sign may be equal to or smaller than the reference value. Therefore, the measuring circuit 920 may determine that the opening occurs in the second conduction segment CSG12.

When the third opening OP3 occurs in the third conduction segment CSG13 of the detection structure DS, the first number # of CLK1 of the first clock signal CLK1 has a first counted value CV31, the second number # of CLK2 of the second clock signal CLK2 has a second counted value CV32, the first period Ta has a first value T31 and the second period Tb has a second value T32. As described with reference to FIG. 8, the first value T31 may be greater than the second value T32, a sign of a difference between the first counted value CV31 and the second counted value CV32 may be negative and an absolute value of the sign may be equal to or smaller than the reference value. Therefore, the measuring circuit 920 may determine that the opening occurs in the third conduction segment CSG13.

When the fourth opening OP4 occurs in the fourth conduction segment CSG14 of the detection structure DS, the first number # of CLK1 of the first clock signal CLK1 has a first counted value CV41, the second number # of CLK2 of the second clock signal CLK2 has a second counted value CV42, the first period Ta has a first value T41 and the second period Tb has a second value T42. As described with reference to FIG. 8, the first value T41 may be greater than the second value T42, a sign of a difference between the first counted value CV41 and the second counted value CV42 may be negative and an absolute value of the sign may be greater than the reference value. Therefore, the measuring circuit 920 may determine that the opening occurs in the fourth conduction segment CSG14.

Accordingly, the measuring circuit 920 may generate the first number # of CLK1 of the first clock signal CLK1 by counting a number of periods of the first clock signal CLK1 during the reference time interval, which may be generated by contacting the probe 921 of the measuring circuit 920 to the first end ET1 of the detection structure DS through the switch 910. Additionally, the measuring circuit 920 may generate the second number # of CLK2 of the second clock signal CLK2 by counting a number of periods of the second clock signal CLK2 during the reference time interval, which may be generated by contacting the probe 921 of the measuring circuit 920 to the second end ET2 of the detection structure DS through the switch 910. In such embodiments, the measuring circuit 920 may determine a location of the opening in the detection structure DS based on the difference between the first number # of CLK1 and the second number # of CLK2, the first period Ta of the first clock signal CLK1 and the second period Tb of the first clock signal CLK2.

Figure 10:
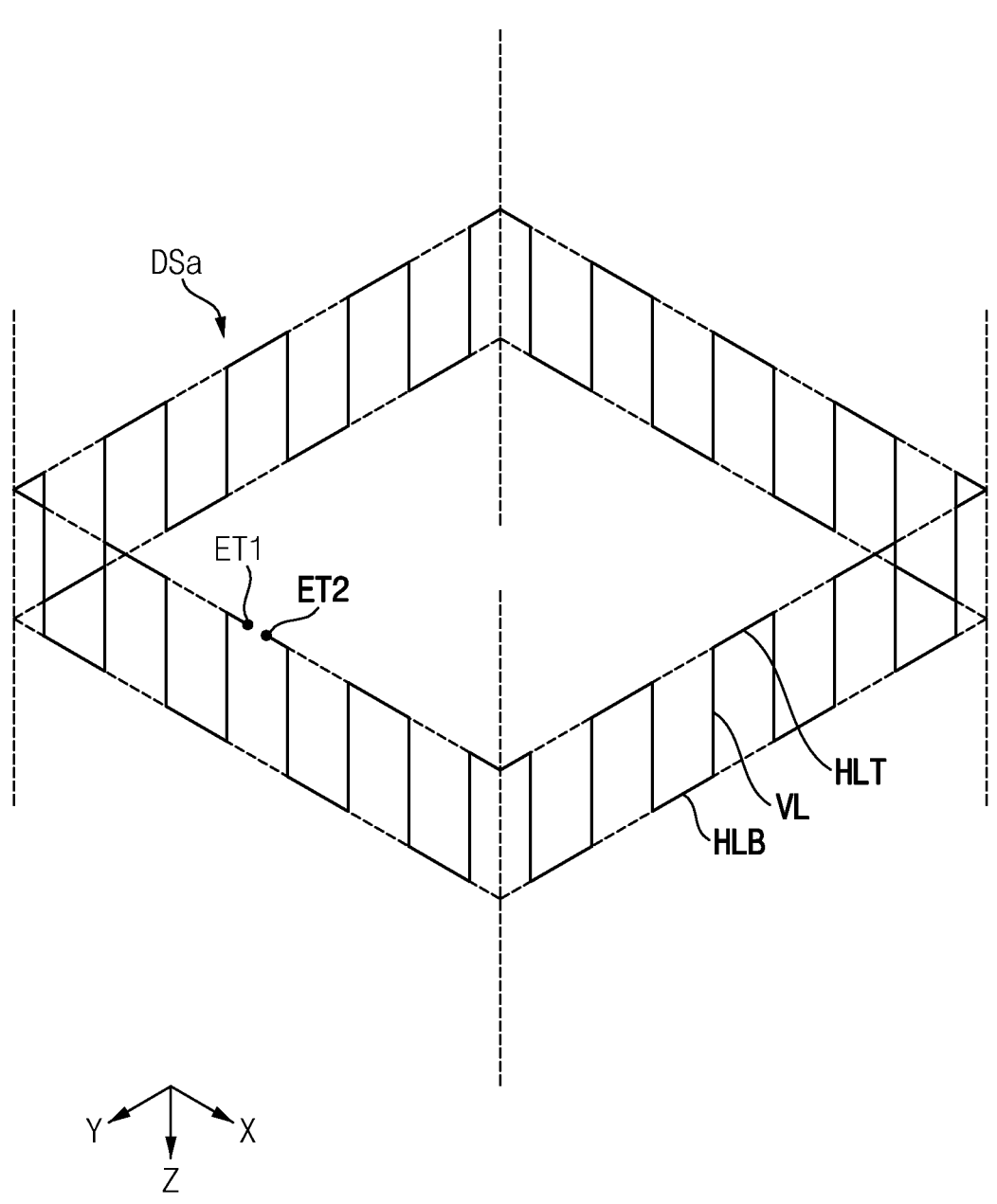
FIG. 10 is a perspective view of a three-dimensional (3D) detection structure, according to example embodiments.

FIG. 10 is a perspective view of a three-dimensional (3D) detection structure, according to example embodiments.

Referring to FIG. 10, a 3D detection structure DSa may include a single conduction loop. As described below, the semiconductor die may include a first conduction layer and a second conduction layer that may be provided under the first conduction layer. The conduction layers may include a metal layer in which metal line segments may be patterned and/or a polysilicon layer in which polysilicon line segments may be patterned. The 3D detection structure DSa may be expanded in the vertical direction Z through the first conduction layer and the second conduction layer.

The 3D detection structure DSa may include a plurality of top horizontal line segments HLT formed in the first conduction layer, a plurality of bottom horizontal line segments HLB formed in the second conduction layer, and a plurality of vertical line segments VL connecting the top horizontal line segments HLT and the bottom horizontal line segments HLB respectively to form the 3D detection structure DSa. The top horizontal line segments HLT, the bottom horizontal line segments HLB, and the vertical line segments VL may be disposed alternatingly along the 3D detection structure DSa, and may connect a first end ET1 and a second end ET2 in the annular shape to at least partially surround the central region of the semiconductor die.

In example embodiments, one of the first end ET1 and the second end ET2 may be connected to the probe 921 of the measuring circuit 920 and/or the first end ET1 and the second end ET2 may be sequentially connected to the probe 921 of the measuring circuit 920 through the switch 910 and the clock signal CLK may be provided to the measuring circuit 920.

Figure 13:
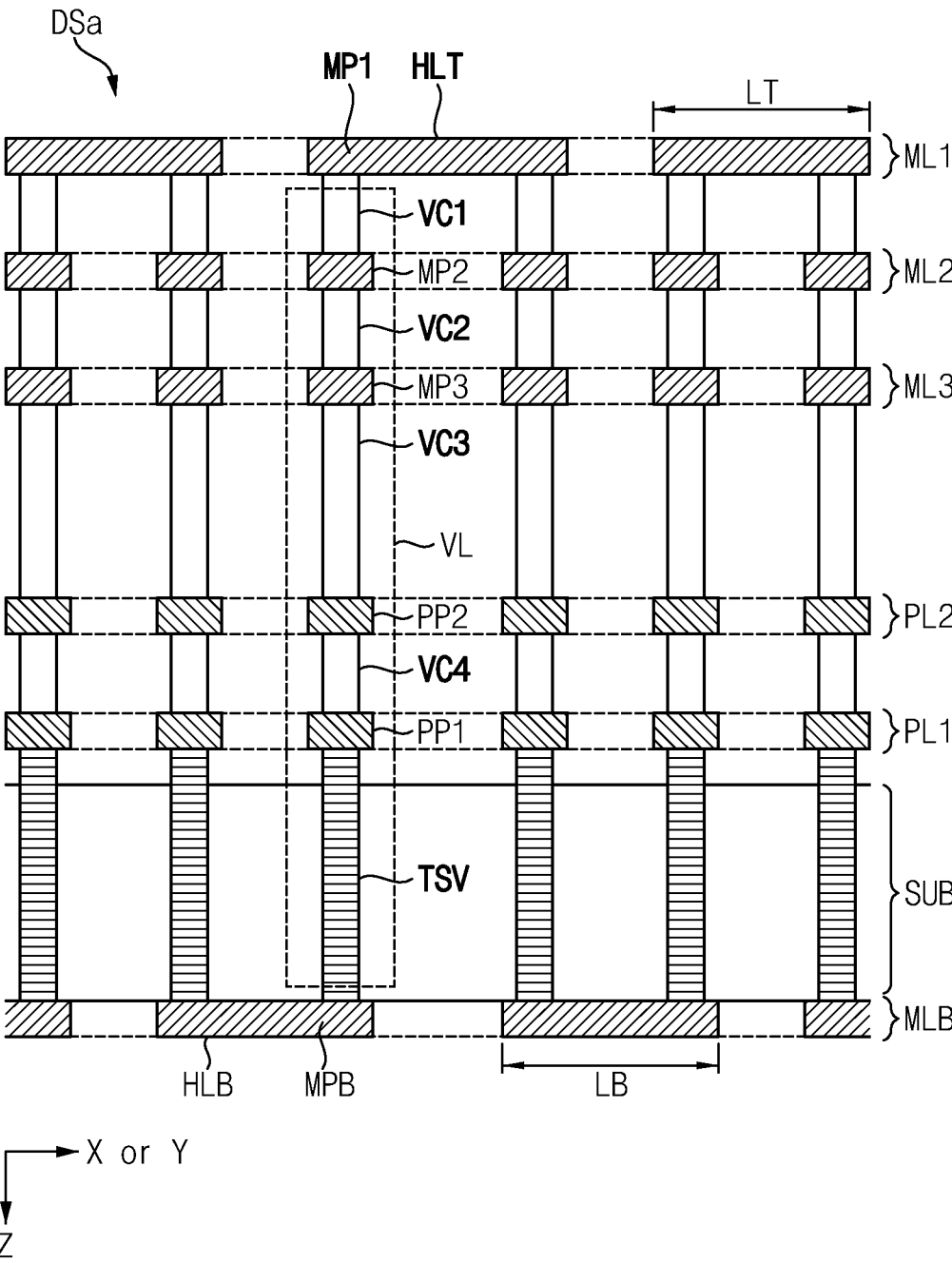

FIGS. 11, 12, and 13 are cross-sectional diagrams illustrating a vertical structure of a 3D detection structure, according to example embodiments.

Referring to FIG. 11, a semiconductor die may include a semiconductor substrate SUB and a dielectric layer in which upper structures may be formed. The dielectric layer may include a plurality of conduction layers (e.g., a first metal layer ML1, a second metal layer ML2, a third metal layer ML3, a gate polysilicon layer PL1, and a bit-line polysilicon layer PL2) in which conduction line patterns may be formed. The conduction layers may include one or more metal layers (e.g., the first metal layer ML1, the second metal layer ML2, and the third metal layer ML3) and one or more polysilicon layers (e.g., the gate polysilicon layer PL1 and the bit-line polysilicon layer PL2). The polysilicon layers may include the gate polysilicon layer PL1 in which gates of transistors in the semiconductor integrated circuit may be formed. If the semiconductor integrated circuit is a semiconductor memory device, the polysilicon layers may further include the bit-line polysilicon layer PL2 in which bit-lines in the semiconductor integrated circuit may be formed.

The 3D detection structure DSa may include a plurality of top horizontal line segments HLT formed in the first metal layer ML1, a plurality of bottom horizontal line segments HLB formed in the bit-line polysilicon layer PL2 and a plurality of vertical line segments VL connecting the top horizontal line segments HLT and the bottom horizontal line segments HLB respectively to form the 3D detection structure DSb.

As shown in FIG. 11, the first metal layer ML1 may correspond to an uppermost metal layer among the first to third metal layers ML1 to ML3 that may be formed over the semiconductor substrate SUB, and the bit-line polysilicon layer PL2 may correspond to the bit-line polysilicon layer that may be formed between the semiconductor substrate SUB and the first to third metal layers ML1 to ML3. The top horizontal line segments HLT may include first metal line patterns MP1 that may be formed in the uppermost first metal layer ML1, and the bottom horizontal line segments HLB may include polysilicon line patterns PP that may be formed in the bit-line polysilicon layer PL2.

The vertical line segments VL may include vertical contacts (e.g., first vertical contact VC1, second vertical contact VC2, and third vertical contact VC3) to provide an electrical connection between the first metal line patterns MP1 in the uppermost first metal layer ML1 and the polysilicon line patterns PP in the bit-line polysilicon layer PL2. The vertical line segments VL may further include conduction line patterns (e.g., second metal line patterns MP2 and third metal line patterns MP3) in the respective intermediate conduction layers (e.g., second metal layer ML2 and third metal layer ML3). In some embodiments, the conduction line pattern in one or both of the intermediate conduction layers ML2 and ML3 may be omitted. For example, the second metal line patterns MP2 in the intermediate second metal layer ML2 may be omitted, and the two vertical contacts (e.g., first vertical contact VC1 and second vertical contact VC2) may be combined as a longer vertical contact.

Hereinafter, repeated descriptions of the 3D detection structure DSa described with reference to FIG. 11 may be omitted for the sake of brevity.

Referring to FIG. 12, the 3D detection structure DSa may include a plurality of top horizontal line segments HLT formed in the first metal layer ML1, a plurality of bottom horizontal line segments HLB formed in the gate polysilicon layer PL1, and a plurality of vertical line segments VL connecting the top horizontal line segments HLT and the bottom horizontal line segments HLB respectively to form the 3D detection structure DSa.

As shown in FIG. 12, the first metal layer ML1 may correspond to an uppermost metal layer from among the first to third metal layers ML1 to ML3 that may be formed over the semiconductor substrate SUB, and the gate polysilicon layer PL1 may correspond to the gate polysilicon layer that may be formed between the semiconductor substrate SUB and the first to third metal layers ML1 to ML3. The top horizontal line segments HLT may include first metal line patterns MP1 that may be formed in the uppermost first metal layer ML1, and the bottom horizontal line segments HLB may include polysilicon line patterns PP1 that may be formed in the gate polysilicon layer PL1.

Referring to FIG. 13, the 3D detection structure DSa may include a plurality of top horizontal line segments HLT that may be formed in the first metal layer ML1, a plurality of bottom horizontal line segments HLB that may be formed in the second conduction layer MLB, and a plurality of vertical line segments VL connecting the top horizontal line segments HLT and the bottom horizontal line segments HLB respectively to form the 3D detection structure DSb.

As shown in FIG. 13, the first metal layer ML1 may correspond to an uppermost metal layer from among the first to third metal layers ML1 to ML3 that may be formed over the semiconductor substrate SUB, and the bottom metal layer MLB correspond to a metal layer that may be formed on a bottom surface of the semiconductor substrate SUB. The top horizontal line segments HLT may include first metal line patterns MP1 formed in the uppermost first metal layer ML1, and the bottom horizontal line segments HLB may include bottom metal line patterns MPB that may be formed in the bottom metal layer MLB on the bottom surface of the semiconductor substrate SUB.

As described with reference to FIGS. 11, 12, and 13, the 3D detection structure, according to example embodiments, may be expanded in the vertical direction Z to various depths. Using the 3D detection structure, the opening located at various location may be detected more accurately, when compared to related semiconductor devices.

The 3D detection structure DSa of FIGS. 11, 12 and 13 may be applicable to the detection structure DS1 of FIG. 1B.

Figure 14:
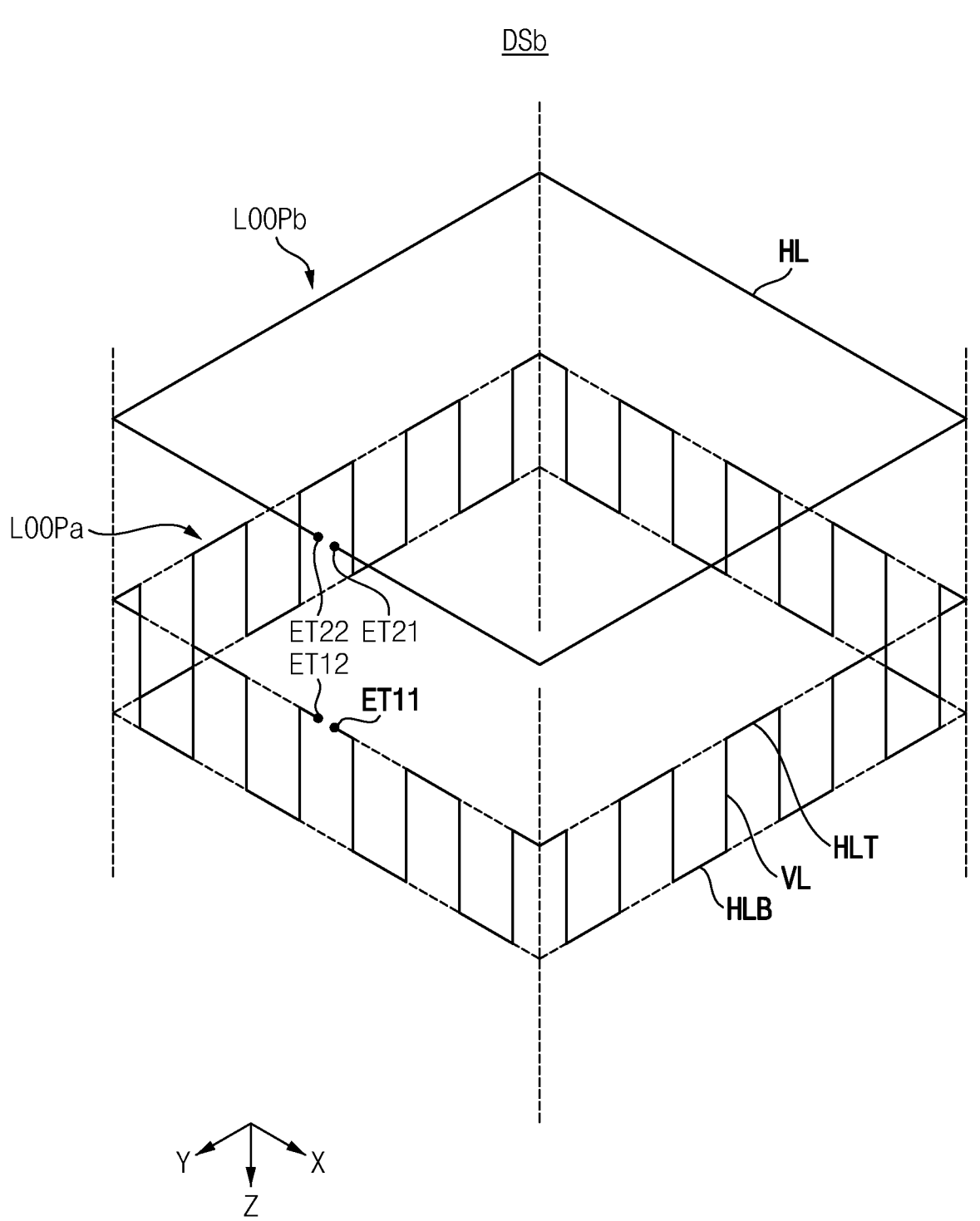
FIG. 14 is a perspective view of a 3D crack detection structure, according to example embodiments.

FIG. 14 is a perspective view of a 3D crack detection structure according to example embodiments.

Referring to FIG. 14, a 3D detection structure DSb may include a first conduction loop LOOPa and a second conduction loop LOOPb. The semiconductor die may include a first conduction layer, a second conduction layer under the first conduction layer, and a third conduction layer under the second conduction layer. The conduction layers may include a metal layer in which metal line segments may be patterned and/or a polysilicon layer in which polysilicon line segments may be patterned. The first conduction loop LOOPa may be expanded in the vertical direction Z between the second conduction layer and the third conduction layer in a 3D shape. The second conduction loop LOOPb may be formed in the first conduction layer in a two-dimensional (2D) shape.

The first conduction loop LOOPa may include a plurality of first top horizontal line segments HLT that may be formed in the second conduction layer, a plurality of bottom horizontal line segments HLB that may be formed in the third conduction layer, and a plurality of vertical line segments VL connecting the first top horizontal line segments HLT and the bottom horizontal line segments HLB respectively to form the first conduction loop LOOPa. The second conduction loop LOOPb may include a plurality of second top horizontal line segments HL that may be formed on the first conduction layer. The first top horizontal line segments HLT, the bottom horizontal line segments HLB, and the vertical line segments VL may be disposed alternatively along the first conduction loop LOOPa and connect a first end ET11 and a second end ET12 in a ring shape to at least partially surround the central region of the semiconductor die. The second top horizontal line segments HL may connect a first end ET21 and a second end ET222 in a ring shape to at least partially surround the central region of the semiconductor die.

In example embodiments, at least one of the first end ET11 and the second end ET12 may be connected to the probe 921 of the measuring circuit 920 through the switch 910. Alternatively or additionally, the first end ET11 and the second end ET12 may be sequentially connected to the probe 921 of the measuring circuit 920 through the switch 910. The clock signal may be provided to the measuring circuit 920. The measuring circuit 920 may determine a location of the opening in the first conduction loop LOOPa based on a period of the clock signal and a number of periods of the clock signal counted during a reference time interval. In addition, at least one of the first end ET21 and the second end ET22 may be connected to the probe 921 of the measuring circuit 920 through the switch 910. Alternatively or additionally, the first end ET21 and the second end ET22 may be sequentially connected to the probe 921 of the measuring circuit 920 through the switch 910. A clock signal may be provided to the measuring circuit 920. The measuring circuit 920 may determine a location of the opening in the second conduction loop LOOPb based on a period of the clock signal and a number of periods of the clock signal counted during a reference time interval.

Figure 15:
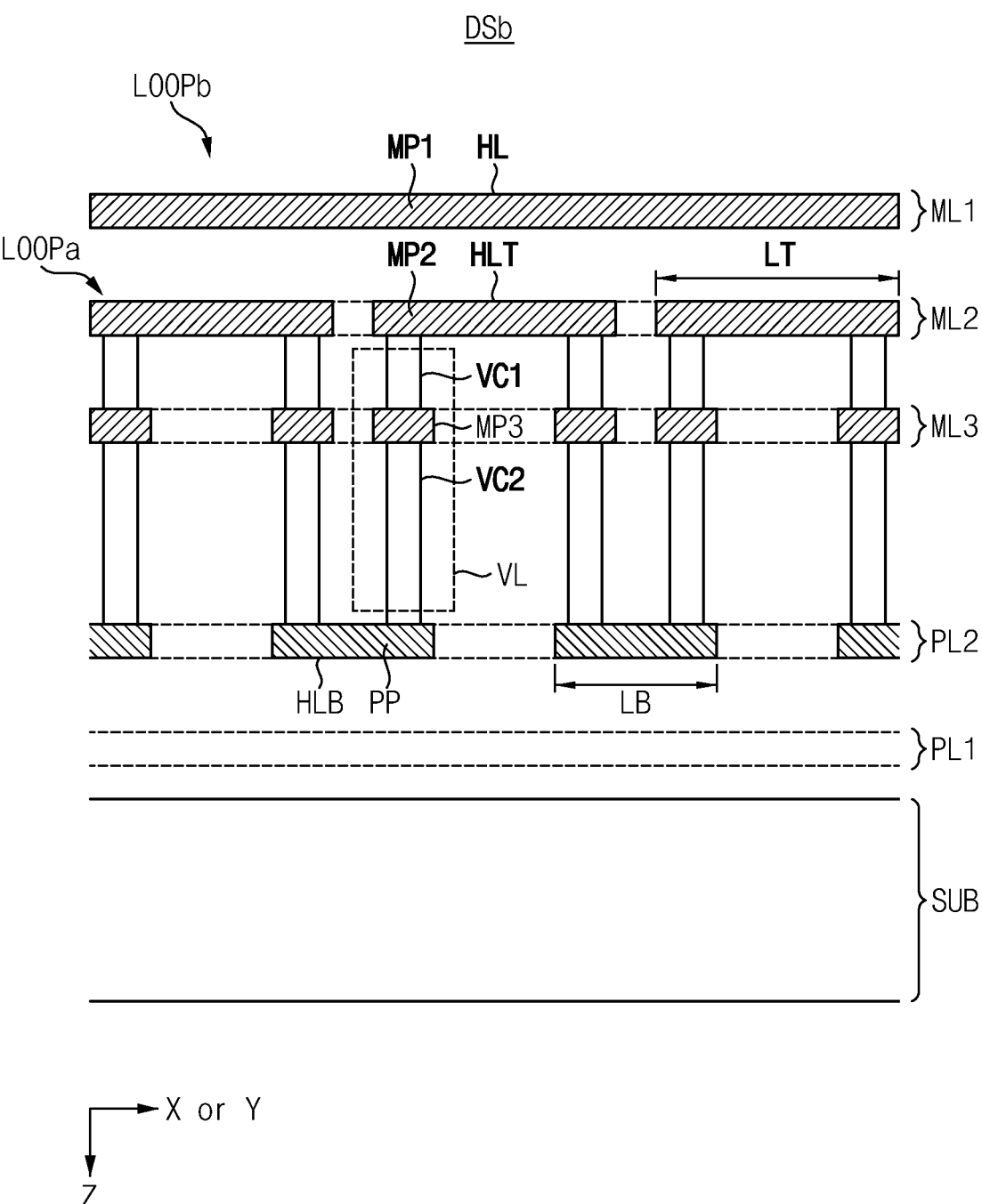
FIGS. 15 and 16 are cross-sectional diagrams illustrating a vertical structure of a 3D detection structure, according to example embodiments.
Figure 16:
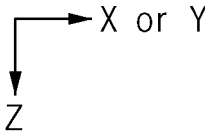

FIGS. 15 and 16 are cross-sectional diagrams illustrating a vertical structure of a 3D detection structure, according to example embodiments. Hereinafter, repeated descriptions of the 3D detection structures described with reference to FIGS. 10 through 14 may be omitted for the sake of brevity.

Referring to FIG. 15, the first conduction loop LOOPa may include a plurality of first top horizontal line segments HLT that may be formed in the second conduction layer ML2, a plurality of bottom horizontal line segments HLB that may be formed in the second conduction layer PL2, and a plurality of vertical line segments VL connecting the first top horizontal line segments HLT and the bottom horizontal line segments HLB respectively to form the first conduction loop LOOPa. The second conduction loop LOOPb may include a plurality of second top horizontal line segments HL that may be formed in the first metal layer ML1 over the second metal layer ML2.

In the embodiment of FIG. 15, the first metal layer ML1 may correspond to an uppermost metal layer from among the first to third metal layer ML1 to ML3 that are formed over the semiconductor substrate SUB, the second metal layer ML2 may be a metal layer under the uppermost first metal layer ML1, and the third conduction layer PL2 may correspond to the bit-line polysilicon layer that may be formed between the semiconductor substrate SUB and the first to third metal layers ML1 to ML3. The first top horizontal line segments HLT may include second metal line patterns MP2 that may be formed in the second metal layer ML2, and the bottom horizontal line segments HLB may include polysilicon line patterns PP that may be formed in the bit-line polysilicon layer PL2. The second top horizontal line segments HL may include first metal line patterns MP1 that may be formed in the first metal layer ML1.

Referring to FIG. 16, the first conduction loop LOOPa may include a plurality of first top horizontal line segments HLT that may be formed in the second conduction layer ML2, a plurality of bottom horizontal line segments HLB that may be formed in the second conduction layer PL1, and a plurality of vertical line segments VL connecting the first top horizontal line segments HLT and the bottom horizontal line segments HLB respectively to form the first conduction loop LOOPa. The second conduction loop LOOPb may include a plurality of second top horizontal line segments HL formed in the first metal layer ML1 over the second metal layer ML2.

As shown in FIG. 16, the first metal layer ML1 may correspond to an uppermost metal layer from among the first to third metal layers ML1 to ML3 that may be formed over the semiconductor substrate SUB, the second metal layer ML2 may be a metal layer under the uppermost first metal layer ML1, and the third metal layer ML3 may correspond to the gate polysilicon layer that may be formed between the semiconductor substrate SUB and the first to third metal layers ML1 to ML3. The first top horizontal line segments HLT may include second metal line patterns MP2 that may be formed in the second metal layer ML2, and the bottom horizontal line segments HLB may include polysilicon line patterns PP1 that may be formed in the gate polysilicon layer PL1. The second top horizontal line segments HL may include first metal line patterns MP1 that may be formed in the first metal layer ML1.

As described with reference to FIGS. 15 and 16, the 3D detection structure, according to example embodiments, may be expanded in the vertical direction Z to the various depths. Using the 3D detection structure, the opening located at various location may be detected more accurately, when compared to related semiconductor devices.

The 3D detection structure DSb of FIGS. 14, 15 and 16 may be applicable to the detection structure DS1 described with reference to FIG. 1B.

Figure 17:
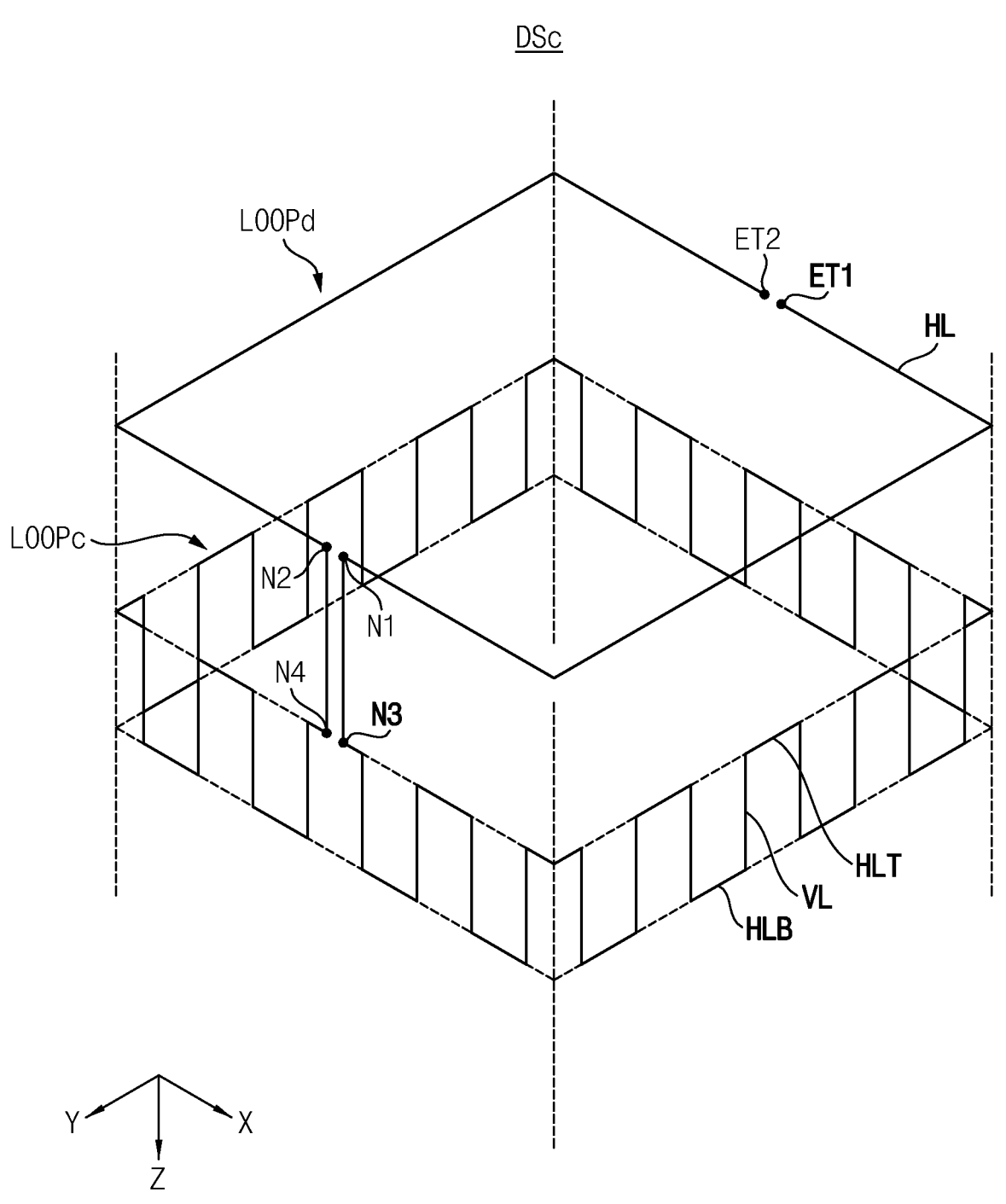
FIG. 17 is a perspective view of a 3D detection structure, according to example embodiments.

FIG. 17 is a perspective view of a 3D detection structure, according to example embodiments.

Referring to FIG. 17, a 3D detection structure DSc may include a first conduction loop LOOPc and a second conduction loop LOOPd. The semiconductor die may include a first conduction layer, a second conduction layer under the first conduction layer, and a third conduction layer under the second conduction layer. The conduction layers may include a metal layer in which metal line segments may be patterned and/or a polysilicon layer in which polysilicon line segments may be patterned. The first conduction loop LOOPc may be expanded in the vertical direction Z between the second conduction layer and the third conduction layer in a 3D shape. The second conduction loop LOOPd may be formed in the first conduction layer in a 2D shape.

The first conduction loop LOOPc may include a plurality of first top horizontal line segments HLT that may be formed in the second conduction layer, a plurality of bottom horizontal line segments HLB that may be formed in the third conduction layer, and a plurality of vertical line segments VL connecting the first top horizontal line segments HLT and the bottom horizontal line segments HLB respectively to form the first conduction loop LOOPc. The second conduction loop LOOPd may include a plurality of second top horizontal line segments HL that may be formed on the first conduction layer. The first top horizontal line segments HLT, the bottom horizontal line segments HLB, and the vertical line segments VL may be disposed alternatively along the first conduction loop LOOPc and connect a first end ET1 and a second end ET2 in an annular shape to at least partially surround the central region of the semiconductor die. As shown in FIG. 17, third node N3 and fourth node N4 of the first conduction loop LOOPc may be respectively connected to first node N1 and second node N2 of the second conduction loop LOOPd, such that the first and second conduction loops LOOPc and LOOPd may form a combined conduction loop.

In example embodiments, at least one of the first end ET1 and the second end ET2 may be connected to the probe 921 of the measuring circuit 920 and/or the first end ET1 and the second end ET2 may be sequentially connected to the probe 921 of the measuring circuit 920 through the switch 910. The clock signal CLK may be provided to the measuring circuit 920.

The description of the 3D detection structure DSc of FIG. 17 may be applicable to the detection structure DS1 described with reference to FIG. 1B.

Figure 18:
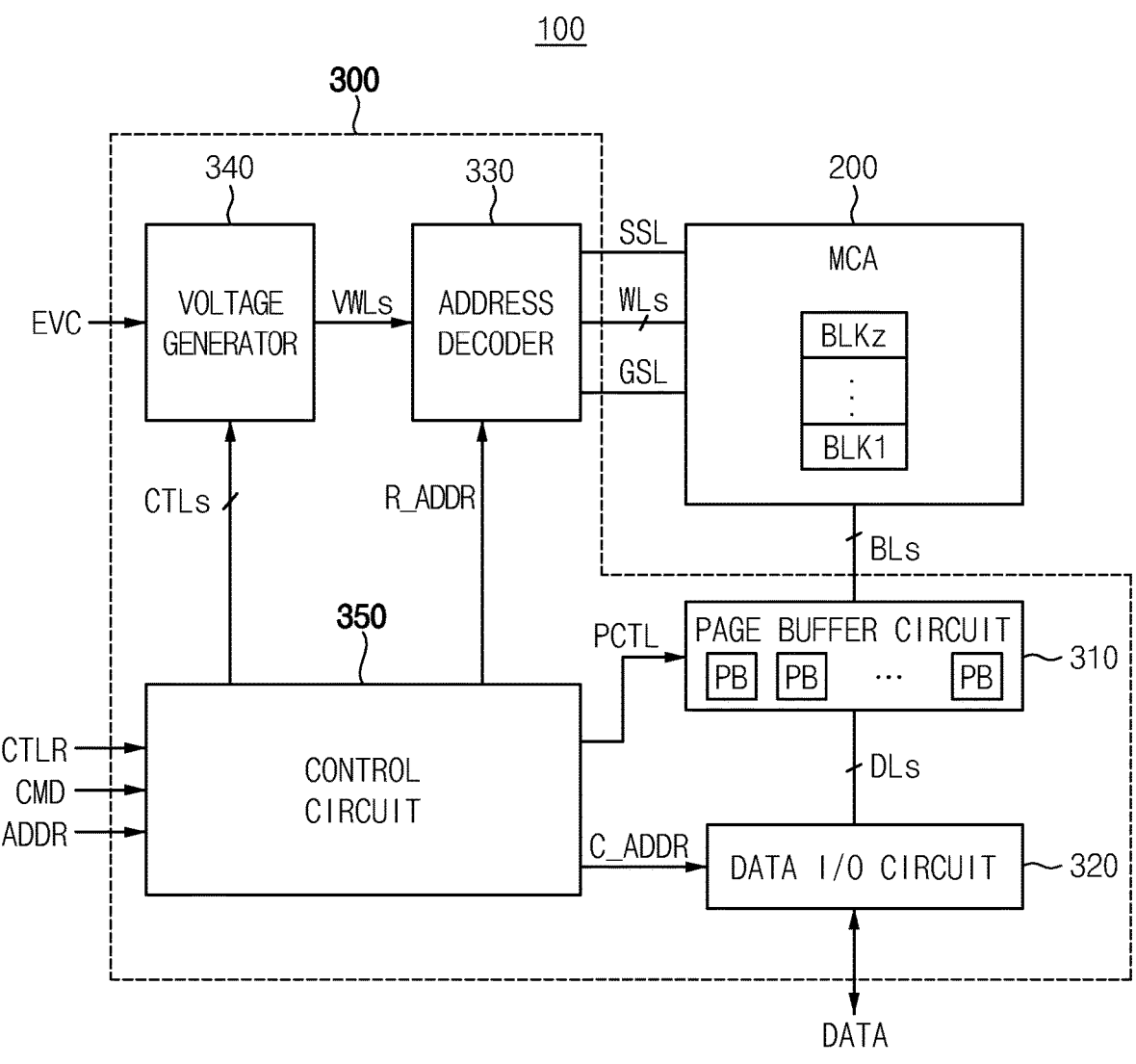
FIG. 18 is a block diagram illustrating a semiconductor device, according to example embodiments.

FIG. 18 is a block diagram illustrating a semiconductor device, according to example embodiments.

In some embodiments, the semiconductor device 100 described with reference to FIG. 18 may correspond to a non-volatile memory device. However, the present disclosure is not limited in this regard, and the semiconductor device 100 may be and/or may include other types of devices without departing from the scope of the present disclosure.

Referring to FIG. 18, a non-volatile memory device 100 may include a memory cell array 200 and a peripheral circuit 300. The peripheral circuit 300 may include a page buffer circuit 310, a data input/output (I/O) circuit 320, a control circuit 350, a voltage generator 340, and an address decoder 330.

The memory cell array 200 may be coupled to the address decoder 330 through a string selection line SSL, a plurality of word-lines WLs, and a ground selection line GSL.

The memory cell array 200 may be coupled to the page buffer circuit 310 through a plurality of bit-lines BLs. The memory cell array 200 may include a plurality of non-volatile memory cells coupled to the plurality of word-lines WLs and the plurality of bit-lines BLs.

The memory cell array 200 may include a plurality of memory blocks (e.g., first memory block BLK1 to z-th memory block BLKz, where z is a positive integer greater than or equal to two (2)). Each memory block of the plurality of memory blocks may have a 3D structure. The memory cell array 200 may include a plurality of (vertical) cell strings (e.g., NAND strings) and each of the cell strings may include a plurality of memory cells stacked with respect to each other.

The control circuit 350 may receive a command CMD, an address ADDR, and a control signal CTRL from an external memory controller and may control, for example, an erase loop, a program loop and a read operation of the semiconductor device 100. The program loop may include a program operation and a program verification operation and the erase loop may include an erase operation and an erase verification operation.

In example embodiments, the control circuit 350 may generate control signals CTLs, which may be used for controlling the voltage generator 340, based on the command CMD, may generate a page buffer control signal PCTL for controlling the page buffer circuit 310, and may generate a row address R_ADDR and a column address C_ADDR based on the address ADDR. The control circuit 350 may provide the row address R_ADDR to the address decoder 330, may provide the column address C_ADDR to the data I/O circuit 320, may provide the control signals CTLs to the voltage generator 340, and may provide the page buffer control signal PCTL to the page buffer circuit 310.

The address decoder 330 may be coupled to the memory cell array 200 through the string selection line SSL, the plurality of word-lines WLs, and the ground selection line GSL, During program operation or read operation, the address decoder 330 may determine one of the plurality of word-lines WLs as a selected word-line based on the row address R_ADDR and may determine the rest of the plurality of word-lines WLs except the selected word-line as unselected word-lines.

The voltage generator 340 may generate word-line voltages VWLs associated with operations of the non-volatile memory device 100 using an external voltage EVC that may be provided from the memory controller based on control signals CTLs from the control circuit 350. The word-line voltages VWLs may be applied to the plurality of word-lines WLs through the address decoder 330.

For example, during the erase operation, the voltage generator 340 may apply an erase voltage to a well of a selected memory block and may apply a ground voltage to all word-lines of the selected memory block. During the erase verification operation, the voltage generator 340 may apply an erase verification voltage to all word-lines of the selected memory block and/or may apply the erase verification voltage to the word-lines of the selected memory block on a word-line basis.

As another example, during the program operation, the voltage generator 340 may apply a program voltage to the selected word-line and may apply a program pass voltage to the unselected word-lines. As another example, during the program verification operation, the voltage generator 340 may apply a program verification voltage to the selected word-line and may apply a verification pass voltage to the unselected word-lines. As another example, during the read operation, the voltage generator 340 may apply a read voltage to the selected word-line and may apply a read pass voltage to the unselected word-lines.

The page buffer circuit 310 may be coupled to the memory cell array 200 through the plurality of bit-lines BLs. The page buffer circuit 310 may include a plurality of page buffers PB. The page buffer circuit 310 may temporarily store data to be programmed in a selected page and/or data read out from the selected page of the memory cell array 200.

In example embodiments, page buffer units included in each of the plurality of page buffers PB (and cache latches included in each of the plurality of page buffers PB) may be spaced apart from each other, and may have separate structures. Accordingly, the degree of freedom of wirings on the page buffer units may be increased, and the complexity of a layout may be reduced. In addition, because the cache latches are adjacent to data I/O lines, the distance between the cache latches and the data I/O lines may be reduced, and thus, data I/O speed may be increased.

The data I/O circuit 320 may be coupled to the page buffer circuit 310 through a plurality of data lines DLs. During the program operation, the data I/O circuit 320 may receive program data DATA from the memory controller and may provide the program data DATA to the page buffer circuit 310 based on the column address C_ADDR received from the control circuit 450. During the read operation, the data I/O circuit 320 may provide read data DATA to the memory controller based on the column address C_ADDR received from the control circuit 350.

Figure 19:
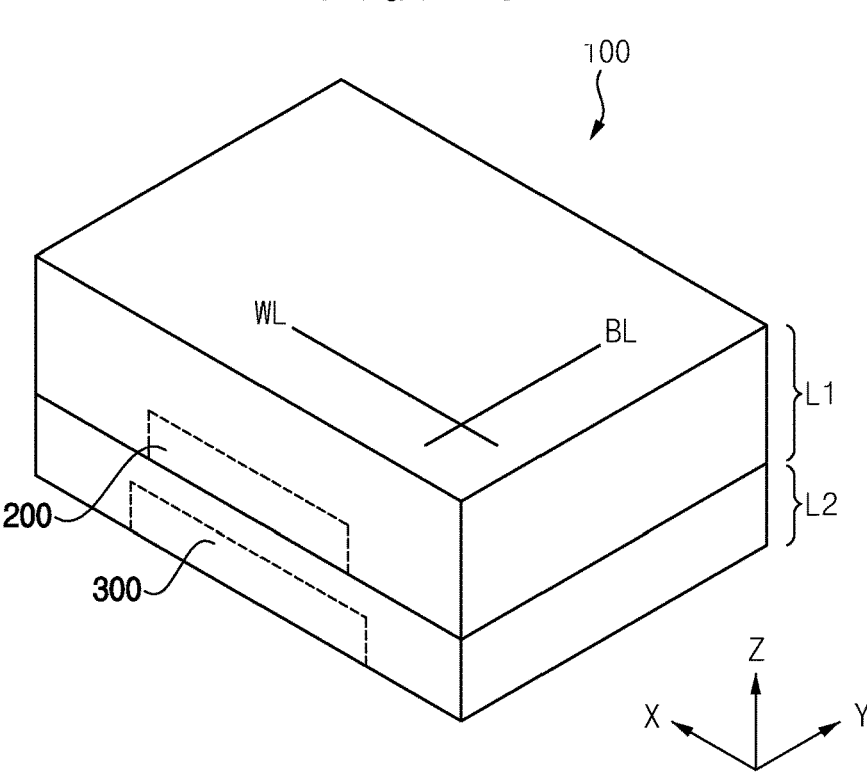
FIG. 19 schematically illustrates a structure of the non-volatile memory device of FIG. 18, according to example embodiments.

FIG. 19 schematically illustrates a structure of the non-volatile memory device of FIG. 18, according to example embodiments.

Referring to FIG. 19, the non-volatile memory device 100 may include a first semiconductor layer L1 and a second semiconductor layer L2. The first semiconductor layer L1 may be stacked in a vertical direction Z with respect to the second semiconductor layer L2. The second semiconductor layer L2 may be disposed under the first semiconductor layer L1 in the vertical direction Z, and accordingly, the second semiconductor layer L2 may be close to a substrate. For example, among the first semiconductor layer L1 and the second semiconductor layer L2, the second semiconductor layer L2 may be disposed closer to a substrate.

In example embodiments, the memory cell array 200 in FIG. 18 may be formed (or provided) on the first semiconductor layer L1, and the peripheral circuit 300 in FIG. 18 may be formed (or provided) on the second semiconductor layer L2.

Accordingly, the non-volatile memory device 100 may have a structure in which the memory cell array 200 is disposed on the peripheral circuit 300. That is, the non-volatile memory device 100 may have a cell over periphery (COP) structure. The COP structure may effectively reduce an area in a horizontal direction and increase the degree of integration of the non-volatile memory device 100, when compared to related semiconductor devices.

In example embodiments, the second semiconductor layer L2 may include a substrate, and by forming transistors on the substrate and metal patterns for wiring transistors, the peripheral circuit 300 may be formed in the second semiconductor layer L2. After the peripheral circuit 300 is formed on the second semiconductor layer L2, the first semiconductor layer L1 including the memory cell array 200 may be formed, and the metal patterns for connecting the word-lines WL and the bit-lines BL of the memory cell array 200 to the peripheral circuit 300 formed in the second semiconductor layer L2 may be formed. For example, the word-lines WL may extend in a first direction X and the bit-lines BL may extend in a second direction Y.

Figure 20:
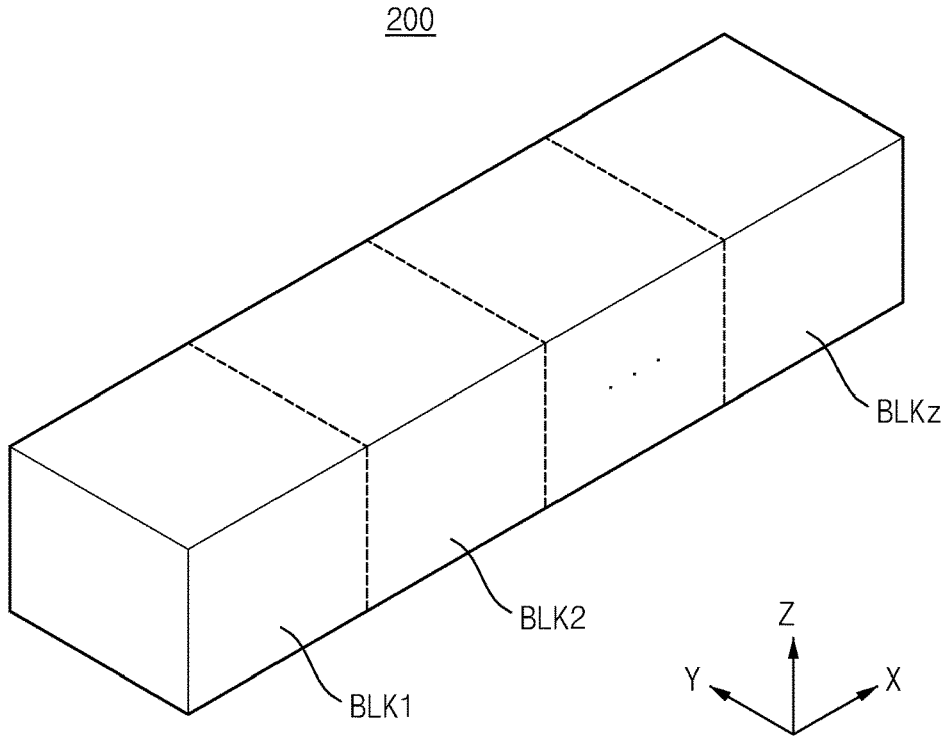
FIG. 20 is a block diagram illustrating an example of the memory cell array in FIG. 18, according to example embodiments.

FIG. 20 is a block diagram illustrating an example of the memory cell array in FIG. 18, according to example embodiments.

Referring to FIG. 20, the memory cell array 200 may include a plurality of memory blocks (e.g., first memory block BLK1 to z-th memory block BLKz) which may extend along a plurality of directions including a first direction X, a second direction Y, and a vertical direction. In an embodiment, the plurality of memory blocks BLK1 to BLKz may be selected by the address decoder 330 in FIG. 18. For example, the address decoder 330 may select a memory block BLK corresponding to a block address from among the plurality of memory blocks BLK1 to BLKz.

Figure 21:
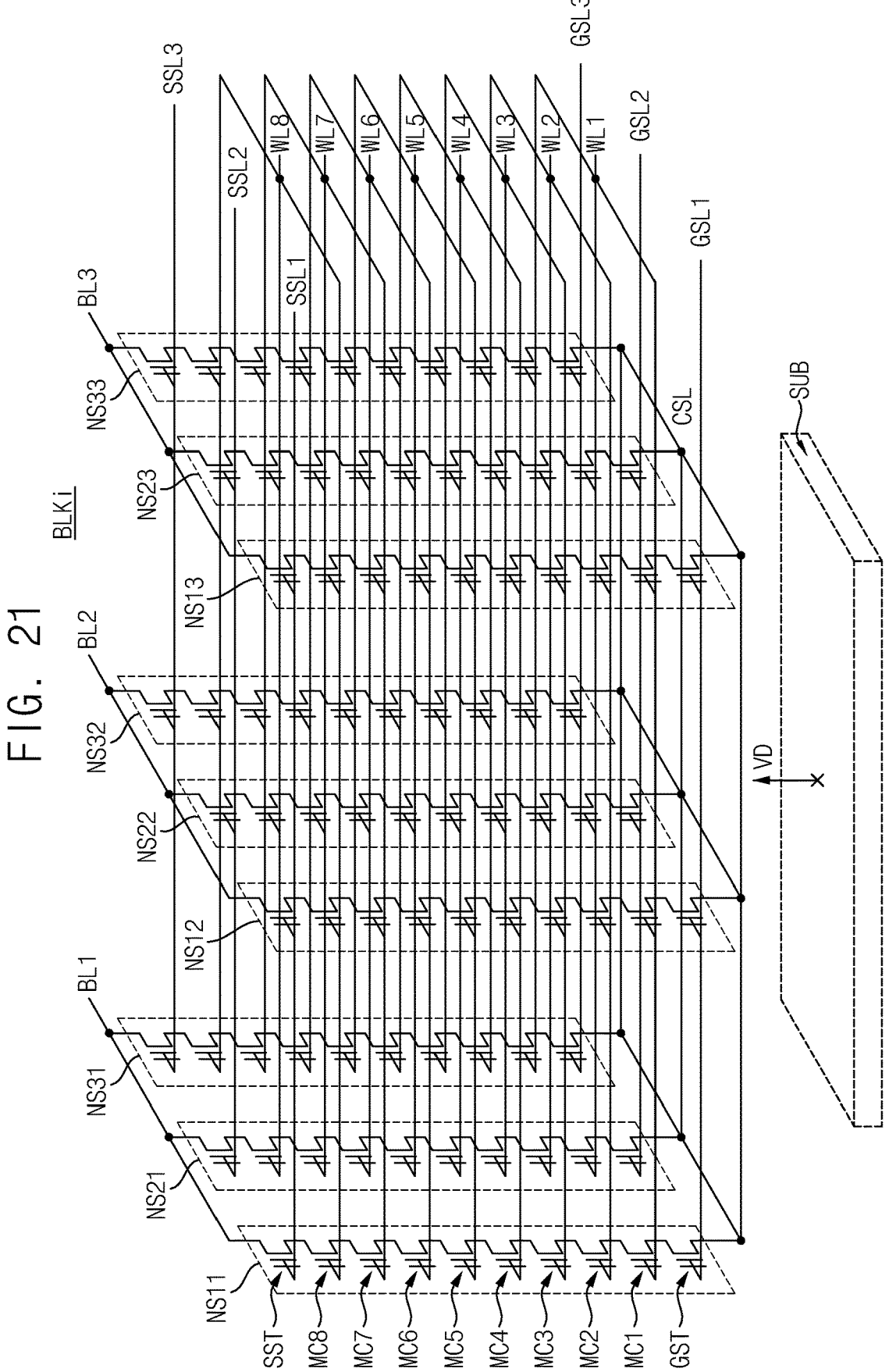
FIG. 21 is a circuit diagram illustrating one of the memory blocks of FIG. 20, according to example embodiments.

FIG. 21 is a circuit diagram illustrating one of the memory blocks of FIG. 20, according to example embodiments.

The memory block BLKi of FIG. 21 may be formed on a substrate SUB in a 3D structure (or a vertical structure). For example, a plurality of memory cell strings included in the memory block BLKi may be formed in the vertical direction VD substantially perpendicular to the substrate SUB. The memory block BLKi may correspond to any one of the memory blocks of the plurality of memory blocks BLK1 to BLKz.

Referring to FIG. 21, the memory block BLKi may include cell strings (or NAND strings) NS11 to NS33 coupled between bit-lines BL1, BL2 and BL3 and a common source line CSL. Each of the cell strings NS11 to NS33 may include a string selection transistor SST, a plurality of memory cells MC1 to MC8, and a ground selection transistor GST. As shown in FIG. 21, each of the cell strings NS11 to NS33 is illustrated to include eight memory cells MC1 to MC8. However, embodiments of the present disclosure are not limited thereto. For example, in some example embodiments, each of the cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having a substantially similar and/or the same height may be commonly connected, and the ground selection lines GSL1 to GSL3 and the string selection lines SSL1 to SSL3 may be separated.

Figure 22:
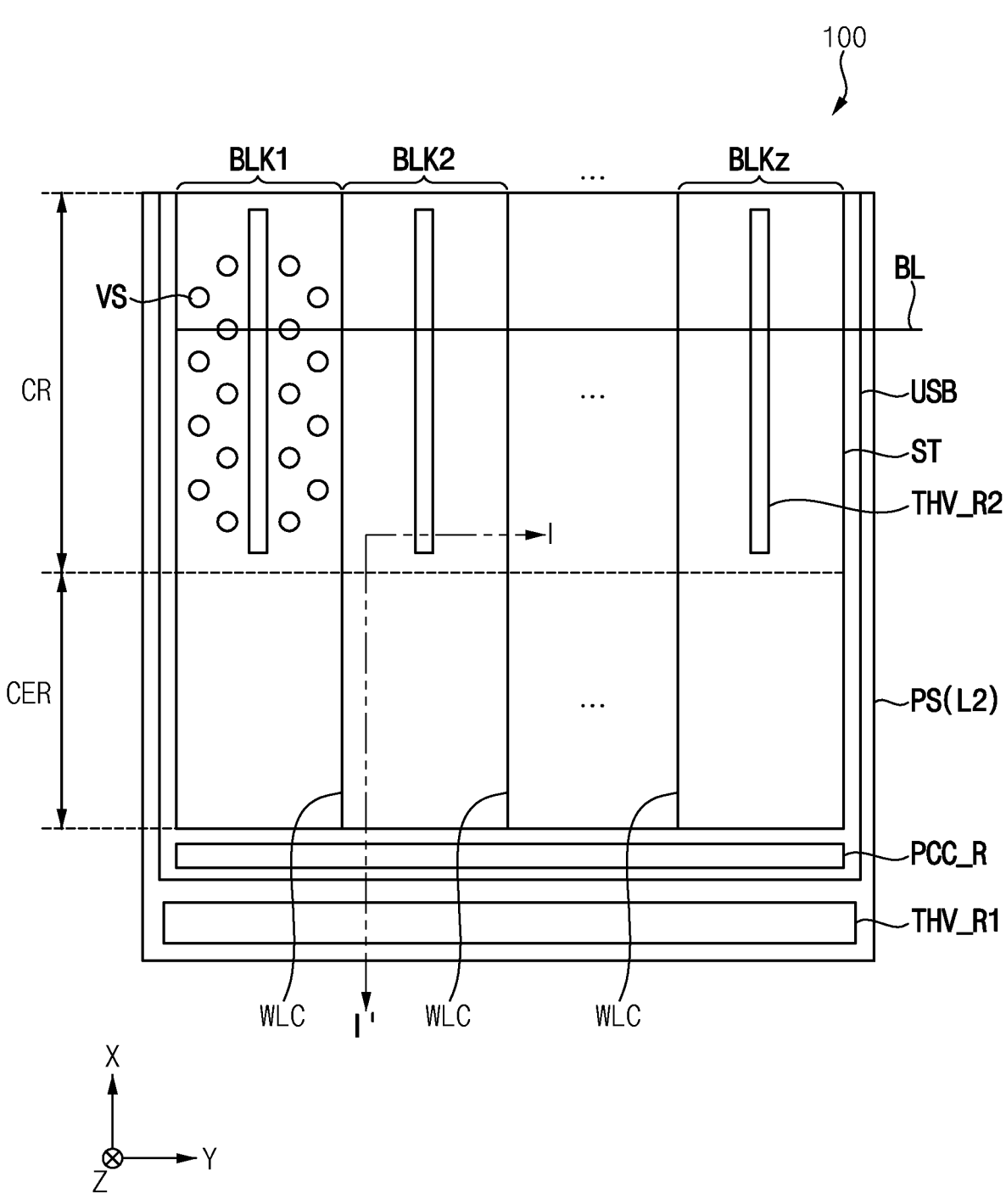
FIG. 22 is a layout diagram of a non-volatile memory device, according to example embodiments.
Figure 23:
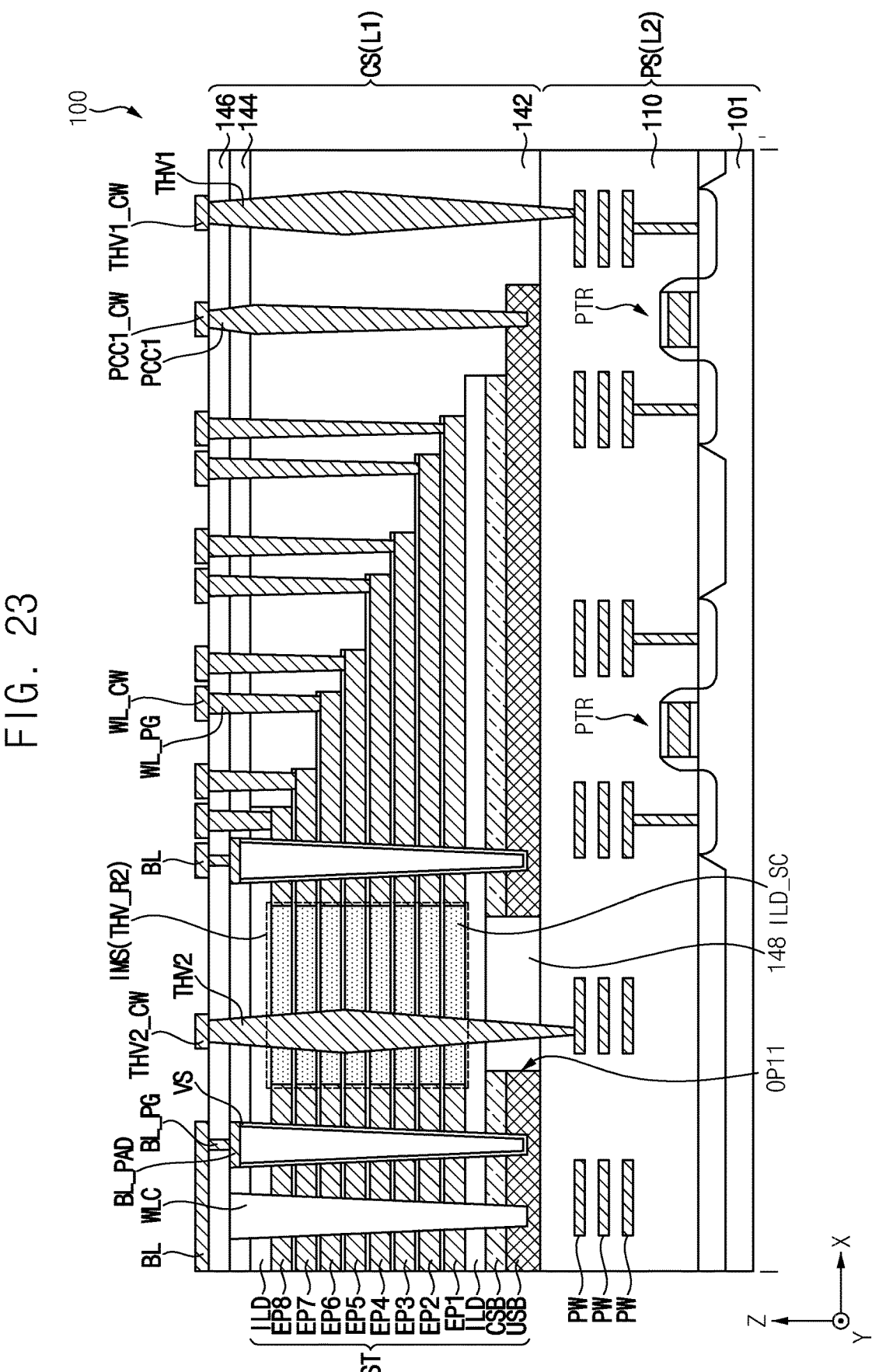
FIG. 23 is a cross-sectional view taken along a line I-I' of FIG. 22, according to example embodiments.

FIG. 22 is a layout diagram of a non-volatile memory device, according to example embodiments. FIG. 23 is a cross-sectional view taken along a line I-I' of FIG. 22, according to example embodiments.

Referring to FIG. 22, the non-volatile memory device 100 may include a peripheral logic structure PS, a horizontal conductive substrate USB, and an electrode structure ST. The peripheral logic structure PS may correspond to the second semiconductor layer L2 in FIG. 19 and the stacked structure ST may correspond to the first semiconductor layer L1 in FIG. 19. The stacked structure ST may include a cell array region CR and a cell extension region CER.

A memory cell array (e.g., the memory cell array 200 in FIG. 18) including a plurality of memory cells may be formed in the cell array region CR. In an example embodiment, a vertical structure VS and a bit-line BL may be formed in the cell array region CR.

The cell extension region CER may be around the cell array region CR. In an example embodiment, the cell array region CR and the cell extension region CER may extend along a direction in which a word-line cut region WLC extends. In example embodiment, the cell array region CR and the cell extension region CER may extend along the first direction X. A plurality of electrode pads EP1 to EP8 may be stacked stepwise in the cell extension region CER.

The electrode structure ST may include memory blocks (e.g., memory blocks BLK1 to BLKz) separated by the word-line cut region WLC.

In an example embodiment, the cell extension region CER may be on one side of the cell array region CR, as shown in FIG. 22. In an example embodiment, the cell extension region CER may be disposed on both sides of the cell array region CR with the cell array region CR interposed therebetween.

In an example embodiment, a single electrode structure ST may be on the peripheral logic structure PS. In an example embodiment, two or more electrode structures ST may be on the peripheral logic structure PS.

A first penetration electrode region THV_R1 may be delineated by a peripheral logic structure PS that may not overlap a horizontal conductive substrate USB in the vertical direction Z. The first penetration electrode region THV_R1 may extend in the second direction Y.

A second penetration electrode region THV_R2 may be delineated by the electrode structure ST. In an example embodiment, the second penetration electrode region THV_R2 may be referred to as a region extending in the first direction X. In an example embodiment, the second penetration electrode region THV_R2 may be designated only in the cell array region CR and not defined in the cell extension region CER. In an example embodiment, the second penetration electrode region THV_R2 may be defined in all the memory blocks BLK1 to BLKz.

A plate contact plug region PCC_R may be defined on the horizontal conductive substrate USB that may not overlap the electrode structure ST. The plate contact plug region PCC_R may extend along the second direction Y. The plate contact plug region PCC_R may be defined to be closer to the electrode structure ST than the first penetration electrode region THV_R1.

The first penetration electrode region THV_R1 and the second penetration electrode region THV_R2 may be regions in which the penetration electrodes (e.g., first through-electrode THV1 and second through-electrode THV2 of FIG. 23) are disposed. The plate contact plug region PCC_R may be a region in which the plate contact plug (e.g., first plate contact plug PCC1 of FIG. 23) is disposed. The first and second penetration electrode regions THV_R1 and THV_R2 may be further described with reference to FIG. 23.

Referring to FIGS. 22 and 23, the non-volatile memory device 100 may include a peripheral logic structure PS and a cell array structure CS.

The peripheral logic structure PS may include a pass transistor PTR, a lower connection wiring body PW, and a peripheral logic insulation film 110. The pass transistor PTR may be on a substrate 101. The pass transistor PTR may be included in the page buffer circuit 310 in FIG. 18 or may be included in the address decoder 330 in FIG. 18.

The substrate 101 may be and/or may include bulk silicon and/or silicon-on-insulator (SOI). In an example embodiment, the substrate 101 may be and/or may include a silicon substrate and/or may include another material. The peripheral logic insulation film 110 may be formed on the substrate 101. The peripheral logic insulation film 110 may include, but not be limited to, silicon oxide (SiO), silicon nitride (SiN), silicon oxynitride (SiON), and/or a low dielectric constant material.

The lower connection wiring body PW may be in the peripheral logic insulation film 110. The lower connection wiring body PW may be connected to the pass transistor PTR.

The cell array structure CS may include a horizontal conductive substrate USB on the peripheral logic structure PS, and an electrode structure ST on the horizontal conductive substrate USB.

The horizontal conductive substrate USB may be on the peripheral logic structure PS. The horizontal conductive substrate USB may include a first opening OP11. The first opening OP11 may expose and/or be open to a part of the peripheral logic structure PS.

The horizontal conductive substrate USB may be a common source plate. In an example embodiment, the horizontal conductive substrate USB may serve as the common source line CSL of FIG. 21. The horizontal conductive substrate USB may include, but not be limited to, a conductive semiconductor film, a metal silicide film, and/or a metal film.

In an example embodiment, the horizontal conductive substrate USB may be formed as a plurality of layers or a single layer.

A filling insulation film 148 may be on the peripheral logic structure PS. The filling insulation film 148 may fill the first opening OP1. The electrode structure ST may be on the horizontal conductive substrate USB. The electrode structure ST may cover a part of the horizontal conductive substrate USB. In an example embodiment, the horizontal conductive substrate USB may include a first region that may at least partially overlap the electrode structure ST in the vertical direction Z, and a second region that may not overlap the electrode structure ST in the vertical direction Z. The second region of the horizontal conductive substrate USB may include the plate contact plug region PCC_R in FIG. 22.

The electrode structure ST may include a plurality of electrode pads (e.g., first electrode pad EP1, second electrode pad EP2, third electrode pad EP3, fourth electrode pad EP4, fifth electrode pad EP5, sixth electrode pad EP6, seventh electrode pad EP7, and eighth electrode pad EP8) stacked in the vertical direction Z. The electrode structure ST may include an inter-electrode insulation film ILD between the plurality of electrode pads EP1 to EP8.

The electrode structure ST may include an insulating mold part IMS. The insulating mold part IMS may at least partially overlap the first opening OP1 of the horizontal conductive substrate USB in the vertical direction Z. The insulating mold part IMS may include the second penetration electrode region THV_R2 in FIG. 22. The insulating mold part IMS may include an inter-electrode insulation film ILD and a sacrificial mold insulation film ILD_SC having an etching selection ratio. The inter-electrode insulation film ILD and the sacrificial mold insulation film ILD_SC may be alternately stacked. For example, the inter-electrode insulation film ILD may include silicon oxide (SiO), and the sacrificial mold insulation film ILD_SC may include silicon nitride (SiN).

The word-line cut region WLC may be disposed in the electrode structure ST. The word-line cut region WLC may extend in the first direction X. Each word-line cut region WLC may be spaced apart from each other in the second direction Y. Each word-line cut region WLC may completely cut the electrode structure ST. The electrode structure ST cut by the two adjacent word-line cut region WLC may form one of the memory blocks BLK1 to BLKz.

A plurality of vertical structures VS may be on the horizontal conductive substrate USB. The plurality of vertical structures VS may at least partially penetrate the electrode structure ST. The plurality of vertical structures VS may be electrically connected to the horizontal conductive substrate USB. The vertical structures VS may include side wall parts that may extend in the vertical direction Z, and a bottom part that may connect the side wall parts of the vertical structure VS. The side wall parts of the vertical structures VS may have a pipe shape having a hollow space inside (e.g., a cylindrical shape or a macaroni shape).

A first interlayer insulation film 142 may be on the peripheral logic structure PS. The first interlayer insulation film 142 may at least partially cover the electrode structure ST and the horizontal conductive substrate USB. A second interlayer insulation film 144 and a third interlayer insulation film 146 may be sequentially formed on the first interlayer insulation film 142. A part of the word-line cut region WLC may extend to the second interlayer insulation film 144.

The bit-lines BL may be on the stacked structure ST. The bit-lines BL may extend in the second direction Y. The bit lines BL may be electrically connected to at least one of the plurality of vertical structures VS.

The bit-lines BL may be on a third interlayer insulation film 146. The bit-lines BL may be electrically connected to the vertical structures VS via a bit-line pad BL_PAD and a bit-line plug BL_PG. The bit-lines BL, the bit-line pad BL_PAD, and the bit-line plug BL PG may each include a conductive material.

A plurality of electrode plugs WL_PG may be in the first to third interlayer insulation films (e.g., first interlayer insulation film 142, second interlayer insulation film 144, and third interlayer insulation film 146). The plurality of electrode plugs WL_PG may be in the cell extension region CER.

Each electrode plug WL_PG may be electrically connected to the respective electrode pads EP1 to EP8. The respective electrode plugs WL_PG may connect the respective electrode pads EP1 to EP8 and a word line connection wiring WL_CW.

A first penetration electrode THV1 may be in the first penetration electrode region THV_R1. The first penetration electrode THV1 may extend in the vertical direction Z. The first penetration electrode THV1 may be in the first to third interlayer insulation films 142 to 146 and the peripheral logic insulation film 110. The first penetration electrode THV1 may not completely penetrate the electrode structure ST. The first penetration electrode THV1 may be connected to a lower connection wiring body PW and a first penetration electrode connection wiring THV1_CW.

A first plate contact plug PCC1 may be in a plate contact plug region PCC_R. The first plate contact plug PCC1 may extend in the vertical direction Z. The first plate contact plug PCC1 may be in the first to third interlayer insulation films 142 to 146. The first plate contact plug PCC1 may not completely penetrate the stacked structure ST.

The first plate contact plug PCC1 may be connected to the horizontal conductive substrate USB. The first plate contact plug PCC1 may be electrically connected to the horizontal conductive substrate USB in the second region of the horizontal conductive substrate USB. The first plate contact plug PCC1 may be connected to the first plate contact connection wiring PCC1_CW. A part of the first plate contact plug PCC1 may be in the horizontal conductive substrate USB.

A second penetration electrode THV2 may be in the second penetration electrode region THV_R2. The second penetration electrode THV2 may extend in the vertical direction Z. The second penetration electrode THV2 may be in the insulating mold part IMS, the filling insulation film 148, and the peripheral logic insulation film 110. The second penetration electrode THV2 may at least partially penetrate the stacked structure ST (e.g., the insulating mold part IMS). The second penetration electrode THV2 may be in the cell array region CR. The second penetration electrode THV2 may pass through the first opening OP1. The second penetration electrode THV2 may be connected to the lower connection wiring body PW and the second penetration electrode connection wiring THV2_CW.

Figure 24:
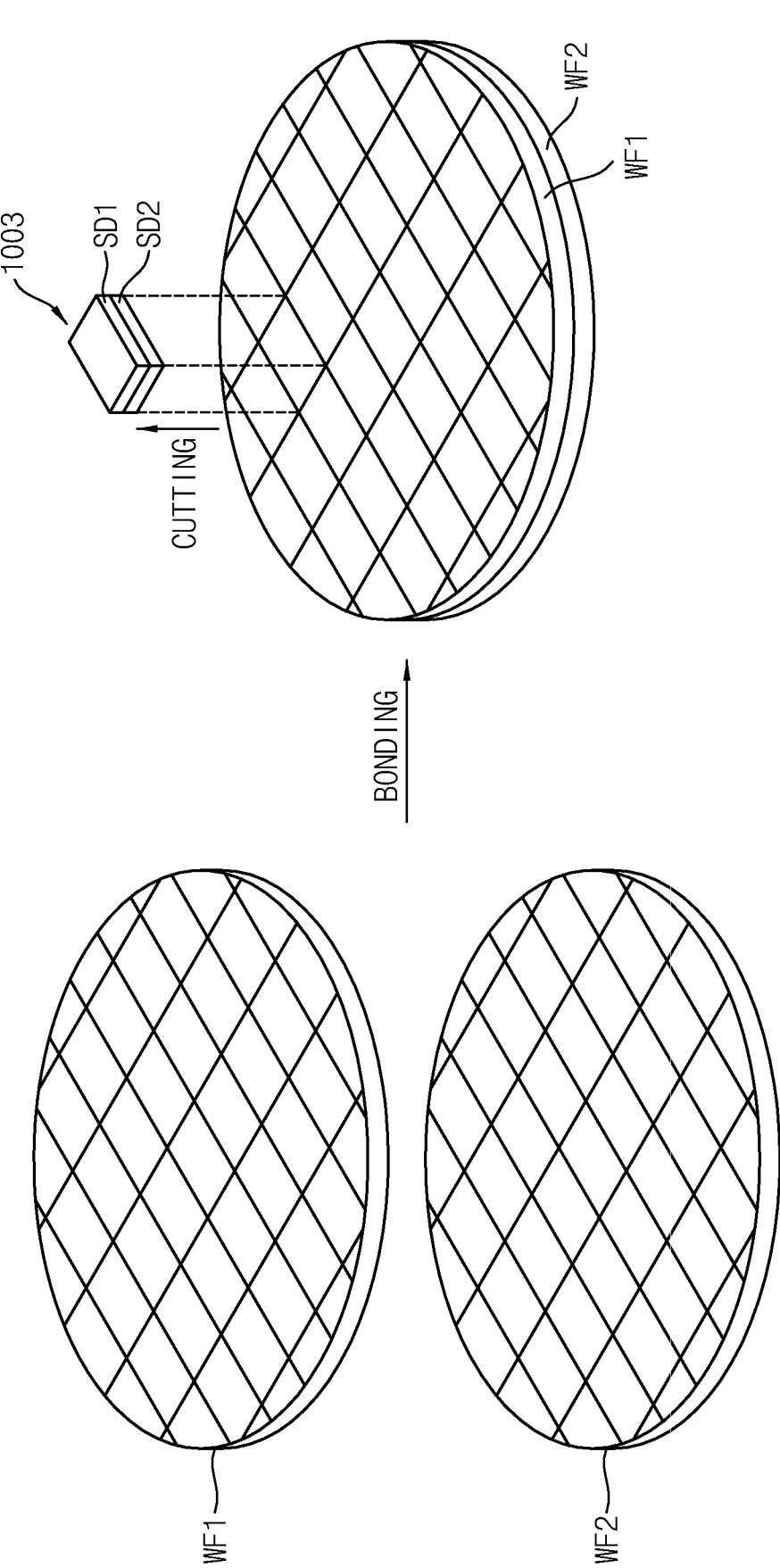
FIG. 24 is a diagram for describing manufacturing processes of a stacked semiconductor device, according to example embodiments.

FIG. 24 is a diagram for describing manufacturing processes of a stacked semiconductor device, according to example embodiments.

Referring to FIG. 24, respective integrated circuits may be formed in a first wafer WF1 and a second wafer WF2. The same circuits may be integrated in the first wafer WF1 and the second wafer WF2 and/or different circuits may be integrated in the first wafer WF1 and the second wafer WF2. For example, a memory cell array may be formed in the first wafer WF1 and other circuits may be formed in the second wafer WF2. Even though FIG. 24 illustrates the vertical stacking of the two wafers WF1 and WF2 (e.g., first wafer WF1 is stacked on second wafer WF2), three or more wafers may be stacked vertically.

After the integrated circuits are formed in the first and second wafers WF1 and WF2, the first wafer WF1 and the second wafer WF2 may be bonded. The bonded first and second wafers WF1 and WF2 may be cut and divided into a plurality of chips, where each chip corresponds to a semiconductor device 1003 including a first semiconductor die SD1 and a second semiconductor die SD2 that are stacked vertically (e.g., the first semiconductor die SD1 is stacked on the second semiconductor die SD2). Each cut portion of the first wafer WF1 may correspond to the first semiconductor die SD1 and each cut portion of the second wafer WF2 may correspond to the second semiconductor die SD2.

According to example embodiments, the semiconductor device 1003 may include first and second semiconductor dies SD1 and SD2 that may be stacked in the vertical direction. Each of the first and second semiconductor dies SD1 and SD2 may include a central region and an external region at least partially surrounding the central region. A semiconductor integrated circuit may be formed in the central region of the first semiconductor die SD1. A 3D detection structure may be formed in the external region of the first semiconductor die SD1 and the second semiconductor die SD2. In some example embodiments, the 3D detection structure may include a single conduction loop, and/or may include two conduction loops as described above.

Figure 25:
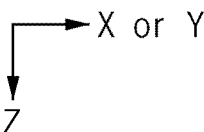
FIGS. 25 and 26 are cross-sectional diagrams illustrating a vertical structure of a 3D detection structure, according to example embodiments.
Figure 26:
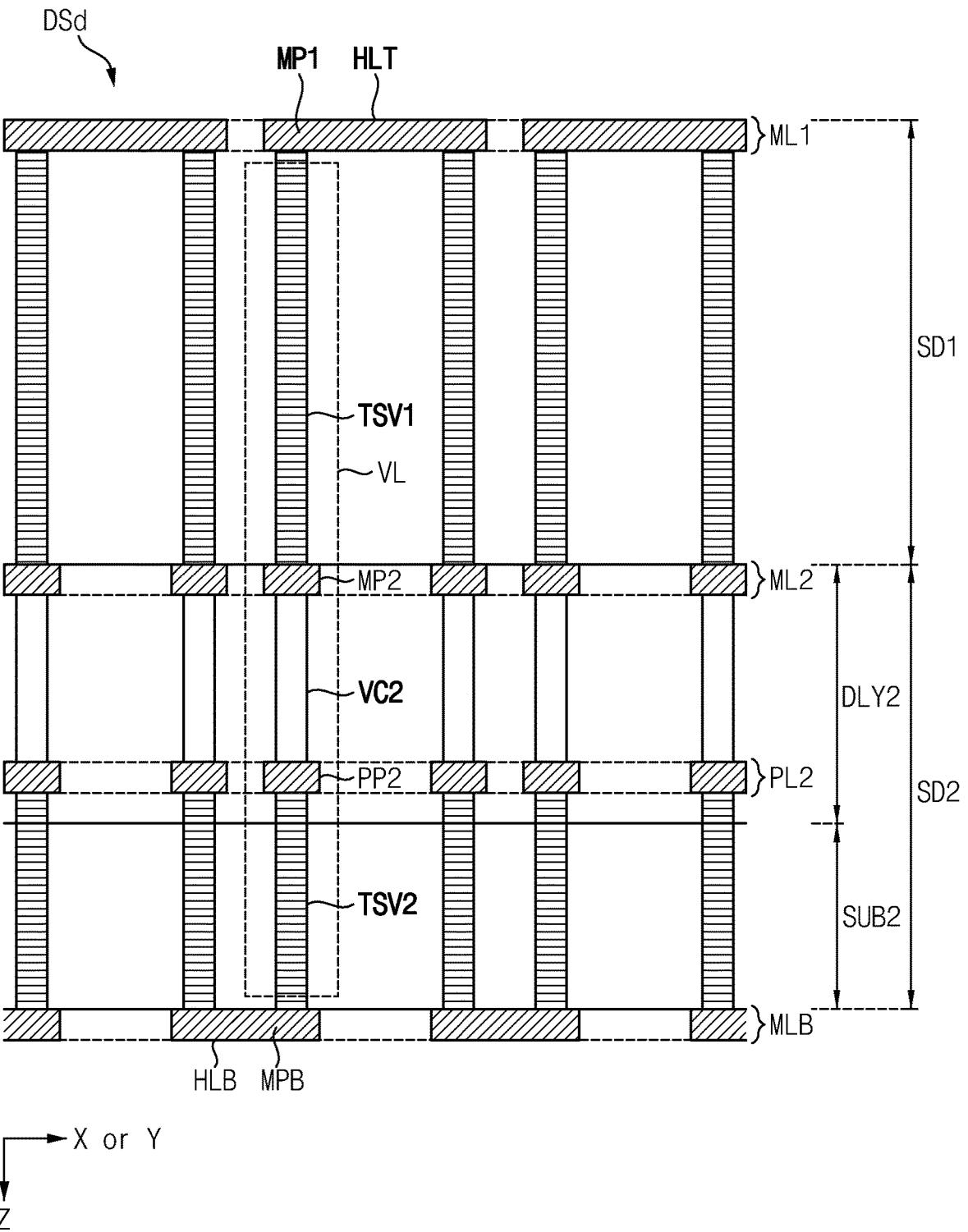

FIGS. 25 and 26 are cross-sectional diagrams illustrating a vertical structure of a 3D detection structure, according to example embodiments.

Referring to FIG. 25, a 3D detection structure DSd may be formed in a first semiconductor die SD1 and a second semiconductor die SD2. A memory cell structure may be formed in the first semiconductor die SD1 and a peripheral circuit may be formed in the second semiconductor die SD2. The second semiconductor die SD2 may include a semiconductor substrate SUB2 and a dielectric layer DLY2 in which upper structures of the second semiconductor substrate SUB2 may be formed. The first and second semiconductor dies SD1 and SD2 may include a plurality of conduction layers. For example, the first semiconductor die SD1 may include a first metal layer ML1, and the dielectric layer DLY2 may include a second metal layer ML2 and a second polysilicon layer PL2. The first and second metal layers ML1 and ML2 may be the uppermost metal layers in the respective semiconductor dies SD1 and SD2. The second polysilicon layer PL2 may include a gate polysilicon layer in which gates of transistors in the semiconductor integrated circuits may be formed.

The 3D detection structure DSd may include a plurality of top horizontal line segments HLT formed in the first conduction layer ML1 of the first semiconductor die SD1 (e.g., the uppermost semiconductor die in the stacked structure), a plurality of bottom horizontal line segments HLB formed in the second conduction layer PL2 of the second semiconductor die SD2 (e.g., the lowest semiconductor die in the stacked structure) and a plurality of vertical line segments VL connecting the top horizontal line segments HLT and the bottom horizontal line segments HLB respectively to form the 3D detection structure DSd.

In the embodiment of FIG. 25, the first conduction layer ML1 may correspond to an uppermost metal layer from among the metal layers of the first semiconductor die SD1, and the second conduction layer PL2 may correspond to the polysilicon layer of the second semiconductor die SD2. The top horizontal line segments HLT may include first metal line patterns MP1 formed in the metal layer ML1 of the first semiconductor die SD1, and the bottom horizontal line segments HLB may include polysilicon line patterns PP2 formed in the polysilicon layer PL2 of the second semiconductor die SD2.

The vertical line segments VL may include first vertical contacts VC1, through-substrate vias TSV, and second vertical contacts VC2 to connect the metal line patterns MP1 in the first metal layer ML1 and the polysilicon line patterns PP in the polysilicon layer PL2. As shown in FIG. 25, the vertical contacts may include the through-substrate vias TSV at least partially penetrating the first semiconductor die SD1. The vertical line segments VL may further include second conduction line patterns MP2 formed in the intermediate second metal layers ML2.

Referring to FIG. 26, a 3D detection structure DSd may include a plurality of top horizontal line segments HLT that may be formed in the first conduction layer ML1 of the first semiconductor die SD1 (e.g., the uppermost semiconductor die in the stacked structure), a plurality of bottom horizontal line segments HLB that may be formed in the second conduction layer MLB of the second semiconductor die SD2 (e.g., the lowest semiconductor die in the stacked structure), and a plurality of vertical line segments VL connecting the top horizontal line segments HLT and the bottom horizontal line segments HLB respectively to form the 3D detection structure DSd.

In the embodiment of FIG. 26, the first conduction layer ML1 may correspond to an uppermost metal layer from among the metal layers of the first semiconductor die SD1, and the second conduction layer PL2 may correspond to the metal layer on the bottom surface of the second semiconductor die SD2. The top horizontal line segments HLT may include metal line patterns MP1 that may be formed in the metal layer ML1 of the first semiconductor die SD1, and the bottom horizontal line segments HLB may include bottom metal line patterns MPB formed in the bottom metal layer MLB on the bottom surface of the second semiconductor die SD2.

Figure 30:
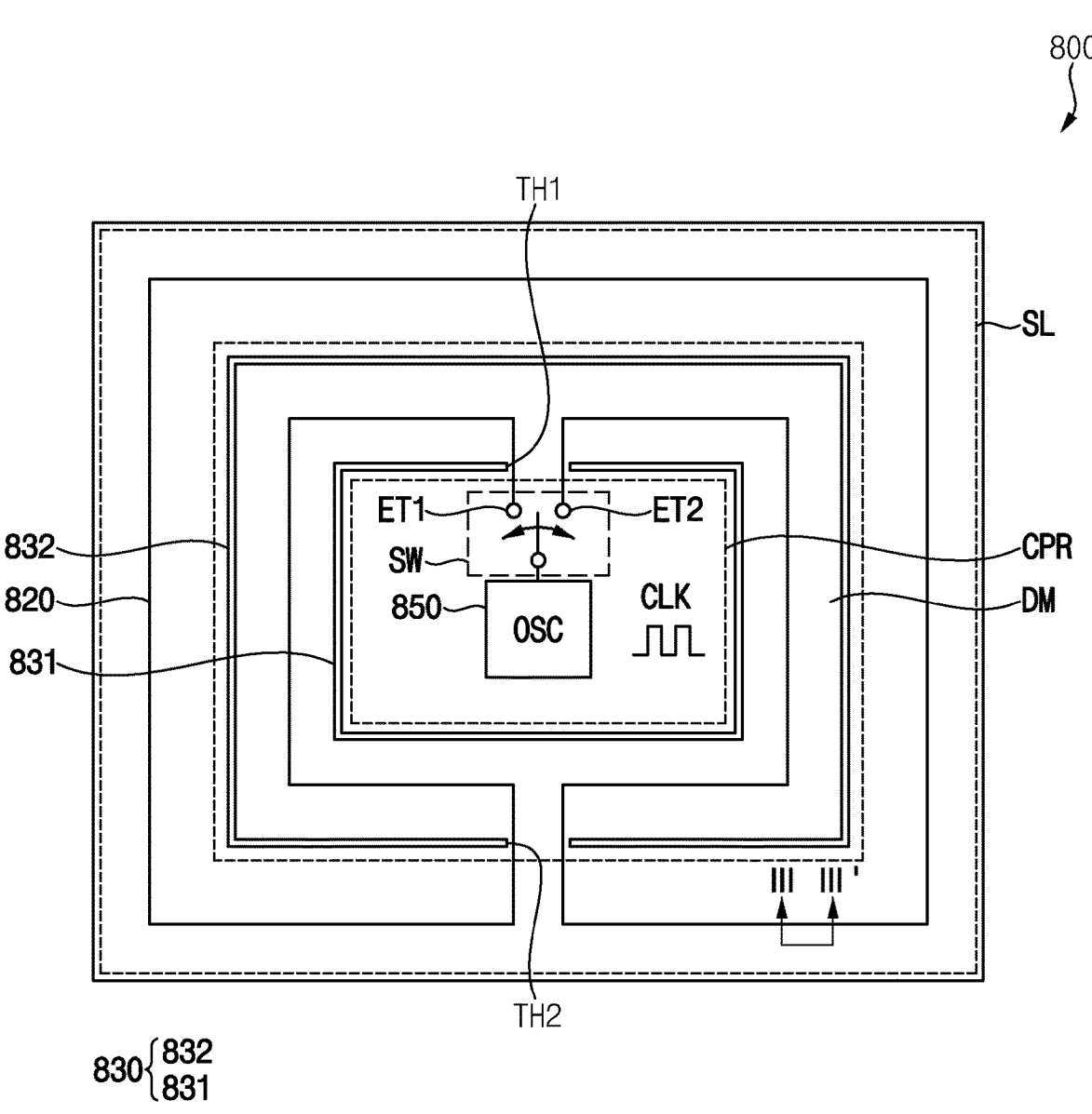
FIG. 30 is a plan view illustrating a semiconductor device, according to example embodiments.

The vertical line segments VL may include vertical contacts first through-substrate vias TSV1, second vertical contact VC2 and second through-substrate vias TSV2 to connect the first metal line patterns MP1 in the first metal layer ML1 and the bottom metal line patterns MPB in the bottom metal layer MLB. As shown in FIG. 30, the vertical contacts may include the first and second through-substrate vias TSV1 and TSV2 at least partially penetrating the first semiconductor die SD1 and the second semiconductor die SD2, respectively. The vertical line segments VL may further include second conduction line patterns MP2 and PP2 respectively formed in the intermediate conduction layers ML2 and PL2.

As described with reference to FIGS. 25 and 26, the 3D detection structure DSd, according to example embodiments, may be expanded in the vertical direction Z to various depths.

Figure 27:
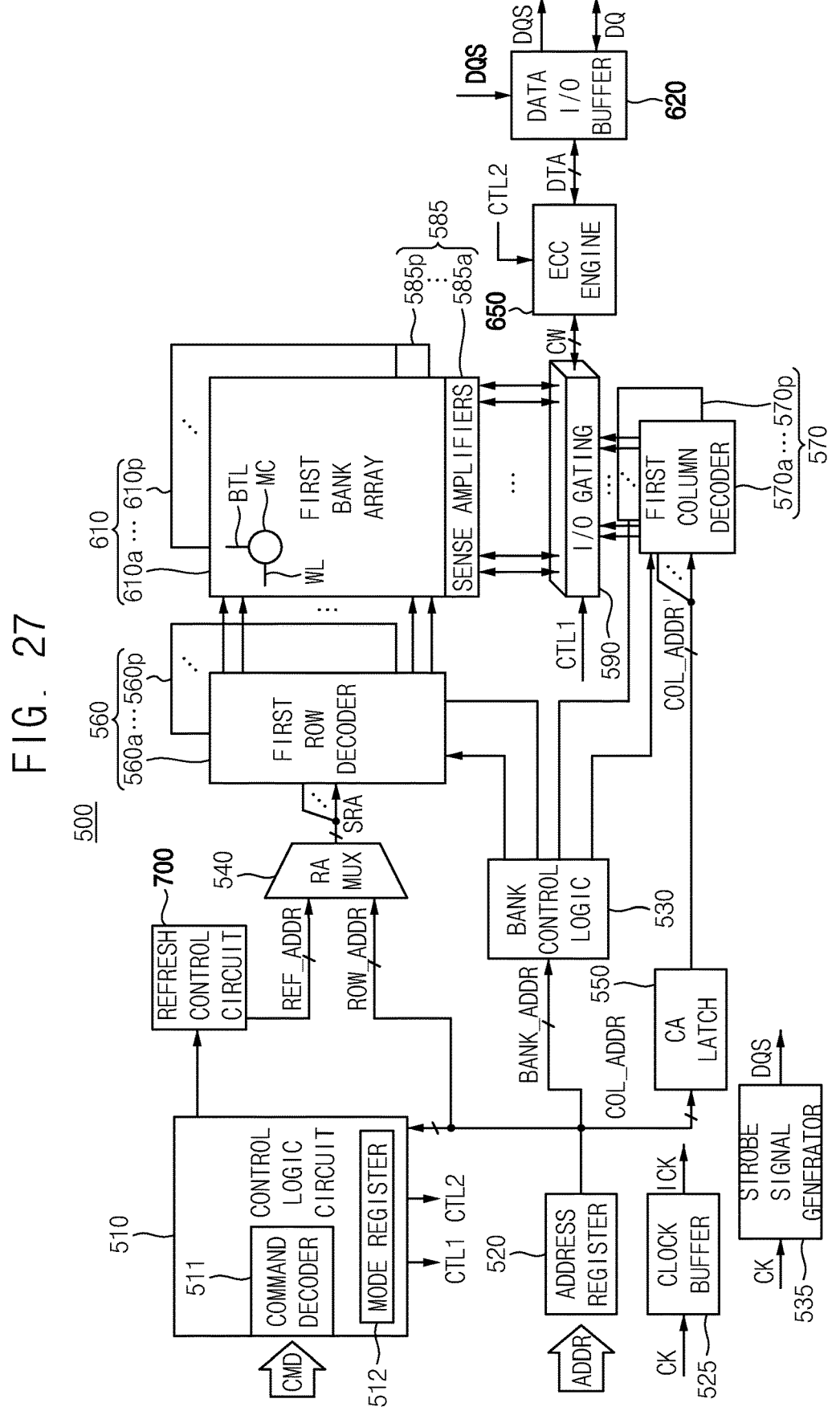
FIG. 27 is a block diagram illustrating an example of the semiconductor device in FIG. 1, according to example embodiments.

FIG. 27 is a block diagram illustrating an example of the semiconductor device in FIG. 1, according to example embodiments.

Referring to FIG. 27, the semiconductor device 500 may be a volatile memory device and may include the control logic circuit 510, an address register 520, a bank control logic 530, a refresh control circuit 700, a row address multiplexer 540, a column address latch 550, a row decoder 560, a column decoder 570, a memory cell array 610, a sense amplifier unit 585, an I/O gating circuit 590, an error correction code (ECC) engine 650, a clock buffer 625, a strobe signal generator 235 and a data I/O buffer 620.

The memory cell array 610 may include first to sixteenth bank arrays 610a to 610s. The row decoder 560 may include first to sixteenth row decoders 560a to 560s respectively coupled to the first to sixteenth bank arrays 610a to 610s, the column decoder 570 may include first to sixteenth column decoders 570a to 570s respectively coupled to the first to sixteenth bank arrays 610a to 610s, and the sense amplifier unit 585 may include first to sixteenth sense amplifiers 585a to 585s respectively coupled to the first to sixteenth bank arrays 610a to 610s.

The first to sixteenth bank arrays 610a to 610s, the first to sixteenth row decoders 560a to 560s, the first to sixteenth column decoders 570a to 570s and first to sixteenth sense amplifiers 585a to 585s may form first to sixteenth banks. Each of the first to sixteenth bank arrays 610a to 610s may include a plurality of memory cells MC that may be formed at intersections of a plurality of word-lines WL and a plurality of bit-lines BL.

The address register 520 may receive the address ADDR including a bank address BANK_ADDR, a row address ROW_ADDR, and a column address COL_ADDR from an external memory controller. The address register 520 may provide the received bank address BANK_ADDR to the bank control logic 530, may provide the received row address ROW_ADDR to the row address multiplexer 540, and may provide the received column address COL_ADDR to the column address latch 550.

The bank control logic 530 may generate bank control signals in response to the bank address BANK_ADDR. One of the first to sixteenth row decoders 560a to 560s corresponding to the bank address BANK_ADDR may be activated in response to the bank control signals, and one of the first to sixteenth column decoders 570a to 570s corresponding to the bank address BANK_ADDR may be activated in response to the bank control signals.

The row address multiplexer 540 may receive the row address ROW_ADDR from the address register 520, and may receive a refresh row address REF_ADDR from the refresh control circuit 700. The row address multiplexer 540 may selectively output the row address ROW_ADDR and/or the refresh row address REF_ADDR as a row address SRA. The row address SRA that is output from the row address multiplexer 540 may be applied to the first to sixteenth row decoders 560a to 560s.

The refresh control circuit 700 may sequentially increase and/or decrease the refresh row address REF_ADDR in a normal refresh mode under control the control logic circuit 510.

The activated one of the first to sixteenth row decoders 560a to 560s, by the bank control logic 530, may decode the row address SRA that may be output from the row address multiplexer 540, and may activate a word-line corresponding to the row address SRA. For example, the activated bank row decoder may apply a word-line driving voltage to the word-line corresponding to the row address.

The column address latch 550 may receive the column address COL_ADDR from the address register 520, and may temporarily store the received column address COL_ADDR. In some embodiments, in a burst mode, the column address latch 550 may generate column address COL_ADDR' that increment from the received column address COL_ADDR. The column address latch 550 may apply the temporarily stored or generated column address COL_ADDR' to the first to sixteenth column decoders 570a to 570s.

The activated one of the first to sixteenth column decoders 570a to 570s may activate a sense amplifier corresponding to the bank address BANK_ADDR and the column address COL_ADDR through the I/O gating circuit 590.

The I/O gating circuit 590 may include a circuitry for gating I/O data, and may further include input data mask logic, read data latches for storing data that is output from the first to sixteenth bank arrays 610a to 610s, and write drivers for writing data to the first to sixteenth bank arrays 610a to 610s.

Codeword CW that may be read from a selected one bank array of the first to sixteenth bank arrays 610a to 610s may be sensed by a sense amplifier coupled to the selected one bank array from which the data is to be read, and may be stored in the read data latches. The codeword CW stored in the read data latches may be provided to the data I/O buffer 620 as data DTA after ECC decoding is performed on the codeword CW by the ECC engine 650. The data I/O buffer 620 may convert the data DTA into the data signal DQ and may transmit the data signal DQ along with the data strobe signal DQS to the memory controller.

The data signal DQ to be written in a selected one bank array of the first to sixteenth bank arrays 610a to 610s may be provided to the data I/O buffer 620 from the memory controller. The data I/O buffer 620 may convert the data signal DQ to the data DTA and may provide the data DTA to the ECC engine 650. The ECC engine 650 may perform an ECC encoding on the data DTA to generate parity bits, and the ECC engine 650 may provide the codeword CW including data DTA and the parity bits to the I/O gating circuit 590. The I/O gating circuit 590 may write the codeword CW in a sub-page in the selected one bank array through the write drivers.

The data I/O buffer 620 may provide the data signal DQ from the memory controller to the ECC engine 650 by converting the data signal DQ to the data DTA in a write operation of the semiconductor device 500, may convert the data DTA to the data signal DQ from the ECC engine 650, and may transmit the data signal DQ and the data strobe signal DQS to the memory controller in a read operation of the semiconductor device 500.

The ECC engine 650 may perform an ECC encoding on the data DTA and may perform an ECC decoding on the codeword CW based on a second control signal CTL2 from the control logic circuit 510.

The clock buffer 525 may receive the clock signal CK, may generate an internal clock signal ICK by buffering the clock signal CK, and may provide the internal clock signal ICK to circuit components processing the command CMD and the address ADDR.

The strobe signal generator 535 may receive the clock signal CK, may generate the data strobe signal DQS based on the clock signal CK, and may provide the data strobe signal DQS to the data I/O buffer 620.

The control logic circuit 510 may control operations of the semiconductor device 500. For example, the control logic circuit 510 may generate control signals for the semiconductor device 500 in order to perform a write operation, a read operation, a normal refresh operation. The control logic circuit 510 may include a command decoder 511 that may decode the command CMD received from the memory controller and a mode register 512 that may set an operation mode of the semiconductor device 500.

For example, the command decoder 511 may generate the control signals corresponding to the command CMD by decoding a write enable signal, a row address strobe signal, a column address strobe signal, a chip select signal, and the like. The control logic circuit 510 may provide a first control signal CTL1 to the I/O gating circuit 590, and a second control signal CTL2 to the ECC engine 650.

Figure 28:
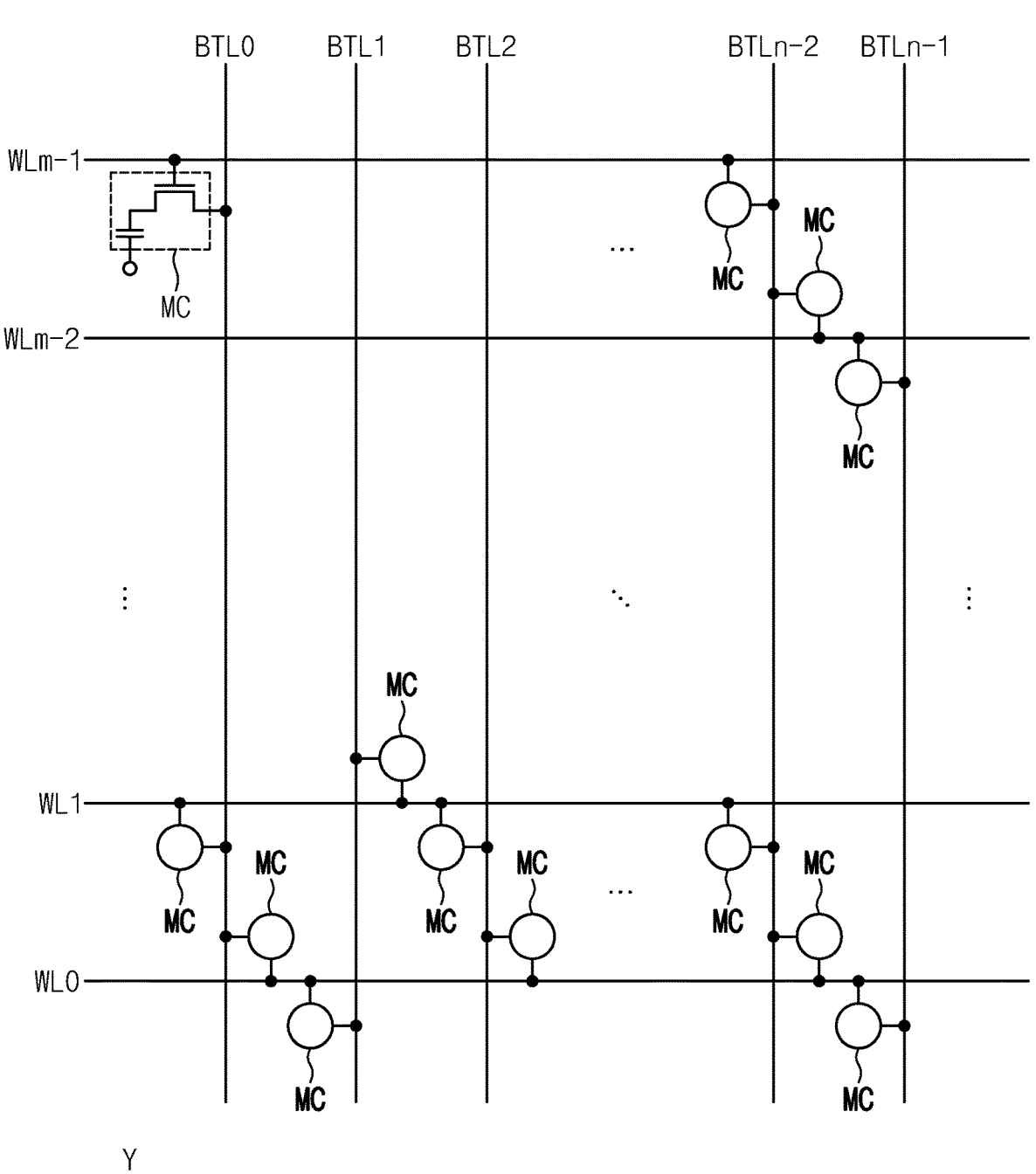
FIG. 28 illustrates an example of the first bank array in the semiconductor device of FIG. 27, according to example embodiments.

FIG. 28 illustrates an example of the first bank array in the semiconductor device of FIG. 27, according to example embodiments.

Referring to FIG. 28, the first bank array 610a may include a plurality of word-lines WL0 to WLm−1 (where m is a positive integer greater than or equal to two (2)), a plurality of bit-lines BL0 to BLn−1 (where n is a positive integer greater than or equal to two (2)), and a plurality of memory cells MCs disposed at intersections between the word-lines WL0 to WLm−1 and the bit-lines BL0 to BLn−1. Each of the memory cells MCs may include a cell transistor coupled to each of the word-lines WL0 to WLm−1 and each of the bit-lines BL0 to BLn−1, and a cell capacitor coupled to the cell transistor. Each of the memory cells MCs may have a dynamic random-access memory (DRAM) cell structure. Each of the word-lines WL0 to WLm−1 may extend in a first direction X and each of the bit-lines BL1 to BLn−1 may extend in a second direction Y crossing the first direction X.

Figure 29:
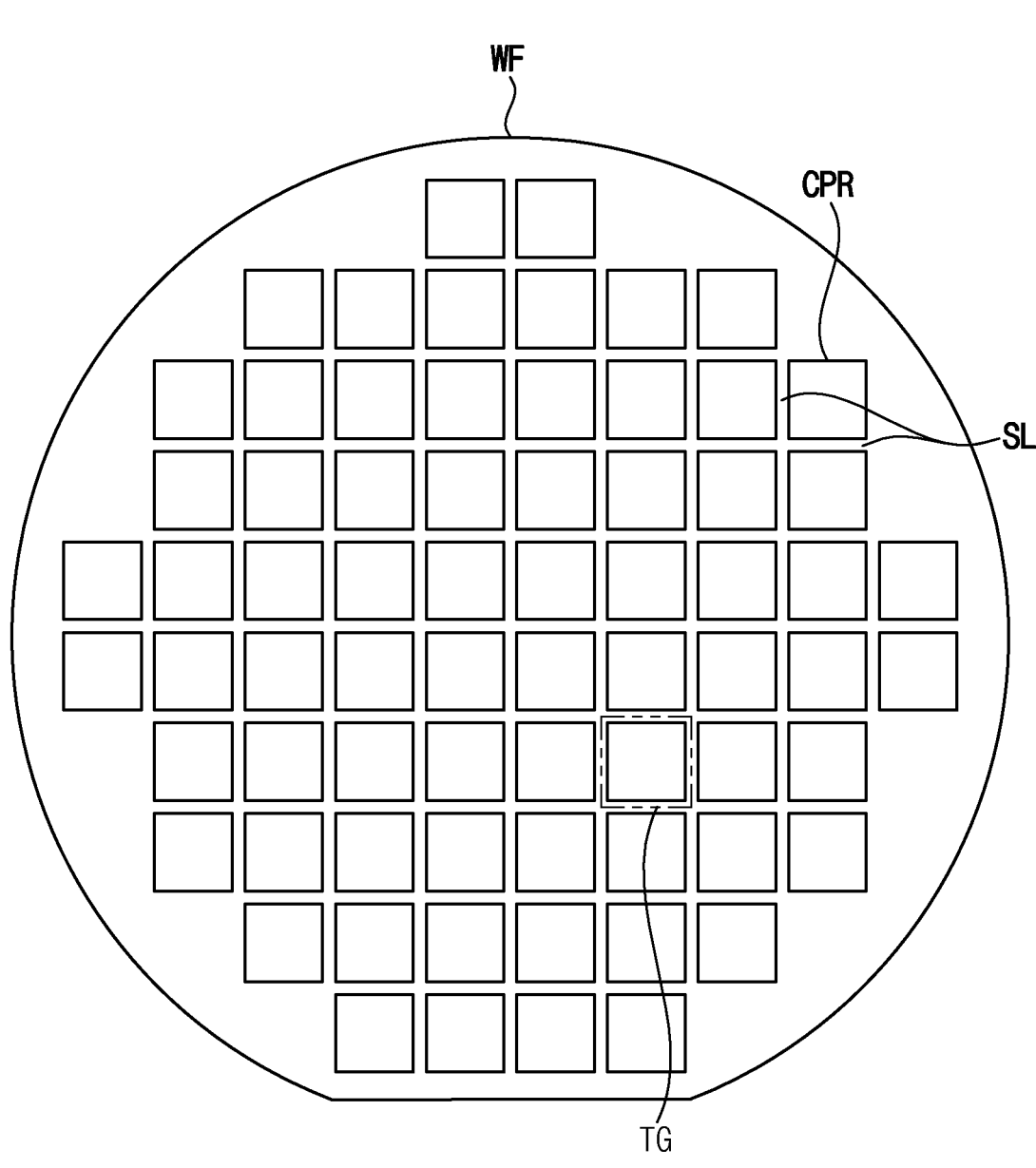
FIG. 29 is a plan view for explaining a semiconductor device, according to example embodiments.
Figure 31:
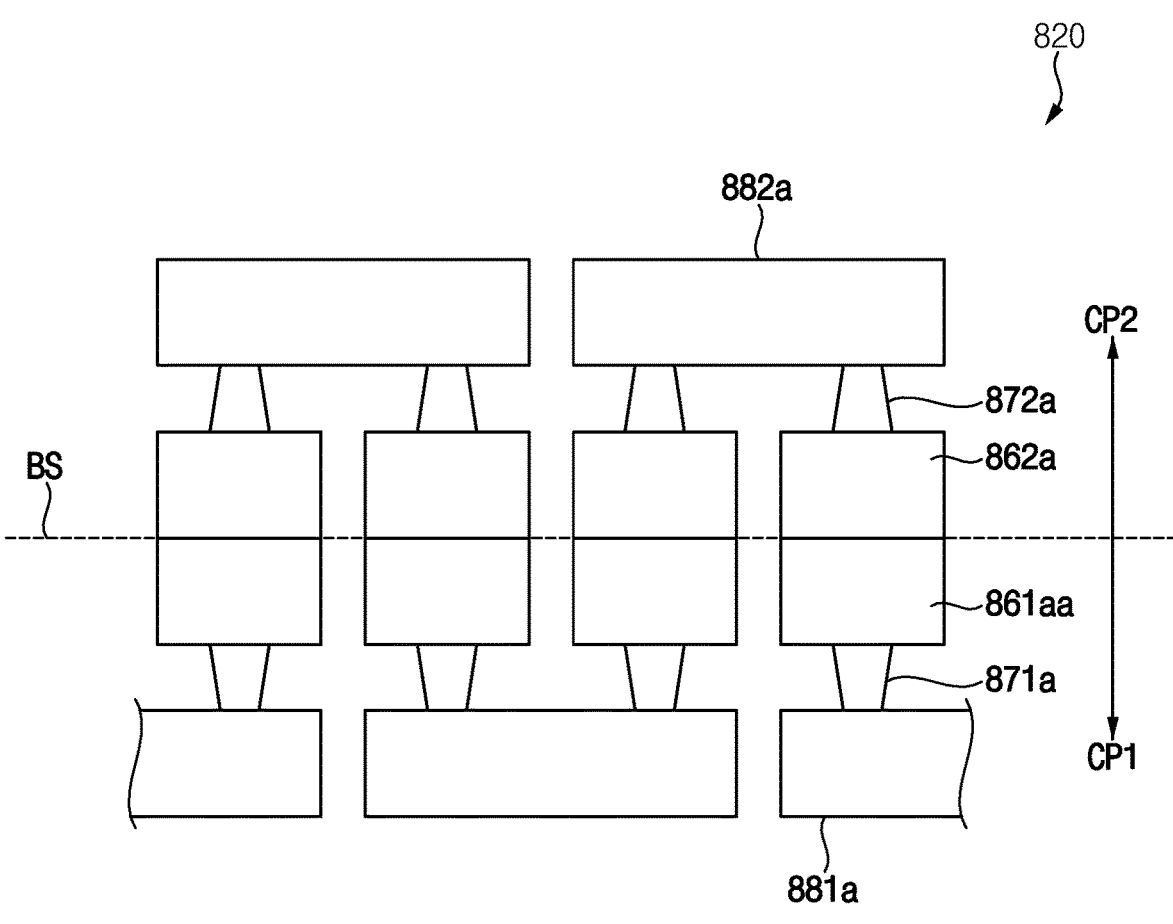
FIG. 31 is a cross-sectional view taken along a line III-III' of FIG. 30, according to example embodiments.

FIG. 29 is a plan view illustrating a semiconductor device, according to example embodiments. FIG. 30 is a plan view illustrating a semiconductor device, according to example embodiments. FIG. 31 is a cross-sectional view taken along a line III-III' of FIG. 30, according to example embodiments.

Referring to FIG. 29, a wafer WF is illustrated for describing manufacturing processes of a semiconductor device according to example embodiments. A plurality of chip regions CPR and scribe lanes SL at least partially surrounding the chip regions CPR may be formed in the wafer WF. The wafer WF may be cut along the scribe lanes SL and may be divided into a plurality of dies.

A plurality of wafers may be bonded to form a plurality of semiconductor devices. A target portion TG in the wafer WF is described with reference to FIG. 30.

FIG. 30 is an enlarged diagram of a target portion TG in FIG. 29 for describing a semiconductor device, according to example embodiments.

Referring to FIG. 30, a semiconductor device 800 may include a chip region CPR, a scribe lane SL along an edge of the chip region CPR, a detection structure 820, and a measuring circuit OSC 850 connected to the detection structure 820 through a switch SW. The measuring circuit OSC 850 may be an oscilloscope circuit. The semiconductor device 800 may further include a dam region DM including a dam structure 830, which may be disposed between the chip region CPR and the scribe lane SL. The dam region DM may isolate the chip region CPR and the scribe lane SL and may have a ring shape or a close curve in planar view. The dam structure 830 including at least one dam (e.g., first dam 831 and second dam 832) may be disposed in the dam region DM.

The chip region CPR may be a region in which elements operating on a chip may be formed. The chip region CPR may have a ring shape and/or a rectangular ring-shape, but the present disclosure is not limited thereto.

The scribe lane SL, at least partially surrounding the chip region CPR, may be an area having a space margin in case of a damaged part when dicing the wafer WF to a chip. The scribe lane SL may have a ring shape and/or a rectangular ring-shape that may correspond to a shape of the chip region CPR.

In the scribe lane SL, various patterns such as, but not limited to, a mark pattern, a key pattern and patterns may be formed for fabrication monitoring and device test.

In example embodiments, bonding metal patterns including bonding metals (e.g., first bonding metals 861*a* and second bonding metals 861*b* of FIG. 31) associated with bonding chips may be formed in the scribe lane SL. The detection structure 820 may be disposed in the scribe lane SL and the bonding metal patterns may constitute the detection structure 820.

The chip region CPR may correspond to the central region CTREG in FIG. 1A, the scribe lane SL may correspond to a portion of the external region EREG in FIG. 1A and the detection structure 820 may be formed in the scribe lane SL around the chip region CPR in the external region. The detection structure 820 may include a first end ET1 and a second end ET2.

The semiconductor device 800 may have may have a chip-to-chip (C2C) structure in which a first chip CP1 is located on a second chip CP2. In FIG. 31, a bonding surface BS is illustrated at which the first chip CP1 is coupled to the second chip CP2.

Referring to FIG. 31, in the scribe lane SL, the first chip CP1 may include a first bonding metal pattern and the second chip CP2 may include a second bonding metal pattern. The first chip CP1 and the second chip CP2 may be coupled to each other by the first bonding metal and the second bonding metal being bonded to each other. When first bonding metals 861*a* constituting the first bonding metal pattern and second bonding metals 862*a* constituting the second bonding metal pattern are not properly connected to each other due to fabrication problems and/or cracks, electrical signals may not be transferred to the detection structure 820 in the scribe lane SL or abnormal phenomenon occurs in the electrical signals. Therefore, the measuring circuit OSC 850 may determine whether an opening occurs in the scribe lane SL based on the electrical signals in the detection structure 820.

Continuing to refer to FIG. 31, the detection structure 820 disposed on the scribe lane SL may include the first bonding metals 861*a*, the second bonding metals 862*a*, first and second horizontal lines 881*a* and 882*a*, and first and second contact plugs 871*a* and 871*b*. The first and second horizontal lines 881*a* and 882*a* may be electrically connected to the measuring circuit OSC 850. The first and second contact plugs 871*a* and 871*b* may connect the first and second horizontal lines 881*a* and 882*a* to the first and second bonding metals 861*a* and 862*a*, respectively. At least one of the first and second horizontal lines 881*a* and 882*a* may be connected to a connection wire structure extending from the chip region CPR to the scribe lane SL for electrical connection with the first and second bonding metals 861*a* and 862*a*. For example, the at least one of the first and second horizontal lines 881*a* and 882*a* may at least partially penetrate through the dam structure 830. The at least one of the first and second horizontal lines 881*a* and 882*a* may be insulated from the dam structure 830.

The dam structure 830 may be a region that separates the chip region CPR and the scribe lane SL. The dam structure 830 may define the chip region CPR and the scribe lane SL by at least partially surrounding the chip region CPR. The dam structure 830 may separate the chip region CPR and the scribe lane SL by at least partially penetrating the first chip CP1 and the second chip CP2 vertically. The dam structure

830 may prevent a crack occurring in the scribe lane SL from entering the chip region CPR. The dam structure 830 may prevent external moisture from entering the chip region CPR.

The dam structure 830 may include at least one dam. For example, the dam structure 830 may include an inner dam 831 and an outer dam 832. The inner dam 831 may at least partially surround the chip region CPR adjacently to the chip region CPR and the outer dam 832 may at least partially surround the inner dam 831 adjacently to the scribe lane. Each of the inner dam 831 and the outer dam 832 may have shape corresponding to a shape of the chip region CPR.

The dam structure 830 may include a through-electrode via (THV) through which the detection structure 820 may pass. For example, each of the inner dam 831 and the outer dam 832 include a THV. The inner dam 831 may include a first THV TH1 and the outer dam 832 may include a second THV TH2.

In the semiconductor device 800, at least one of the first end ET1 and the second end ET2 of the detection structure 820 may be connected to a probe of the measuring circuit OSC 850 and/or the first end ET1 and the second end ET2 may be sequentially connected to the probe of the measuring circuit OSC 850 through the switch SW, and a clock signal CLK may be provided to the measuring circuit OSC 850. The measuring circuit OSC 850 may determine a location of an opening in the scribe lane SL based on a period of the clock signal CLK and a number of periods of the clock signal CLK during a reference time interval.

Figure 32:
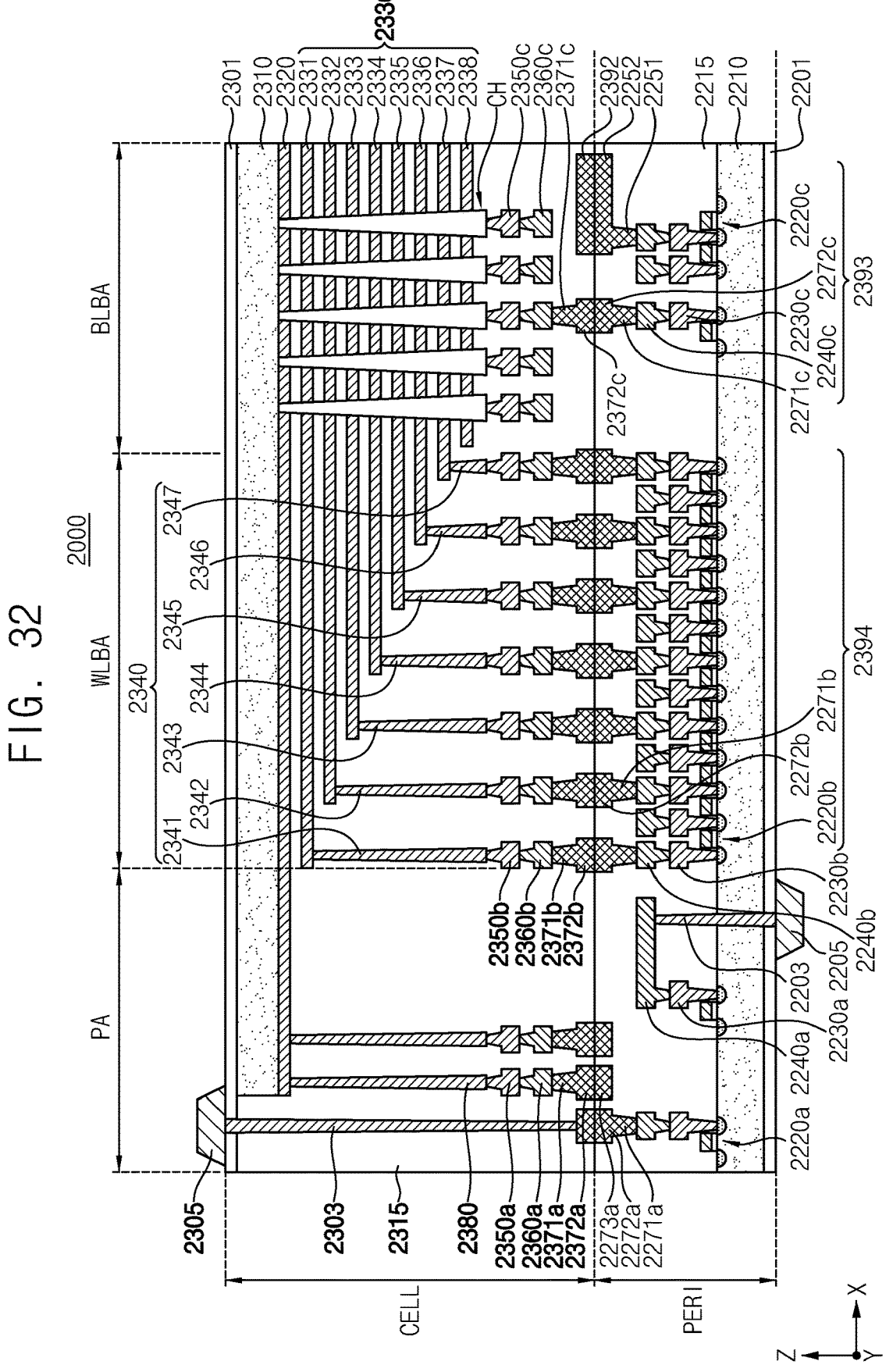
FIG. 32 is a cross-sectional view of a semiconductor device, according to example embodiments.

FIG. 32 is a cross-sectional view of a semiconductor device, according to example embodiments.

Referring to FIG. 32, a semiconductor device 2000 may be a non-volatile memory device and may have a C2C structure. Hereinafter, the semiconductor device 2000 may be referred to as a non-volatile memory device. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. As used herein, the bonding process may include a method of electrically connecting a bonding metal formed on an uppermost metal layer of the upper chip and a bonding metal formed on an uppermost metal layer of the lower chip. For example, when the bonding metals include copper (Cu), the bonding process may use a Cu-to-Cu bonding. However, the present disclosure may not be limited thereto. For example, the bonding metals may also be formed of and/or may include, but not be limited to, aluminum (Al) or tungsten (W).

Each of the peripheral circuit region PERI and the cell region CELL of the non-volatile memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements (e.g., 2220*a*, 2220*b*, and 2220*c*) formed on the first substrate 2210, first metal layers (e.g., 2230*a*, 2230*b*, and 2230*c*) respectively connected to the plurality of circuit elements 2220*a* to 2220*c*, and second metal layers (e.g., 2240*a*, 2240*b*, and 2240*c*) formed on the first metal layers 2230*a* to 2230*c*. In an example embodiment, the first metal layers 2230*a* to 2230*c* may be formed of and/or may include tungsten (W) having relatively high electrical resistivity, and the second metal layers 2240*a* to 2240*c* may be formed of and/or may include copper (Cu) having relatively low electrical resistivity.

In an example embodiment shown in FIG. 22, although only the first metal layers 2230a to 2230c and the second metal layers 2240a to 2240c are shown and described, the example embodiment is not limited thereto, and one or more additional metal layers may be further formed on the first metal layers 2230a to 2230c and/or the second metal layers 2240a to 2240c. At least a portion of the one or more additional metal layers formed on the second metal layers 2240a to 2240c may be formed of aluminum or the like having a lower electrical resistivity than those of copper forming the second metal layers 2240a to 2240c.

The interlayer insulating layer 2215 may be disposed on the first substrate 2210 and at least partially cover the plurality of circuit elements 2220a to 2220c, the first metal layers 2230a to 2230c, and the second metal layers 2240a to 2240c. The interlayer insulating layer 2215 may include an insulating material such as, but not limited to, silicon oxide (SiO), silicon nitride (SiN), or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of and/or may include aluminum (Al), copper (Cu), tungsten (W), or the like. As used herein, the upper bonding metals 2371b and 2372b in the cell region CELL may be referred to as first metal pads and the lower bonding metals 2271b and 2272b in the peripheral circuit region PERI may be referred to as second metal pads.

The cell region CELL may include at least one memory block. The cell region CELL may include a second substrate 2310 and a common source line 2320. On the second substrate 2310, a plurality of word-lines (e.g., first word-line 2331, second word-line 2332, third word-line 2333, fourth word-line 2334, fifth word-line 2335, sixth word-line 2336, seventh word-line 2337, and eighth word-line 2338, hereinafter generally referred to as "2330") may be stacked in a vertical direction Z (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction Z, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit-line contact, and the second metal layer 2360c may be a bit-line. In an example embodiment, the bit-line 2360c may extend in a second direction Y (e.g., a Y-axis direction), parallel to the upper surface of the second substrate 2310.

In an example embodiment shown in FIG. 32, an area in which the channel structure CH, the bit-line 2360c, and the like are disposed may be referred to as the bit-line bonding area BLBA. In the bit-line bonding area BLBA, the bit-line 2360c may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first direction X (e.g., an X-axis direction), parallel to the upper surface of the second substrate 2310 and perpendicular to the second direction Y, and may be connected to a plurality of cell contact plugs (e.g. first cell contact plug 2341, second cell contact plug 2342, third cell contact plug 2343, fourth cell contact plug 2344, fifth cell contact plug 2345, sixth cell contact plug 2346, and seventh cell contact plug 2347, hereinafter generally referred to as "2340"). The plurality of word-lines 2330 and the plurality of cell contact plugs 2340 may be connected to each other in pads provided by at least a portion of the plurality of word-lines 2330 extending in different lengths in the first direction X. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as, but not limited to, a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be referred to as the external pad bonding area PA.

Input/output pads 2205 and 2305 may be disposed in the external pad bonding area PA. A lower insulating film 2201 at least partially covering a lower surface of the first substrate 2210 may be formed below the first substrate 2210, and a first I/O pad 2205 may be formed on the lower insulating film 2201. The first I/O pad 2205 may be connected to at least one of the plurality of circuit elements 2220a to 2220c disposed in the peripheral circuit region PERI through a first I/O contact plug 2203, and may be separated from the first substrate 2210 by the lower insulating film 2201. In addition, a side insulating film may be disposed between the first I/O contact plug 2203 and the first substrate 2210 to electrically separate the first I/O contact plug 2203 and the first substrate 2210.

An upper insulating layer 2301 at least partially covering the upper surface of the second substrate 2310 may be formed on the second substrate 2310 and a second I/O pad 2305 may be disposed on the upper insulating layer 2301.

The second I/O pad 2305 may be connected to at least one of the plurality of circuit elements 2220a to 2220c disposed in the peripheral circuit region PERI through a second I/O contact plug 2303 and/or lower bonding metals 2271a and 2272a, and the like. In the example embodiment, the second I/O pad 2305 may be electrically connected to a circuit element 2220a.

According to example embodiments, the second substrate 2310 and the common source line 2320 may not be disposed in an area in which the second I/O contact plug 2303 is disposed. Alternatively or additionally, the second I/O pad 2305 may not overlap the word-lines 2330 in the vertical direction Z. The second I/O contact plug 2303 may be separated from the second substrate 2310 in the direction, parallel to the upper surface of the second substrate 2310, and may pass through the interlayer insulating layer 2315 of the cell region CELL to be connected to the second I/O pad 2305.

According to example embodiments, the first I/O pad 2205 and the second I/O pad 2305 may be selectively formed. For example, the non-volatile memory device 2000 may include only the first I/O pad 2205 disposed on the first substrate 2210 or the second I/O pad 2305 disposed on the second substrate 2310. Alternatively or additionally, the memory device 2000 may include both the first I/O pad 2205 and the second I/O pad 2305.

A metal pattern provided in an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the non-volatile memory device 2000 may include a lower metal pattern 2273a, corresponding to an upper metal pattern 2372a formed in an uppermost metal layer of the cell region CELL, and having a substantially similar and/or the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having a substantially similar and/or the same shape as a lower metal pattern 2273a of the peripheral circuit region PERI, may be formed in an uppermost metal layer of the cell region CELL. The upper metal pattern 2372a may be included in upper bonding metals 2371b and 2372b.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

In the bit-line bonding area BLBA, an upper metal pattern 2392, corresponding to a lower metal pattern 2252 may be formed in the uppermost metal layer of the peripheral circuit region PERI, and having a substantially similar and/or the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL. The lower metal pattern 2252 may be included in lower bonding metals 2271b and 2272b.

In an example embodiment, corresponding to a metal pattern formed in an uppermost metal layer in one of the cell region CELL and the peripheral circuit region PERI, a reinforcement metal pattern having a substantially similar and/or the same cross-sectional shape as the metal pattern, may be formed in an uppermost metal layer in the other one of the cell region CELL and the peripheral circuit region PERI. A contact may not be formed on the reinforcement metal pattern.

The word-line voltages may be applied to at least one memory block in the cell region CELL through the lower bonding metals 2271b and 2272b in the peripheral circuit region PERI and upper bonding metals 2371b and 2372b of the cell region CELL.

FIG. 33 is a plan view illustrating a peripheral circuit region in the semiconductor device of FIG. 32, according to example embodiments.

Referring to FIG. 33, the peripheral circuit region PERI may include row decoder regions (e.g., first row decoder region RDR1, second row decoder region RDR2, and third row decoder region RDR3) disposed in the first direction X, a first page buffer driver region PBD1, a first page buffer region PGR1, a first internal peripheral circuit region IPER1, a second page buffer region PGR2, and a second page buffer driver region PBD2 which are disposed in the second direction Y between the first and second row decoder regions RDR1 and RDR2, a third page buffer driver region PBD3, a third page buffer region PGR3, a second internal peripheral circuit region IPER2, a fourth page buffer region PGR4, and a fourth page buffer driver region PBD4 which are disposed in the second direction Y between the second and third row decoder regions RDR2 and RDR3 and a pad region PDR adjacent to the first to third row decoder regions RDR1 to RDR3 in the second direction Y.

The first and second page buffer regions PGR1 and PGR2 may be spaced apart from each other in the second direction Y and the page buffer regions PGR3 and PGR4 may be spaced apart from each other in the second direction Y. The buffer regions PGR1 and PGR2 may be spaced apart from the page buffer regions PGR3 and PGR4 in the first direction X.

A row decoder may be disposed in each of the first to third row decoder regions RDR1 to RDR3, a page buffer circuit including a plurality of page buffers may be disposed in the first to fourth page buffer regions PGR1 to PGR4, a page buffer driver may be disposed in each of the first to fourth page buffer driver regions PBD1 to PBD4, and a pump and selection circuits may be disposed in each of the first and second internal peripheral circuit regions IPER1 and IPER2.

The first to third row decoder regions RDR1 RDR3, the first to fourth page buffer regions PGR1 to PGR4, the first to fourth page buffer driver regions PBD1 to PBD4 and the first and second internal peripheral circuit regions IPER1 and IPER2 may correspond to a central region of the peripheral circuit region PERI.

The first to fourth page buffer regions PGR1 to PGR4 may be referred to as a first sub circuit region, a second sub circuit region, a third sub circuit region and a fourth sub circuit region, respectively.

The first to fourth page buffer regions PGR1 to PGR4 may be disposed in a region corresponding to the bit-line bonding region in FIG. 32.

FIG. 34 illustrates detection structures that are disposed in the peripheral circuit region of FIG. 33, according to example embodiments.

Referring to FIG. 34, a first detection structure DS1 may be formed to at least partially surround the first and second page buffer regions PGR1 and PGR2 in the central region and may be connected to a first switch SWa disposed in the pad region PDR. A second detection structure DS2 may be formed to at least partially surround the third and fourth page buffer regions PGR3 and PGR4 in the central region and may be connected to a second switch SWb disposed in the pad region PDR.

Each of the first switch SWa and the second switch SWb may be connected to the measuring circuit 920 in FIG. 1. Therefore, the measuring circuit 920 may measure a period of a first clock signal that may be generated by contacting a probe of the measuring circuit 920 to an end of the first detection structure DS1 through the first switch SWa and may determine a location of a first opening in the first detection structure DS1 by counting a number of periods of the first clock signal during a reference time interval. Alternatively or additionally, the measuring circuit 920 may measure a period of a second clock signal that may be generated by contacting a probe of the measuring circuit 920 to an end of the second detection structure DS2 through the second switch SWb and may determine a location of a second opening in the second detection structure DS2 by counting a number of periods of the second clock signal during the reference time interval.

FIG. 35 illustrates a portion of the first detection structure in FIG. 34, according to example embodiments.

Referring to FIG. 35, the first detection structure DS1 may be provided by connecting alternatingly an upper bonding metal 2371 of the cell region CELL to an upper metal layer 2360 above the upper bonding metal 2371 in the first direction X or the second direction Y at edges of the page buffer region PGR1 (e.g., a first sub circuit region) and page buffer region PGR2 (e.g., a second sub circuit region) and by connecting alternatingly a lower bonding metal 2271 of the peripheral circuit region PERI to a lower metal layer 2240 below the lower bonding metal 2271 in the first direction X or the second direction Y at the edges of the page buffer region PGR1 (e.g., a first sub circuit region) and page buffer region PGR2 (e.g., a second sub circuit region). The first detection structure DS1 may alternatingly pass via a boundary of the cell region CELL and the peripheral circuit region PERI such as a chain configuration. At least one of a first end and a second end of the first detection structure DS1 may be connected to the first switch SWa in FIG. 34.

The second detection structure DS2 may be provided by connecting alternatingly an upper bonding metal 2371 of the cell region CELL to an upper metal layer 2360 above the upper bonding metal 2371 in the first direction X or the second direction Y at edges of the page buffer region PGR3 (e.g., a third sub circuit region) and page buffer region PGR4 (e.g., a fourth sub circuit region) and by connecting alternatingly a lower bonding metal 2271 of the peripheral circuit region PERI to a lower metal layer 2240 below the lower bonding metal 2271 in the first direction X or the second direction Y at the edges of the page buffer region PGR3 (e.g., a third sub circuit region) and page buffer region PGR4 (e.g., a fourth sub circuit region). The second detection structure DS2 may alternatingly pass via a boundary of the cell region CELL and the peripheral circuit region PERI such as a chain configuration. At least one of a first end and a second end of the second detection structure DS2 may be connected to the second switch SWb in FIG. 34.

Figure 36:
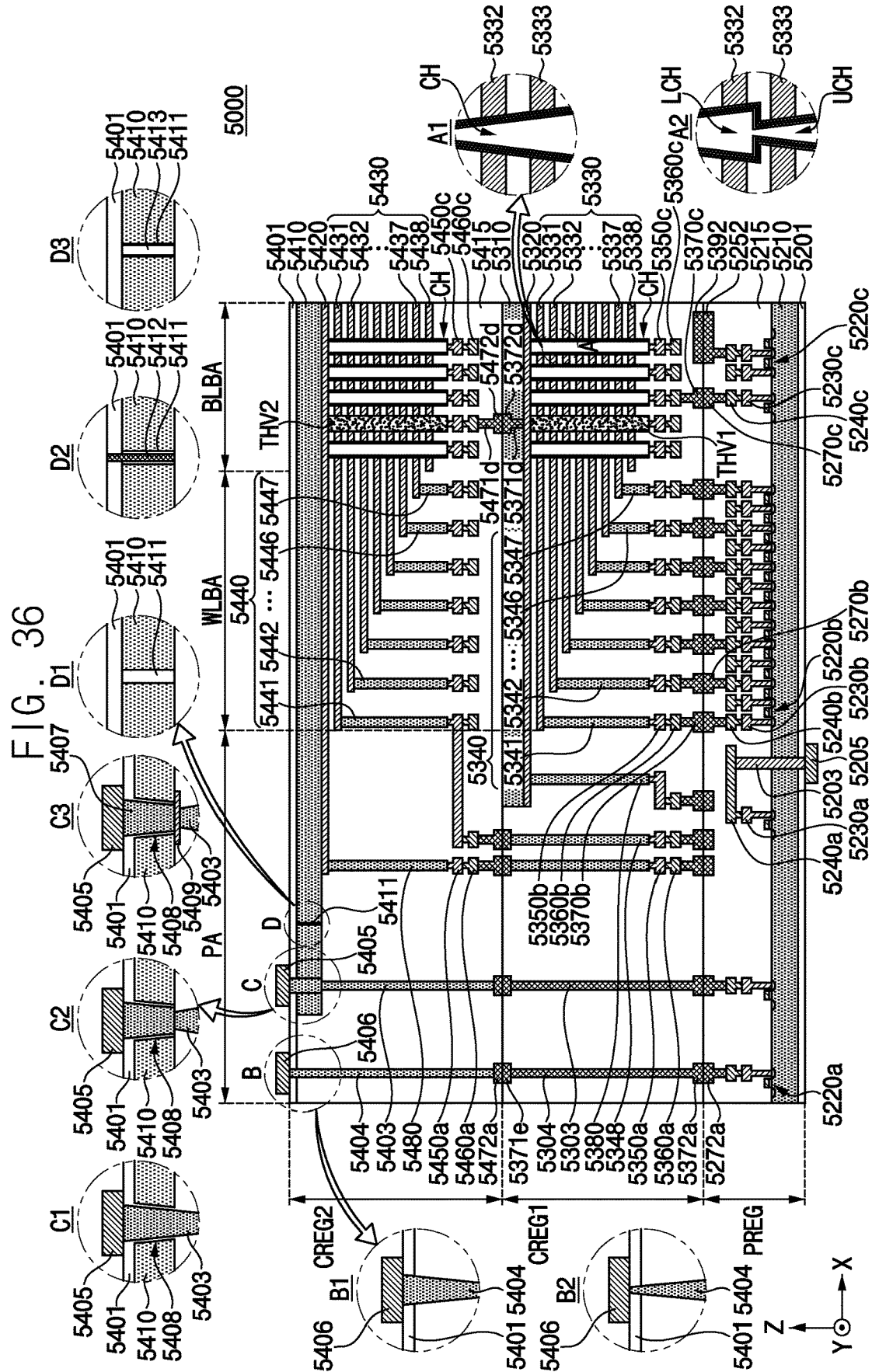
FIG. 36 is a cross-sectional view of a semiconductor device, according to example embodiments.

FIG. 36 is a cross-sectional view of a semiconductor device, according to example embodiments.

Referring to FIG. 36, a semiconductor device 5000 may be a non-volatile memory device. Hereinafter, the semiconductor device 5000 may be referred to as a memory device. The memory device 5000 may have a C2C structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may refer to a method of electrically and/or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be referred to as a Cu—Cu bonding method. Alternatively or additionally, the bonding metal patterns may be formed of aluminum (Al) and/or tungsten (W).

The memory device 5000 may include the at least one upper chip including the cell region. For example, as illustrated in FIG. 36, the memory device 5000 may include two upper chips. However, the number of the upper chips is not limited thereto. In the case in which the memory device 5000 includes the two upper chips, a first upper chip including a first cell region CREG1, a second upper chip including a second cell region CREG2, and the lower chip including the peripheral circuit region PREG may be manufactured separately, and then, the first upper chip, the second upper chip, and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips may be referred to based on the orientation of the chips before each of the first and second upper chips is turned over. That is, an upper portion of the lower chip may refer to an upper portion based on a +Z-axis direction, and the upper portion of each of the first and second upper chips may refer to an upper portion based on a −Z-axis direction in FIG. 36. However, the present disclosure is not limited thereto. In certain embodiments, one of the first upper chip and the second upper chip may be turned over and then may be connected to a corresponding chip by the bonding method.

The peripheral circuit region PREG and the first and second cell regions CREG1 and CREG2 of the memory device 5000 may be referred to as a first layer, a second layer, and a third layer, respectively, and the memory device 5000 may include M layers stacked in a vertical direction, where M is a positive integer greater than or equal to two (2).

The detection structure, according to example embodiments, may be disposed in each of the M layers and the measuring circuit may determine whether an opening occurs in each of the M layers and/or in entire M layers based on a clock signal. For example, the detection structure may include a conduction loop and the conduction loop may include bonding metals connecting a portion of top horizontal line segments of an upper layer of adjacent layers from among the M layers and a portion of bottom horizontal line segments of a lower layer of the adjacent layers.

Each of the peripheral circuit region PREG and the first and second cell regions CREG1 and CREG2 of the memory device 5000 may include an external pad bonding region PA, a word-line bonding region WLBA, and a bit-line bonding region BLBA.

The peripheral circuit region PREG may include a first substrate 5210 and a plurality of circuit elements (e.g., 5220a, 5220b and 5220c) formed on the first substrate 5210. An interlayer insulating layer 5215 including one or more insulating layers may be provided on the plurality of circuit elements 5220a to 5220c, and a plurality of metal lines electrically connected to the plurality of circuit elements 5220a to 5220c may be provided in the interlayer insulating layer 5215. For example, the plurality of metal lines may include first metal lines (e.g., 5230a, 5230b and 5230c) connected to the plurality of circuit elements 5220a to 5220c, and second metal lines (e.g., 5240a, 5240b and 5240c) formed on the first metal lines 5230a to 5230c. The plurality of metal lines may be formed of at least one of various conductive materials. For example, the first metal lines 5230a to 5230c may be formed of tungsten (W) having a relatively high electrical resistivity, and the second metal lines 5240a to 5240c may be formed of copper (Cu) having a relatively low electrical resistivity.

The first metal lines 5230a to 5230c and the second metal lines 5240a to 5240c are illustrated and described in the present embodiments. However, embodiments of the present disclosure are not limited thereto. In certain embodiments, at least one or more additional metal lines may further be formed on the second metal lines 5240a to 5240c. Alternatively or additionally, the second metal lines 5240a to 5240c may be formed of aluminum (Al), and at least some of the additional metal lines formed on the second metal lines 5240a to 5240c may be formed of copper (Cu) having an electrical resistivity lower than that of aluminum (Al) of the second metal lines 5240a to 5240c.

The interlayer insulating layer 5215 may be disposed on the first substrate 5210 and may include an insulating material such as, but not limited to, silicon oxide (SiO) and/or silicon nitride (SiN).

Each of the first and second cell regions CREG1 and CREG2 may include at least one memory block. The first cell region CREG1 may include a second substrate 5310 and a common source line 5320. A plurality of word-lines (e.g., first word-line 5331, second word-line 5332, third word-line 5333, fourth word-line 5334, fifth word-line 5335, sixth word-line 5336, seventh word-line 5337, and eighth word-line 5338, hereinafter generally referred to as "5330") may be stacked on the second substrate 5310 in a direction (e.g., the Z-axis direction) perpendicular to a top surface of the second substrate 5310. String selection lines and a ground selection line may be disposed on and under the plurality of word-lines 5330, and the plurality of word-lines 5330 may be disposed between the string selection lines and the ground selection line. Likewise, the second cell region CREG2 may include a third substrate 5410 and a common source line 5420, and a plurality of word-lines (e.g., first word-line 5431, second word-line 5432, third word-line 5433, fourth word-line 5434, fifth word-line 5435, sixth word-line 5436, seventh word-line 5437 and eighth word-line 5438, hereinafter generally referred to as "5430") may be stacked on the third substrate 5410 in a direction (e.g., the Z-axis direction) perpendicular to a top surface of the third substrate 5410. Each of the second substrate 5310 and the third substrate 5410 may be formed of at least one of various materials that may include, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some embodiments, as illustrated in a region 'A1', the channel structure CH may be provided in the bit-line bonding region BLBA and may extend in the direction perpendicular to the top surface of the second substrate 5310 to at least partially penetrate the word-lines 5330, the string selection lines, and the ground selection line. The channel structure CH may include a data storage layer, a channel layer, and a filling insulation layer. The channel layer may be electrically connected to a first metal line 5350c and a second metal line 5360c in the bit-line bonding region BLBA. For example, the second metal line 5360c may be a bit-line and may be connected to the channel structure CH through the first metal line 5350c. The bit-line 5360c may extend in a first direction (e.g., a Y-axis direction) parallel to the top surface of the second substrate 5310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 to at least partially penetrate the common source line 5320 and lower word-lines 5331 and 5332. The lower channel LCH may include a data storage layer, a channel layer, and a filling insulation layer and may be connected to the upper channel UCH. The upper channel UCH may at least partially penetrate upper word-lines 5333 to 5338. The upper channel UCH may include a data storage layer, a channel layer, and a filling insulation layer, and the channel layer of the upper channel UCH may be electrically connected to the first metal line 5350c and the second metal line 5360c. As a length of a channel increases, due to characteristics of manufacturing processes, it may be difficult to form a channel having a substantially uniform width. The memory device 5000, according to the present embodiments, may include a channel having improved width uniformity due to the lower channel LCH and the upper channel UCH which are formed by the processes performed sequentially.

In the case in which the channel structure CH includes the lower channel LCH and the upper channel UCH, as illustrated in the region 'A2', a word-line located near to a boundary between the lower channel LCH and the upper channel UCH may be a dummy word-line. For example, the second and third word-lines 5332 and 5333 adjacent to the boundary between the lower channel LCH and the upper channel UCH may be the dummy word-lines. In this case, data may not be stored in memory cells connected to the dummy word-line. Alternatively or additionally, the number of pages corresponding to the memory cells connected to the dummy word-line may be less than the number of pages corresponding to the memory cells connected to a general word-line. A level of a voltage applied to the dummy word-line may be different from a level of a voltage applied to the general word-line, and thus it may be possible to reduce an influence of a non-uniform channel width between the lower and upper channels LCH and UCH on an operation of the memory device.

Meanwhile, the number of the lower word-lines 5331 and 5332 penetrated by the lower channel LCH may be less than the number of the upper word-lines 5333 to 5338 penetrated by the upper channel UCH in the region 'A2'. However, embodiments of the present disclosure are not limited thereto. In certain embodiments, the number of the lower word-lines penetrated by the lower channel LCH may be greater than or equal to the number of the upper word-lines penetrated by the upper channel UCH. Alternatively or additionally, structural features and connection relation of the channel structure CH disposed in the second cell region CREG2 may be substantially similar and/or the same as those of the channel structure CH disposed in the first cell region CREG1.

In the bit-line bonding region BLBA, a first through-electrode THV1 may be provided in the first cell region CREG1, and a second through-electrode THV2 may be provided in the second cell region CREG2. As shown in FIG. 36, the first through-electrode THV1 may at least partially penetrate the common source line 5320 and the plurality of word-lines 5330. In certain embodiments, the first through-electrode THV1 may further penetrate the second substrate 5310. The first through-electrode THV1 may include a conductive material. Alternatively or additionally, the first through-electrode THV1 may include a conductive material at least partially surrounded by an insulating material. The second through-electrode THV2 may have a substantially similar and/or the same shape and structure as the first through-electrode THV1.

In some embodiments, the first through-electrode THV1 and the second through-electrode THV2 may be electrically connected to each other through a first through-metal pattern 5372*d* and a second through-metal pattern 5472*d*. The first through-metal pattern 5372*d* may be formed at a bottom end of the first upper chip including the first cell region CREG1, and the second through-metal pattern 5472*d* may be formed at a top end of the second upper chip including the second cell region CREG2. The first through-electrode THV1 may be electrically connected to the first metal line 5350*c* and the second metal line 5360*c*. A lower via 5371*d* may be formed between the first through-electrode THV1 and the first through-metal pattern 5372*d*, and an upper via 5471*d* may be formed between the second through-electrode THV2 and the second through-metal pattern 5472*d*. The first through-metal pattern 5372*d* and the second through-metal pattern 5472*d* may be connected to each other by the bonding method.

In addition, in the bit-line bonding region BLBA, an upper metal pattern 5252 may be formed in an uppermost metal layer of the peripheral circuit region PERI, and an upper metal pattern 5392 having a substantially similar and/or the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by the bonding method. In the bit-line bonding region BLBA, the bit-line 5360*c* may be electrically connected to a page buffer included in the peripheral circuit region PERI. For example, some of the circuit elements 5220*c* of the peripheral circuit region PREG may constitute the page buffer, and the bit-line 5360*c* may be electrically connected to the circuit elements 5220*c* constituting the page buffer through an upper bonding metal pattern 5370*c* of the first cell region CREG1 and an upper bonding metal pattern 5270*c* of the peripheral circuit region PERI.

Continuing to refer to FIG. 36, in the word-line bonding region WLBA, the word-lines 5330 of the first cell region CREG1 may extend in a second direction (e.g., an X-axis direction) parallel to the top surface of the second substrate 5310 and may be connected to a plurality of cell contact plugs (e.g., first cell contact plug 5341, second cell contact plug 5342, third cell contact plug 5343, fourth cell contact plug 5344, fifth cell contact plug 5345, sixth cell contact plug 5346, and seventh cell contact plug 5347, hereinafter generally referred to as "5340"). First metal lines 5350*b* and second metal lines 5360*b* may be sequentially connected onto the plurality of cell contact plugs 5340 connected to the plurality of word-lines 5330. In the word-line bonding region WLBA, the plurality of cell contact plugs 5340 may be connected to the peripheral circuit region PREG through upper bonding metal patterns 5370*b* of the first cell region CREG1 and upper bonding metal patterns 5270*b* of the peripheral circuit region PERI.

The plurality of cell contact plugs 5340 may be electrically connected to a row decoder included in the peripheral circuit region PERI. For example, some of the circuit elements 5220*b* of the peripheral circuit region PREG may constitute the row decoder, and the cell contact plugs 5340 may be electrically connected to the circuit elements 5220*b* constituting the row decoder through the upper bonding metal patterns 5370*b* of the first cell region CREG1 and the upper bonding metal patterns 5270*b* of the peripheral circuit region PERI. In some embodiments, an operating voltage of the circuit elements 5220*b* constituting the row decoder may be different from an operating voltage of the circuit elements 5220*c* constituting the page buffer. For example, the operating voltage of the circuit elements 5220*c* constituting the page buffer may be greater than the operating voltage of the circuit elements 5220*b* constituting the row decoder.

Likewise, in the word-line bonding region WLBA, the plurality of word-lines 5430 of the second cell region CREG2 may extend in the second direction (e.g., the X-axis direction) parallel to the top surface of the third substrate 5410 and may be connected to a plurality of cell contact plugs (e.g., first cell contact plug 5441, second cell contact plug 5442, third cell contact plug 5443, fourth cell contact plug 5444, fifth cell contact plug 5445, sixth cell contact plug 5446, and seventh cell contact plug 5447, hereinafter generally referred to as "5440"). The plurality of cell contact plugs 5440 may be connected to the peripheral circuit region PREG through an upper metal pattern of the second cell region CREG2 and lower and upper metal patterns and a cell contact plug 5340 of the first cell region CREG1.

In the word-line bonding region WLBA, the upper bonding metal patterns 5370*b* may be formed in the first cell region CREG1, and the upper bonding metal patterns 5270*b* may be formed in the peripheral circuit region PERI. The upper bonding metal patterns 5370*b* of the first cell region CREG1 and the upper bonding metal patterns 5270*b* of the peripheral circuit region PREG may be electrically connected to each other by the bonding method. The upper bonding metal patterns 5370*b* and the upper bonding metal patterns 5270*b* may be formed of aluminum, copper, or tungsten.

In the external pad bonding region PA, a lower metal pattern 5371*e* may be formed in a lower portion of the first cell region CREG1, and an upper metal pattern 5472*a* may be formed in an upper portion of the second cell region CREG2. The lower metal pattern 5371*e* of the first cell region CREG1 and the upper metal pattern 5472*a* of the second cell region CREG2 may be connected to each other by the bonding method in the external pad bonding region PA. Likewise, an upper metal pattern 5372*a* may be formed in an upper portion of the first cell region CREG1, and an upper metal pattern 5272*a* may be formed in an upper portion of the peripheral circuit region PERI. The upper metal pattern 5372*a* of the first cell region CREG1 and the upper metal pattern 5272a of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as, but not limited to, a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350a and a second metal line 5360a may be sequentially stacked on the common source line contact plug 5380 of the first cell region CREG1, and a first metal line 5450a and a second metal line 5460a may be sequentially stacked on the common source line contact plug 5480 of the second cell region CREG2.

Input/output (I/O) pads (e.g., first I/O pad 5205, second I/O pad 5405, and third I/O pad 5406) may be disposed in the external pad bonding region PA. Referring to FIG. 36, a lower insulating layer 5201 may at least partially cover a bottom surface of the first substrate 5210, and the first I/O pad 5205 may be formed on the lower insulating layer 5201. The first I/O pad 5205 may be connected to at least one of a plurality of the circuit elements 5220a disposed in the peripheral circuit region PREG through a first I/O contact plug 5203 and may be separated from the first substrate 5210 by the lower insulating layer 5201. In addition, a side insulating layer may be disposed between the first I/O contact plug 5203 and the first substrate 5210 to electrically isolate the first I/O contact plug 5203 from the first substrate 5210.

An upper insulating layer 5401 at least partially covering a top surface of the third substrate 5410 may be formed on the third substrate 5410. A second I/O pad 5405 and/or a third I/O pad 5406 may be disposed on the upper insulating layer 5401. The second I/O pad 5405 may be connected to at least one of the plurality of circuit elements 5220a disposed in the peripheral circuit region PREG through second I/O contact plugs 5403 and 5303, and the third I/O pad 5406 may be connected to at least one of the plurality of circuit elements 5220a disposed in the peripheral circuit region PREG through third I/O contact plugs 5404 and 5304.

In some embodiments, the third substrate 5410 may not be disposed in a region in which the I/O contact plug is disposed. For example, as illustrated in a region 'B', the third I/O contact plug 5404 may be separated from the third substrate 5410 in a direction parallel to the top surface of the third substrate 5410 and may at least partially penetrate an interlayer insulating layer 5415 of the second cell region CREG2 so as to be connected to the third I/O pad 5406. In this case, the third I/O contact plug 5404 may be formed by at least one of various processes.

In some embodiments, as illustrated in a region 'B1', the third I/O contact plug 5404 may extend in a third direction (e.g., the Z-axis direction), and a diameter of the third I/O contact plug 5404 may become progressively greater toward the upper insulating layer 5401. In other words, a diameter of the channel structure CH described in the region 'A1' may become progressively less toward the upper insulating layer 5401, but the diameter of the third I/O contact plug 5404 may become progressively greater toward the upper insulating layer 5401. For example, the third I/O contact plug 5404 may be formed after the second cell region CREG2 and the first cell region CREG1 are bonded to each other by the bonding method.

In certain embodiments, as illustrated in a region 'B2', the third I/O contact plug 5404 may extend in the third direction (e.g., the Z-axis direction), and a diameter of the third I/O contact plug 5404 may become progressively less toward the upper insulating layer 5401. In other words, like the channel structure CH, the diameter of the third I/O contact plug 5404 may become progressively less toward the upper insulating layer 5401. For example, the third I/O contact plug 5404 may be formed together with the cell contact plugs 5440 before the second cell region CREG2 and the first cell region CREG1 are bonded to each other.

In certain embodiments, the I/O contact plug may at least partially overlap with the third substrate 5410. For example, as illustrated in a region 'C', the second I/O contact plug 5403 may at least partially penetrate the interlayer insulating layer 5415 of the second cell region CREG2 in the third direction (e.g., the Z-axis direction) and may be electrically connected to the second I/O pad 5405 through the third substrate 5410. In this case, a connection structure of the second I/O contact plug 5403 and the second I/O pad 5405 may be realized by various methods.

In some embodiments, as illustrated in a region 'C1', an opening 5408 may be formed to at least partially penetrate the third substrate 5410, and the second I/O contact plug 5403 may be connected directly to the second I/O pad 5405 through the opening 5408 formed in the third substrate 5410. In this case, as illustrated in the region 'C1', a diameter of the second I/O contact plug 5403 may become progressively greater toward the second I/O pad 5405. However, embodiments of the present disclosure are not limited thereto, and in certain embodiments, the diameter of the second I/O contact plug 5403 may become progressively less toward the second I/O pad 5405.

In certain embodiments, as illustrated in a region 'C2', the opening 5408 at least partially penetrating the third substrate 5410 may be formed, and a contact 5407 may be formed in the opening 5408. An end of the contact 5407 may be connected to the second I/O pad 5405, and another end of the contact 5407 may be connected to the second I/O contact plug 5403. Thus, the second I/O contact plug 5403 may be electrically connected to the second I/O pad 5405 through the contact 5407 in the opening 5408. In this case, as illustrated in the region 'C2', a diameter of the contact 5407 may become progressively greater toward the second I/O pad 5405, and a diameter of the second I/O contact plug 5403 may become progressively less toward the second I/O pad 5405. For example, the second I/O contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In certain embodiments, as illustrated in a region 'C3', a stopper 5409 may be further formed on a bottom end of the opening 5408 of the third substrate 5410, as compared with the embodiments of the region 'C2'. The stopper 5409 may be a metal line formed in the same layer as the common source line 5420. Alternatively or additionally, the stopper 5409 may be a metal line formed in the same layer as at least one of the word-lines 5430. The second I/O contact plug 5403 may be electrically connected to the second I/O pad 5405 through the contact 5407 and the stopper 5409.

Like the second and third I/O contact plugs 5403 and 5404 of the second cell region CREG2, a diameter of each of the second and third I/O contact plugs 5303 and 5304 of the first cell region CREG1 may become progressively less toward the lower metal pattern 5371*e* or may become progressively greater toward the lower metal pattern 5371*e*.

In some embodiments, a slit 5411 may be formed in the third substrate 5410. For example, the slit 5411 may be formed at a certain position of the external pad bonding region PA. For example, as illustrated in a region 'D', the slit 5411 may be located between the second I/O pad 5405 and the cell contact plugs 5440 when viewed in a plan view. Alternatively or additionally, the second I/O pad 5405 may be located between the slit 5411 and the cell contact plugs 5440 when viewed in a plan view.

In some embodiments, as illustrated in a region 'D1', the slit 5411 may be formed to at least partially penetrate the third substrate 5410. For example, the slit 5411 may be used to prevent the third substrate 5410 from being finely cracked when the opening 5408 is formed. However, embodiments of the present disclosure are not limited thereto, and in certain embodiments, the slit 5411 may be formed to have a depth ranging from about 60% to about 70% of a thickness of the third substrate 5410.

In certain embodiments, as illustrated in a region 'D2', a conductive material 5412 may be formed in the slit 5411. For example, the conductive material 5412 may be used to discharge a leakage current occurring in driving of the circuit elements in the external pad bonding region PA to the outside. In this case, the conductive material 5412 may be connected to an external ground line.

In certain embodiments, as illustrated in a region 'D3', an insulating material 5413 may be formed in the slit 5411. For example, the insulating material 5413 may be used to electrically isolate the second I/O pad 5405 and the second I/O contact plug 5403 disposed in the external pad bonding region PA from the word-line bonding region WLBA. Since the insulating material 5413 is formed in the slit 5411, it may possible to prevent a voltage provided through the second I/O pad 5405 from affecting a metal layer disposed on the third substrate 5410 in the word-line bonding region WLBA.

In certain embodiments, the first to third I/O pads 5205, 5405 and 5406 may be selectively formed. For example, the memory device 5000 may be realized to include only the first I/O pad 5205 disposed on the first substrate 5210, to include only the second I/O pad 5405 disposed on the third substrate 5410, or to include only the third I/O pad 5406 disposed on the upper insulating layer 5401.

In some embodiments, at least one of the second substrate 5310 of the first cell region CREG1 and the third substrate 5410 of the second cell region CREG2 may be used as a sacrificial substrate and may be completely or partially removed before or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer at least partially covering a top surface of the common source line 5320 or a conductive layer for connection may be formed. Likewise, the third substrate 5410 of the second cell region CREG2 may be removed before or after the bonding process of the first cell region CREG1 and the second cell region CREG2, and then, the upper insulating layer 5401 at least partially covering a top surface of the common source line 5420 or a conductive layer for connection may be formed.

A detection structure, according to example embodiments, may be applied to electronic devices and systems formed using semiconductor dies. For example, the present disclosure may be applied to systems such as, but not limited to, a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, an automotive device, and the like.

The foregoing description is illustrative of example embodiments and is not to be construed as limiting thereof. Although a few example embodiments have been described, those skilled in the art may appreciate that many modifications may be possible in the example embodiments without materially departing from the teachings and advantages of the present disclosure. Accordingly, such modifications are intended to be included within the scope of the present disclosure as defined in the claims.

What is claimed is:

1. A method of detecting an opening of a semiconductor device, the method comprising:

generating a clock signal on a detection structure of the semiconductor device by controlling a switch to contact a probe of a measuring circuit to an end of the detection structure, the detection structure being formed in a semiconductor die of the semiconductor device in an annular shape;

measuring a period of the clock signal, the period of the clock signal being indicative of a location of the opening of the semiconductor device;

counting a number of periods of the clock signal during a reference time interval; and detecting the location of the opening of the semiconductor device based on the number of periods of the clock signal counted during the reference time interval.

2. The method of claim 1, wherein the measuring of the period of the clock signal comprises:

multiplying a result of a sum of an intrinsic capacitance of the measuring circuit and a capacitance of the detection structure with an intrinsic resistance of the measuring circuit, wherein the capacitance of the detection structure varies based on the location of the opening.

3. The method of claim 1, wherein the generating of the clock signal comprises:

generating the clock signal on the detection structure by controlling the switch to contact the probe to the end of the detection structure, the detection structure being further formed in an external region of the semiconductor die that at least partially surrounds a central region of the semiconductor die.

4. The method of claim 1, wherein the generating of the clock signal comprises:

generating the clock signal on the detection structure by controlling the switch to contact the probe to the end of the detection structure, the detection structure being further formed in an edge portion of a central region of the semiconductor die.

5. The method of claim 1, wherein the generating of the clock signal comprises:

generating the clock signal on the detection structure by controlling the switch to contact the probe to the end of the detection structure, the detection structure being further formed in a scribe lane in an external region of the semiconductor die that at least partially surrounds a central region of the semiconductor die, and wherein the scribe lane is formed around the central region.

6. The method of claim 1, wherein the generating of the clock signal comprises:
generating the clock signal on the detection structure by controlling the switch to contact the probe to the end of the detection structure, the detection structure comprising:
a first conduction segment coupled to the switch through a first end and passing through a left-bottom corner region of an external region of the semiconductor die that at least partially surrounds a central region of the semiconductor die;
a second conduction segment coupled to the first conduction segment at a first node and passing through a left-upper corner region of the external region;
a third conduction segment coupled to the second conduction segment at a second node and passing through a right-upper corner region of the external region; and
a fourth conduction segment coupled to the third conduction segment at a third node and passing through a right-bottom corner region of the external region, the fourth conduction segment being coupled to the switch through a second end.

7. The method of claim 6, further comprising:
detecting, using the measuring circuit, that the location of the opening occurs in the first conduction segment, based on the number of periods of the clock signal having a first period corresponding to a first number;
detecting, using the measuring circuit, that the location of the opening occurs in the second conduction segment, based on the number of periods of the clock signal having a second period corresponding to a second number;
detecting, using the measuring circuit, that the location of the opening occurs in the third conduction segment, based on the number of periods of the clock signal having a third period corresponding to a third number; and
detecting, using the measuring circuit, that the location of the opening occurs in the fourth conduction segment, based on the number of periods of the clock signal having a fourth period corresponding to a fourth number,
wherein the second period is greater than the first period,
wherein the third period is greater than the second period,
wherein the fourth period is greater than the third period,
wherein the third number is greater than the fourth number,
wherein the second number is greater than the third number, and
wherein the first number is greater than the second number.

8. The method of claim 1, wherein the generating of the clock signal comprises:
generating the clock signal on the detection structure by controlling the switch to contact the probe to the end of the detection structure, the detection structure being a three-dimensional (3D) detection structure formed adjacent to an edge portion of a central region of the semiconductor die, the 3D detection structure extending in a vertical direction,
wherein the semiconductor die comprises a first conduction layer and a second conduction layer below the first conduction layer, wherein the 3D detection structure comprises a conduction loop extending in the vertical direction through the first conduction layer and the second conduction layer, and
wherein the conduction loop comprises:
a plurality of top horizontal line segments formed in the first conduction layer;
a plurality of bottom horizontal line segments formed in the second conduction layer; and
a plurality of vertical line segments coupling the plurality of top horizontal line segments and the plurality of bottom horizontal line segments to form the conduction loop.

9. The method of claim 8, further comprising:
detecting, using the measuring circuit, the location of the opening from among the plurality of top horizontal line segments, the plurality of bottom horizontal line segments, and the plurality of vertical line segments, based on the number of periods of the clock signal.

10. The method of claim 1, wherein the generating of the clock signal comprises:
generating the clock signal on the detection structure by controlling the switch to contact the probe to the end of the detection structure, the detection structure being a three-dimensional (3D) detection structure formed adjacent to an edge portion of a central region of the semiconductor die, the 3D detection structure extending in a vertical direction,
wherein the semiconductor die comprises M layers stacked in the vertical direction, M being a positive integer number greater than two,
wherein each of the M layers comprises a first conduction layer and a second conduction layer below the first conduction layer,
wherein the 3D detection structure comprises a conduction loop that extends in the vertical direction through the first conduction layer and the second conduction layer of the M layers, and
wherein the conduction loop comprises:
a plurality of top horizontal line segments formed in the first conduction layer;
a plurality of bottom horizontal line segments formed in the second conduction layer;
a plurality of vertical line segments coupling the plurality of top horizontal line segments and the plurality of bottom horizontal line segments to form the conduction loop; and
bonding metals coupling a portion of top horizontal line segments of an upper layer of adjacent layers from among the M layers and a portion of bottom horizontal line segments of a lower layer of the adjacent layers.

11. The method of claim 10, further comprising:
detecting, using the measuring circuit, the location of the opening from among at least a portion of the M layers, based on the number of periods of the clock signal.

12. A method of detecting an opening of a semiconductor device, the method comprising:
generating a first clock signal on a detection structure of the semiconductor device by controlling a first switch to contact a probe of a measuring circuit to a first end of the detection structure, the detection structure being formed in a semiconductor die of the semiconductor device in an annular shape;
generating a first number by counting, during a reference time interval, first periods of the first clock; signal, the first periods being indicative of a location of the opening of the semiconductor device;

generating a second clock signal on the detection structure by controlling a second switch to contact the probe of the measuring circuit to a second end of the detection structure;

generating a second number by counting, during the reference time interval, second periods of the second clock signal, the second periods being indicative of the location of the opening of the semiconductor device; and detecting the location of the opening of the semiconductor device based on a first difference between the first number and the second number, and a second difference between a first period of the first clock signal and a second period of the second clock signal.

13. The method of claim 12, wherein the detection structure is formed in an external region of the semiconductor die that at least partially surrounds a central region of the semiconductor die.

14. The method of claim 12, wherein the detection structure is formed in an edge portion of a central region of the semiconductor die.

15. The method of claim 12, wherein the detection structure is formed in a scribe lane in an external region of the semiconductor die that at least partially surrounds a central region of the semiconductor die, and wherein the scribe lane is formed around the central region.

16. The method of claim 12, wherein the detection structure comprises:

a first conduction segment coupled to the first switch through the first end and passing through a left-bottom corner region of an external region of the semiconductor die that at least partially surrounds a central region of the semiconductor die;

a second conduction segment coupled to the first conduction segment at a first node and passing through a left-upper corner region of the external region;

a third conduction segment coupled to the second conduction segment at a second node and passing through a right-upper corner region of the external region; and a fourth conduction segment coupled to the third conduction segment at a third node and passing through a right-bottom corner region of the external region, wherein the fourth conduction segment is coupled to the second switch through the second end.

17. The method of claim 16, further comprising:

detecting, using the measuring circuit, the location of the opening from among the first conduction segment, the second conduction segment, the third conduction segment and the fourth conduction segment, based on a first comparison of the first period of the first clock signal and the second period of the second clock signal, a second comparison of the first number and the second number, and a third comparison of a difference between the first number and the second number and a reference value.

18. A semiconductor device, comprising:

a first semiconductor die comprising a first central region and a first external region at least partially surrounding the first central region;

a second semiconductor die comprising a second central region and a second external region at least partially surrounding the second central region, the first semiconductor die being at least partially stacked in a vertical direction on the second semiconductor die;

a memory cell structure formed in the first central region of the first semiconductor die;

a peripheral circuit formed in the second central region of the second semiconductor die along a first direction and a second direction;

a first detection structure formed in the second central region of the second semiconductor die to at least partially surround a first sub circuit region and a second sub circuit region which are spaced apart from each other in the second direction in the peripheral circuit; and a measuring circuit configured to:

measure a first period of a first clock signal generated by contacting a probe to a first end of the first detection structure through a first switch; and determine a first location of a first opening in the first detection structure by counting a first number of periods of the first clock signal during a reference time interval.

19. The semiconductor device of claim 18, further comprising:

a second detection structure formed in the second central region of the second semiconductor die to at least partially surround a third sub circuit region and a fourth sub circuit region which are spaced apart from the first sub circuit region and the second sub circuit region in the first direction in the peripheral circuit, wherein the third sub circuit region and the fourth sub circuit region are spaced apart from each other in the second direction, and wherein the measuring circuit is further configured to:

measure a second period of a second clock signal generated by contacting the probe to a second end of the second detection structure through a second switch; and determine a second location of a second opening in the second detection structure by counting a second number of periods of the second clock signal during the reference time interval.

20. The semiconductor device of claim 18, wherein the first detection structure is provided by:

alternatingly coupling an upper bonding metal of the first semiconductor die to an upper metal layer above the upper bonding metal in at least one of the first direction and the second direction at edges of the first sub circuit region and the second sub circuit region; and alternatingly coupling a lower bonding metal of the second semiconductor die to a lower metal layer below the lower bonding metal in at least one of the first direction and the second direction at the edges of the first sub circuit region and the second sub circuit region, wherein the first semiconductor die is formed in a first semiconductor wafer, wherein the second semiconductor die is formed in a second semiconductor wafer, and wherein the semiconductor device is provided after bonding the first semiconductor wafer and the second semiconductor wafer and cutting the bonded first semiconductor wafer and the second semiconductor wafer.

* * * * *